US012581609B1

(12) United States Patent
Cadorin Falleiros

(10) Patent No.: US 12,581,609 B1
(45) Date of Patent: Mar. 17, 2026

(54) TOOLLESS COMPUTING HOUSING ASSEMBLY

(71) Applicant: Tractian Technologies Inc, Atlanta, GA (US)

(72) Inventor: João Cadorin Falleiros, São Paulo (BR)

(73) Assignee: Tractian Technologies Inc, Atlanta, GA (US)

( * ) Notice: Subject to any disclaimer, the term of this patent is extended or adjusted under 35 U.S.C. 154(b) by 0 days.

(21) Appl. No.: 19/364,802

(22) Filed: Oct. 21, 2025

Related U.S. Application Data

(62) Division of application No. 19/344,248, filed on Sep. 29, 2025.

(60) Provisional application No. 63/885,053, filed on Sep. 19, 2025.

(51) Int. Cl.
| | |
|---|---|
| *H05K 7/20* | (2006.01) |
| *H05K 5/02* | (2006.01) |
| *H05K 5/03* | (2006.01) |
| *H05K 5/30* | (2025.01) |
| *H05K 7/14* | (2006.01) |

(52) U.S. Cl.
CPC ......... *H05K 7/1435* (2013.01); *H05K 5/0226* (2013.01); *H05K 5/0247* (2013.01); *H05K 5/03* (2013.01); *H05K 5/30* (2025.01); *H05K 7/1418* (2013.01); *H05K 7/1427* (2013.01); *H05K 7/1438* (2013.01)

(58) Field of Classification Search
CPC ...... H05K 5/0217; H05K 5/0256; H05K 5/03; H05K 5/10
See application file for complete search history.

(56) References Cited

U.S. PATENT DOCUMENTS

| | | | | | |
|---|---|---|---|---|---|
| 6,028,769 | A | * | 2/2000 | Zurek ..................... | H04Q 1/155 361/732 |
| 6,257,682 | B1 | * | 7/2001 | Liu .......................... | G06F 1/184 |
| 6,522,547 | B1 | * | 2/2003 | Diaz ........................ | G06F 1/184 361/741 |
| 6,549,397 | B1 | * | 4/2003 | Diaz ........................ | G06F 1/188 312/223.1 |
| 8,908,359 | B2 | * | 12/2014 | Singh ....................... | H05K 5/10 361/679.01 |
| 9,961,788 | B2 | * | 5/2018 | Sullivan .................. | G06F 1/181 |

(Continued)

*Primary Examiner* — Anthony Q Edwards
(74) *Attorney, Agent, or Firm* — Cognition IP, P.C.; Edward Steakley; Justin White

(57) ABSTRACT

A toolless computing housing assembly includes an enclosure, front lid, and first side cover. The enclosure includes connected panels defining a front opening and internal volume, with front toolless coupling features along its front opening and side toolless coupling features along its panels. The front lid includes lid toolless coupling features that interact with the front toolless coupling features of the enclosure to facilitate the ready removal and reassembly of the front lid from and to the enclosure without the use of tools. The first side cover includes an outer face, inner face, and a first set of side cover toolless coupling features that interact with the side toolless coupling features of the enclosure to facilitate the ready removal and reassembly of the first side cover from and to the enclosure without the use of tools. The toolless computing housing assembly also includes a second side cover and mounting arrangement.

30 Claims, 40 Drawing Sheets

(56) References Cited

U.S. PATENT DOCUMENTS

| | | | |
|---|---|---|---|
| 2004/0022018 A1* | 2/2004 | Chen | G06F 1/184 |
| | | | 361/679.6 |
| 2005/0030709 A1* | 2/2005 | Yang | G06F 1/181 |
| | | | 361/679.57 |
| 2005/0152106 A1* | 7/2005 | Coster | H05K 5/0221 |
| | | | 361/679.58 |
| 2007/0008706 A1* | 1/2007 | Lai | H05K 5/10 |
| | | | 361/752 |
| 2008/0002346 A1* | 1/2008 | Lin | G06F 1/181 |
| | | | 361/735 |
| 2008/0310123 A1* | 12/2008 | Sherrod | H05K 7/1488 |
| | | | 361/725 |
| 2011/0255241 A1* | 10/2011 | Wu | G06F 1/20 |
| | | | 361/679.02 |
| 2018/0070469 A1* | 3/2018 | Hofmann | H05K 7/1489 |
| 2024/0237238 A1* | 7/2024 | Chen | H05K 5/0247 |
| 2024/0381560 A1* | 11/2024 | Gundogan | H05K 7/1489 |
| 2025/0358974 A1* | 11/2025 | Zeng | H05K 7/20236 |

* cited by examiner

130

131

134

100

110

190

113

151

150

190

TOOLLESS COMPUTING HOUSING ASSEMBLY

CROSS-REFERENCE TO RELATED APPLICATIONS

This application is a divisional of and claims priority to commonly owned U.S. application Ser. No. 19/344,248, filed Sep. 29, 2025, titled "MODULAR COMPUTING HOUSING ASSEMBLY," which application is hereby incorporated by reference in its entirety herein. This application also claims priority to U.S. Provisional Application No. 63/885,047, filed Sep. 19, 2025, titled "MODULAR COMPUTING HOUSING ASSEMBLY," and U.S. Provisional Application No. 63/885,053, filed Sep. 19, 2025, titled "COMPUTING HOUSING MOUNTING ARRANGE-MENT," which applications are hereby incorporated by reference in their entireties herein. This application is also related to commonly owned U.S. patent application Ser. No. 30/007,214, filed on Jun. 6, 2025, titled "DATA RECEIVER," and U.S. patent application Ser. No. 29/967,350, filed on Oct. 9, 2024, titled "ELECTRONIC SENSOR DATA COLLECTOR," which applications are also hereby incorporated by reference in their entireties herein.

TECHNICAL FIELD

The present disclosure relates generally to computing hardware, and more particularly to structural arrangements for computing devices and systems.

BACKGROUND

Modern computing systems sometimes include inter-changeable and independent units or modules to provide flexibility and scalability for many applications and situations, such as for a large or growing industrial environment supported by a computing system. As a particular example, a single data receiver may be configured to support about 100 different sensors or other industrial devices, such that multiple data receivers are required for industrial environments with over 100 different supported devices. Data receivers typically require separate data collector devices and separate processing devices to utilize the received data. In these and other situations, it can be advantageous to link multiple data receivers and other computing devices together to form a larger computing system. This is often accomplished using common buses, standardized connection ports, cable connectors, and the like to link similar computing devices, with organization and placement often happening within a server cabinet, network rack, or other typically useful environment. Mounting computing units within a server cabinet or network rack is often accomplished by way of clips or other features that can be arranged to latch onto a cabinet or rack device, such as a din rail, for example.

Unfortunately, server cabinets and modular computing systems in general can suffer several drawbacks, such as power volatility, incompatible equipment, and cooling and airflow issues. Even where these issues are controlled, larger and expanding computing systems can still experience problems involving limited space availability, inadequate mounting arrangements, and excessive or disorganized cable management, among other common problems. Furthermore, different computing device types often have different physical shapes and sizes, which can add to the challenge of constructing and organizing an overall system in a coherent and aesthetically pleasing manner. For example, computing housing assemblies are often difficult or cumbersome to disassemble for reconfiguration purposes, as many use screws, bolts, or other fasteners that require tools and added inconvenience. Still further, computing unit mounting arrangements can often require a significant amount of manual positioning and manipulation, and many can be difficult when removing a computing unit from a din rail or other rack or cabinet location.

Although traditional housing and mounting structural arrangements for computing devices and systems have worked in the past, improvements are always helpful. In particular, what is desired are modular computing devices and structures that provide flexibility and scalability for overall computing systems while eliminating or reducing system spacing, cable management, reconfiguration, disassembly, and mounting issues, among other problems.

SUMMARY

It is an advantage of the present disclosure to provide improved modular computing devices and structures having flexibility and scalability for overall computing systems while eliminating or reducing system spacing, cable management, reconfiguration, disassembly, and mounting issues, among other problems. The disclosed features, apparatuses, systems, and methods relate to modular computing housing assemblies that can include the use of a common form factor for multiple separate substantially similar modular computing housing assemblies. Such a common form factor can require at least some identical features and can allow for at least some variable features between different modular computing housing assemblies, such that the disclosed modular computing housing assemblies can allow identical or similar computing devices to couple and decouple from each other directly without the need for cables, can allow for easier computing housing disassembly and reassembly for reconfiguration purposes, and can allow for one or more devices to readily mount to and be readily removed from standard network rack or server cabinet equipment either alone or collectively.

In various embodiments of the present disclosure, a computing device can include a plurality of internal computing components and a computing housing assembly having multiple components that are readily removable from and reassembled to the computing housing assembly without the use of tools. The computing housing assembly can include at least an enclosure, a front lid, and a first side cover. The enclosure can have a plurality of connected panels and can define a front opening and an internal volume containing at least a portion of the plurality of internal computing components therein. The enclosure can include front toolless coupling features along its front opening and side toolless coupling features along its plurality of connected panels. The front lid can be removably coupled to the enclosure and can cover the front opening to fully enclose the inner volume. The front lid can include lid toolless coupling features configured to interact with the front toolless coupling features of the enclosure to facilitate the ready removal and reassembly of the front lid from and to the enclosure without the use of tools. The first side cover can be removably coupled to a first side of the enclosure and can include an outer face and an inner face. The first side cover can include a first set of side cover toolless coupling features configured to interact with the side toolless coupling features of the enclosure to facilitate the ready removal and reassembly of the first side cover from and to the enclosure without the use of tools.

In various detailed embodiments, the computing device can be a data receiver, data collector, energy vibration sensor, input output module, or power supply unit. Other computing device types are also possible. The computing housing assembly can conform to a common form factor for multiple separate substantially similar computing housing assemblies. The common form factor can require that all substantially similar computing housing assemblies have the same front toolless coupling features, lid toolless coupling features, side toolless coupling features, and first set of side cover toolless coupling features. The common form factor can also allow for other variable features between the substantially similar computing housing assemblies. The computing housing assembly can further include a second side cover removably coupled to a second side of the enclosure. The second side cover can include an outer face and an inner face, and can also include a second set of side cover toolless coupling features configured to interact with the side toolless coupling features of the enclosure to facilitate the ready removal and reassembly of the second side cover from and to the enclosure without the use of tools. The front toolless coupling features and side toolless coupling features can all be integrally formed with the enclosure. The lid toolless coupling features can be integrally formed with the front lid and the first set of side cover toolless coupling features can be integrally formed with the first side cover.

In further detailed embodiments, the front toolless coupling features can include multiple protrusion tabs extending forward from the enclosure past its front opening. Each protrusion tab can have a front nub and a geometry that facilitates bending or bowing of the protrusion tab during removal and reassembly of the front lid. In such arrangements, the lid toolless coupling features can include multiple tab openings configured to receive the front nubs of the multiple protrusion tabs to facilitate the ready removal and reassembly of the front lid from and to the enclosure. The side toolless coupling features can include multiple divots located along multiple outer surfaces of the enclosure. In such arrangements, the first side cover can further include a sidewall extending from its inner face around its outer circumference such that an outer portion of the sidewall extends over the multiple outer surfaces of the enclosure. The sidewall can have multiple snap protrusions arranged to snap into and out of the multiple divots to facilitate the ready removal and reassembly of the first side cover from and to the enclosure. The multiple outer surfaces of the enclosure can include top, bottom, and back surfaces of the enclosure. In some arrangements, the multiple snap protrusions can vary in size depending on their locations along the first side cover sidewall. For example, the multiple snap protrusions can increase in size along the first side cover toward the back of the computing device to facilitate stronger snap fits with the enclosure toward the back of the enclosure. The side cover sidewall can include an inner portion that is shorter than the outer portion, and the inner portion of the sidewall can have an inner edge configured to abut and directly contact the first side of the enclosure when the first side cover is installed to the enclosure.

In still further detailed embodiments, the first side cover can further include a plurality of lateral stoppers spaced apart along its inner face, the plurality of lateral stoppers configured to abut and directly contact the first side of the enclosure when the first side cover is installed to the enclosure. The front lid can include one or more hinged doors, with each hinged door including toolless coupling features configured to facilitate coupling the hinged door to the front lid, pivoting the hinged door to a range of different open positions relative to the front lid, and holding the hinged door at the range of different open positions. The front lid can also include a front panel having an illuminated portion coupled to a front surface of the front lid. In some arrangements, the computing housing assembly can also include a mounting arrangement located along an outer surface of the enclosure. The mounting arrangement can include one or more mounting components configured to move between different positions, wherein pushing the mounting arrangement against a separate external rail results in actuating the mounting arrangement to lock onto and mount the entire computing device onto the separate external rail without the use of tools.

In further embodiments of the present disclosure, a toolless computing housing assembly can include at least a box-shaped enclosure, a front lid, and a first side cover. The box-shaped enclosure can include a top panel, bottom panel, back panel, first side panel, and second side panel. The enclosure can define a front opening and an internal volume configured to hold multiple internal components of a main computing device therein. The enclosure can include front toolless coupling features along its front opening and side toolless coupling features along its panels. The front lid can be removably coupled to the enclosure to cover the front opening to fully enclose the inner volume. The front lid can include lid toolless coupling features configured to interact with the front toolless coupling features of the enclosure to facilitate the ready removal and reassembly of the front lid from and to the enclosure without the use of tools. The first side cover can be removably coupled to a first side of the enclosure and can include an outer face and an inner face. The first side cover can also include a first set of side cover toolless coupling features configured to interact with the side toolless coupling features of the enclosure to facilitate the ready removal and reassembly of the first side cover from and to the enclosure without the use of tools.

In various detailed embodiments, the front toolless coupling features can include multiple protrusion tabs extending forward from the enclosure past its front opening, with each protrusion tab having a front nub and a geometry that facilitates bending or bowing of the protrusion tab during removal and reassembly of the front lid. The lid toolless coupling features can include multiple tab openings configured to receive the front nubs of the multiple protrusion tabs to facilitate the ready removal and reassembly of the front lid from and to the enclosure. The side toolless coupling features can include multiple divots located along multiple outer surfaces of the enclosure on the top panel, bottom panel, and back panel. The first side cover can further include a sidewall extending from its inner face around its outer circumference such that an outer portion of the sidewall extends over the multiple outer surfaces of the enclosure. The sidewall can have multiple snap protrusions arranged to snap into and out of the multiple divots to facilitate the ready removal and reassembly of the first side cover from and to the enclosure. In some embodiments, the toolless computing housing assembly can also include a second side cover and a mounting assembly. The second side cover can removably couple to a second side of the enclosure and can have an outer face and an inner face. The second side cover can also include a second set of side cover toolless coupling features configured to interact with the side toolless coupling features of the enclosure to facilitate the ready removal and reassembly of the second side cover from and to the enclosure without the use of tools. The mounting arrangement can be located along the back panel of the enclosure and can include one or more mounting components configured to move between different positions. Pushing the mounting arrangement against a separate external rail can result in actuating the mounting arrangement to lock onto and mount the computing housing assembly onto the separate external rail without the use of tools.

Other apparatuses, methods, features, and advantages of the disclosure will be or will become apparent to one with skill in the art upon examination of the following figures and detailed description. It is intended that all such additional apparatuses, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures, arrangements, devices, systems, and methods of use for modular computing housing assemblies, computing housing mounting arrangements, or both, which assemblies and arrangements can be used with related computing devices and systems. These drawings in no way limit any changes in form and detail that may be made to the disclosure by one skilled in the art without departing from the spirit and scope of the disclosure.

DETAILED DESCRIPTION

Figure 1A:
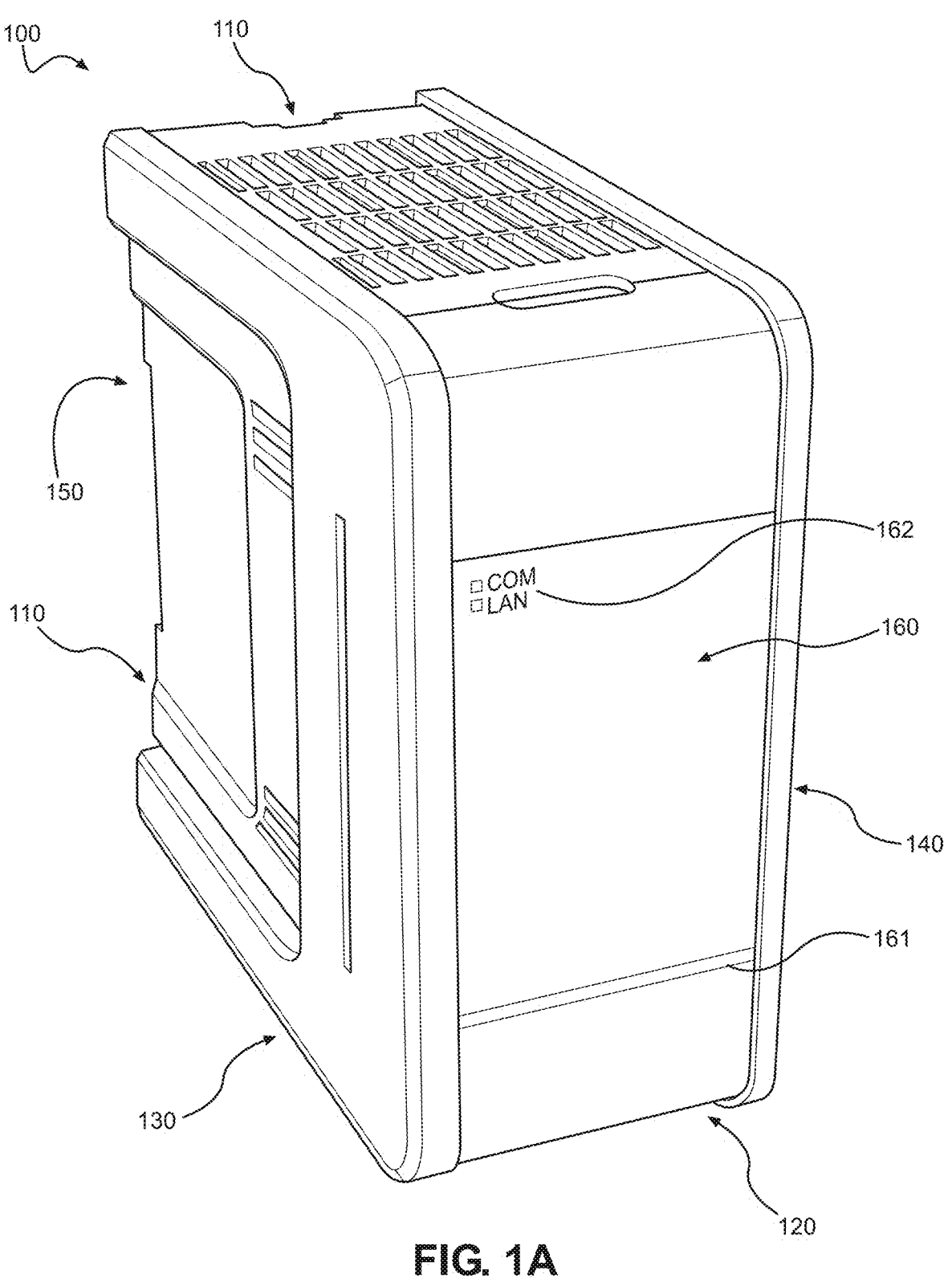
FIG. 1A illustrates in front perspective view an example computing device with a modular computing housing assembly according to one embodiment of the present disclosure.

Exemplary applications of apparatuses, systems, and methods according to the present disclosure are described in this section. These examples are being provided solely to add context and aid in the understanding of the disclosure. It will thus be apparent to one skilled in the art that the present disclosure may be practiced without some or all of these specific details provided herein. In some instances, well known process steps have not been described in detail in order to avoid unnecessarily obscuring the present disclosure. Other applications are possible, such that the following examples should not be taken as limiting. In the following detailed description, references are made to the accompanying drawings, which form a part of the description and in which are shown, by way of illustration, specific embodiments of the present disclosure. Although these embodiments are described in sufficient detail to enable one skilled in the art to practice the disclosure, it is understood that these examples are not limiting, such that other embodiments may be used, and changes may be made without departing from the spirit and scope of the disclosure.

The present disclosure relates in various embodiments to features, apparatuses, systems, and methods involving modular computing housing assemblies and related computing devices and systems. The disclosed embodiments result in improved modular computing devices and structures having flexibility and scalability for overall computing systems while eliminating or reducing system spacing, cable management, reconfiguration, disassembly, and mounting issues, among other problems. In particular, the various disclosed modular computing housing assemblies can include the use of a common form factor for multiple separate and identical or substantially similar modular computing housing assemblies. This common form factor can require at least some identical features and can allow for at least some variable features between different modular computing housing assemblies, such that the disclosed modular computing housing assemblies can allow identical or substantially similar or related computing devices to couple and decouple from each other directly without the need for cables, can allow for easier computing housing disassembly and reassembly for reconfiguration purposes without the need for tools or difficult assembly or removal techniques, and can allow for one or more computing devices to readily mount to and be readily removed from standard network rack or server cabinet equipment either alone or collectively, again without the need for tools or other specialized equipment or techniques.

Although various embodiments disclosed herein discuss specific applications involving data collectors and data receivers, it will be readily appreciated that the disclosed features, apparatuses, systems, and methods of use for modular computing housing assemblies can also be used in other applications and environments involving other types of computing devices beyond data collectors and data receivers. Various illustrative examples detailed herein recite the use of identical or substantially similar data collectors, data receivers, and other computing devices, but it will be readily appreciated that the disclosed embodiments can also apply to still further disparate computing devices in appropriate situations. Furthermore, while some examples are provided for specific modular computing housing assembly components, features, and materials, it will be understood that these can be replaced with any suitable substitute or alternative components, features, and/or materials that take advantage of the disclosed modular computing housing assemblies. Other applications, arrangements, and extrapolations beyond the illustrated embodiments are also contemplated.

Referring first to FIG. 1A, an example computing device with a modular computing housing assembly is illustrated in front perspective view. Computing device 100 can generally be any type of computing device having a plurality of internal computing components and can specifically have a modular computing housing assembly containing the plurality of internal computing components therein. As noted above, the modular computing housing assembly can conform to a common form factor for multiple separate substantially similar modular computing housing assemblies, and this common form factor can require at least some identical features and can allow for at least some variable features between modular computing housing assemblies.

Various embodiments disclosed herein can include an entire computing device 100, while other embodiments can include an overall system with multiple identical or substantially similar computing devices. Still further embodiments can be directed specifically just to the modular computing housing assembly of computing device 100 or a similar computing device having a modular computing housing assembly that is identical or that at least conforms to the common form factor. In various arrangements, the components and features of the disclosed modular computing housing assembly can be replicated in multiple identical or similar computing devices. While some multiple device arrangements or systems can include the same type of computing device, such as multiple data collectors and/or multiple data receivers, other arrangements can involve different computing device types so long as the different computing devices have modular computing housing assemblies that are identical or that at least conform to the same common form factors such that they are compatible with each other regarding the various functions and features disclosed herein.

As noted above, the disclosed modular computing housing assembly can include components and features that improve flexibility and scalability and provide other advantages for its respective computing device as well as for an overall computing system including its computing device. For example, multiple computing devices having identical or similar modular computing housing assemblies can be configured to readily couple and decouple from each other physically and electronically in a manner that conserves space, is organized and aesthetically pleasing, and eliminates the need for external buses, cables, or other traditional connection components between the identical or similar computing devices. As another example, multiple computing devices having identical or similar modular computing housing assemblies can be configured to readily mount to standard network rack or server cabinet equipment in an identical or substantially similar manner. Such mounting can be done individually by computing device or can be accomplished collectively and simultaneously, such as where multiple computing devices are already coupled together before mounting. As yet another example, the disclosed modular computing housing assembly can include components that can be readily removed, adjusted, reinstalled, and replaced within the assembly and overall device to facilitate an easy modular expansion or reconfiguration within a single assembly or computing device. Features for such readily removable components can allow for couplings that avoid the use of pins, screws, bolts, glues, adhesives, and other traditional fastening items that can require the use of tools and otherwise be cumbersome to use. Further benefits and advantages of the disclosed modular computing housing assembly and its associated computing devices and systems will become readily apparent throughout the figures and detailed description provided below.

In some embodiments, computing device 100 can be a data collector, although it will be understood that other types of computing devices are also possible. As shown, computing device 100 can be box-shaped in nature, with its modular computing housing assembly forming an exterior of the computing device and thus also being box-shaped. In various specific embodiments, computing device 100 and the enclosure of its modular computing housing assembly can be box-shaped with a height of about 10 cm, a width of about 4 cm, and a depth of about 10 cm, although other alternative shapes and dimensions are also possible. Computing device 100 is shown as being fully assembled with all removable components attached in the front perspective view shown in FIG. 1A. Additional views for fully assembled computing device 100 can be found in commonly owned U.S. patent application Ser. No. 29/967,350, filed on Oct. 9, 2024, titled "ELECTRONIC SENSOR DATA COLLECTOR," which application is again hereby incorporated by reference in its entirety herein.

As shown in FIG. 1A, computing device 100 can have a modular computing housing assembly around its exterior that can include enclosure 110, front lid 120, left side cover 130, right side cover 140, mounting arrangement 150 (not visible), and front panel 160, among other possible components. Left and right side covers 130, 140 can also be considered as "first and second" side covers. Mounting arrangement 150 can be located along an outer surface of the enclosure, such as along a back panel, for example, and can include a spring clip arrangement that may include one or more bistate spring clips in some embodiments. Front panel 160 can include an illuminated light bar 161 near its bottom and an illuminated status legend 162 near its top, although other illuminated locations are also possible. While various components and features of the modular computing housing are not visible in FIG. 1A due to computing device 100 being fully assembled in the front perspective view shown, such components and features not visible in FIG. 1A will be illustrated and described in greater detail below.

Enclosure 110 can be box-shaped, can include a plurality of connected panels such as a top panel, bottom panel, back panel, first side panel, and second side panel, and can define a front opening and an internal volume configured to hold multiple internal components of computing device 100 therein. Front lid 120 can be removably coupled to enclosure 110 such that it covers the front opening to fully enclose the inner volume. Front lid 120 can include a front portion, a first side portion, and a second side portion, with the side portions having side openings configured to allow computing ports to protrude therethrough. Left and right (i.e., first and second) side covers 130, 140 can be removably coupled enclosure 110 at its left and right side panels and/or to front lid 120 at its first and second side portions respectively. Each side cover 130, 140 can include an outer face, an inner face, and computing port plugs extending from the inner face and configured to plug computing ports protruding through side openings of the respective side portions of front lid 120. Each side cover 130, 140 can be C-shaped and can cover at least a portion of front lid 120 and enclosure 110. Removal of either side cover 130, 140 can expose a respective set of computing ports such that the exposed computing ports can be directly plugged into a corresponding set of exposed computing ports on a separate computing device when computing device 100 and the separate computing device are placed side-by-side. Mounting arrangement 150 can include various features and one or more mounting components (not visible) configured to move between different positions. Pushing the mounting arrangement 150 against a separate external rail can result in actuating the mounting arrangement to lock onto and mount computing device 100 onto the separate external rail.

Figure 1B:
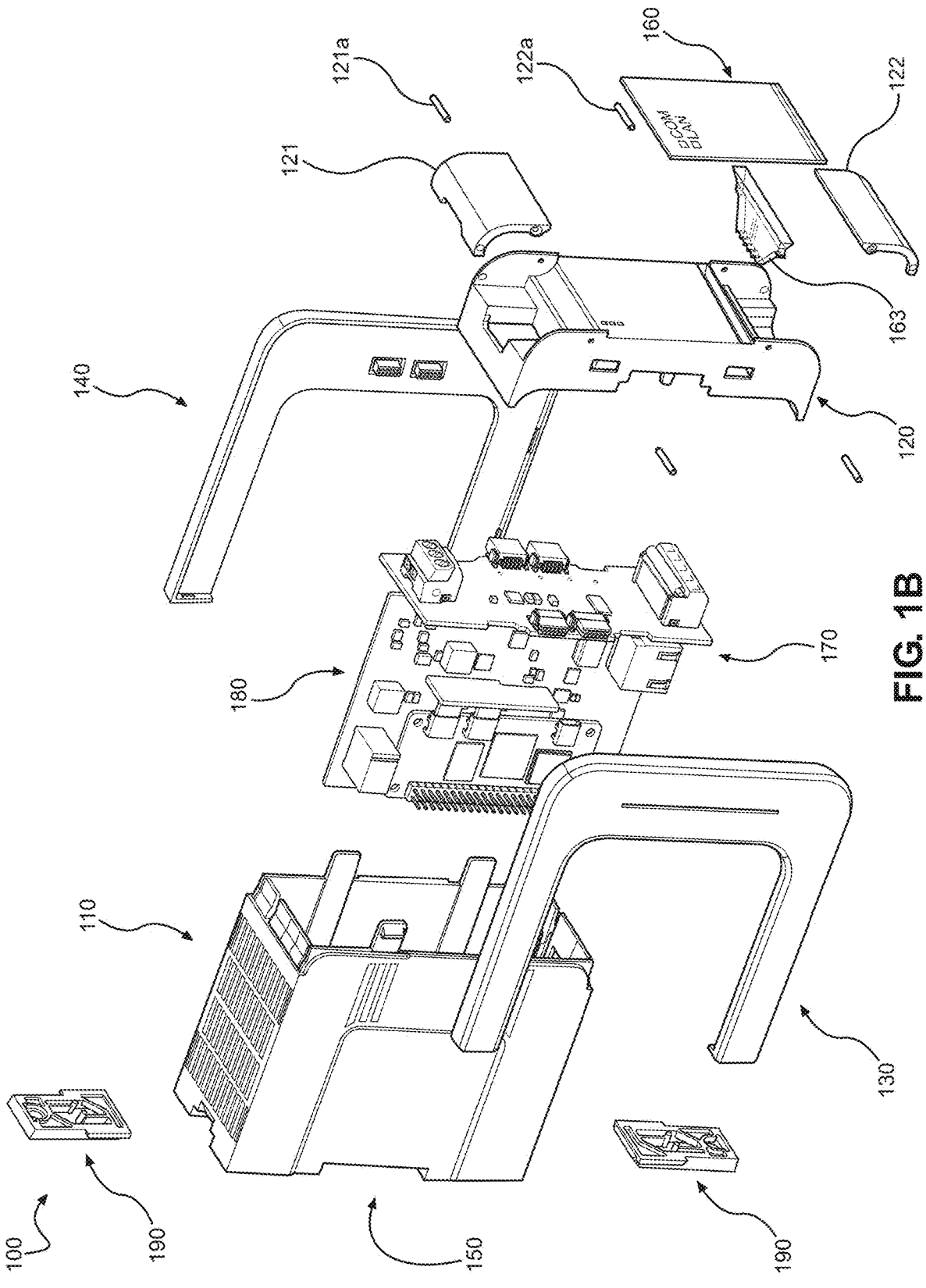
FIG. 1B illustrates in partially exploded perspective view the computing device of FIG. 1A according to one embodiment of the present disclosure.

FIG. 1B illustrates computing device 100 in partially exploded view. Again, computing device 100 can be a data collector, such that its modular computing housing assembly is specifically designed for the needs of a data collector without departing from a common form factor for all related modular computing housing assemblies. Front lid 120 can be readily removed from and coupled to a front open region of enclosure 110. Front lid 120 can include top hinged door 121 and bottom hinged door 122, each of which can be pivotably coupled to the front lid by way of coiled spring pins 121a, 122a located on both sides of their respective hinged door. Both left and right side covers 130, 140 can be readily removed from and coupled to enclosure 110, such as along respective left and right side panels of the enclosure. Front panel 160 can be affixed or firmly coupled to a front surface of front lid 120, and light guide 163 can abut a rear surface of the front panel to help form the illuminated light bar and can extend through front lid 120 into an inner region of computing device, as detailed below. Mounting arrangement 150 can include various features along a back panel of enclosure 110 and one or more spring clips 190 also located at the back panel, which spring clips can be specialized bistate spring clips, as set forth in greater detail below.

Removing front lid 120 can expose various internal computing components of computing device 100, such as first printed circuit board 170, and second printed circuit board 180 among other items. First printed circuit board 170 can have a first plurality of processing components and a shape that is customized to interact physically with a front edge of enclosure 110. First printed circuit board 170 can be arranged to fit between enclosure 110 and front lid 120 such that the first printed circuit board covers a front opening of the enclosure when the front lid is removed, as shown. Second printed circuit board 180 can have a second plurality of processing components and can be arranged transversely to and coupled to first printed circuit board 170 to form a T-shape, with the second circuit board being readily installed into and removed from enclosure 110. In various arrangements, first printed circuit board 170 and second printed circuit board 180 can be considered internal computing components of computing device 100 that do not form part of its modular computing housing assembly around its exterior.

Figure 2A:
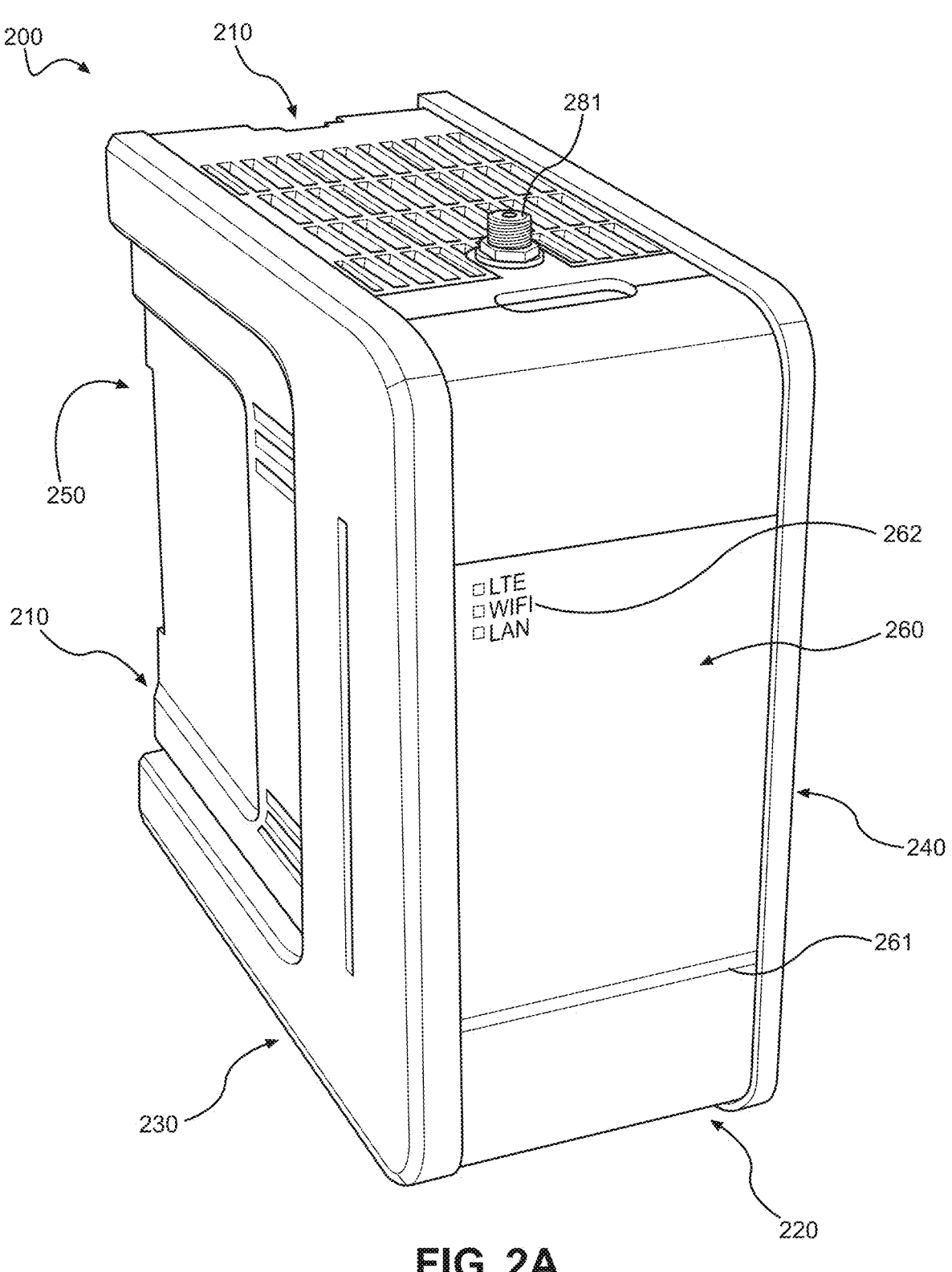
FIG. 2A illustrates in front perspective view an example alternative computing device with an alternative modular computing housing assembly according to one embodiment of the present disclosure.

Referring next to FIG. 2A, an example alternative computing device with an alternative modular computing housing assembly is similarly illustrated in front perspective view. Alternative computing device 200 can also generally be any type of computing device having a plurality of internal computing components and can have an alternative modular computing housing assembly containing its plurality of internal computing components therein. The alternative computing housing assembly can also conform to the common form factor for multiple separate substantially similar modular computing housing assemblies, such that this alternative modular computing housing assembly is configured to readily interact with the computing housing assembly of computing device 100 above.

Alternative computing device 200 can be a data receiver, for example, although it will be understood that other types of computing devices are also possible. As shown, alternative computing device 200 can also be box-shaped in nature, with its alternative modular computing housing assembly forming an exterior of the computing device and thus also being box-shaped. In various specific embodiments, alternative computing device 200 and the enclosure of its alternative modular computing housing assembly can be box-shaped with a height of about 10 cm, width of about 4 cm, and depth of about 10 cm, although other alternative shapes and dimensions are also possible. Alternative computing device 200 is shown as fully assembled with all removable components attached in the front perspective view of FIG. 2A. Further views for fully assembled alternative computing device 200 can be found in commonly owned U.S. patent application Ser. No. 30/007,214 filed on Jun. 6, 2025, entitled "DATA RECEIVER," which application is again hereby incorporated by reference in its entirety herein.

As shown in FIG. 2A, alternative computing device 200 can be substantially similar in appearance to computing device 100 above. In fact, alternative computing device 200 can have an alternative modular computing housing assembly around its exterior that can similarly include enclosure 210, front lid 220, left side cover 230, right side cover 240, mounting arrangement 250 (not visible), and front panel 260, among other possible components. Some of these components can be identical to their counterpart components in computing device 100 above, while others can have different features while still conforming to a common form factor for substantially similar modular computing housing assemblies. Notable differences visible from the fully assembled alternative computing device 200 shown can include a different illuminated status legend 262 near the top of front panel 260 and an antenna connector 281 protruding from the top panel of enclosure 210. Other differences will be noted in the detailed discussions that follow, and it will be understood that the modular computing housing assemblies of both computing device 100 and alternative computing device 200 can still conform to the common form factor despite such noted differences and any other potential differences.

Figure 2B:
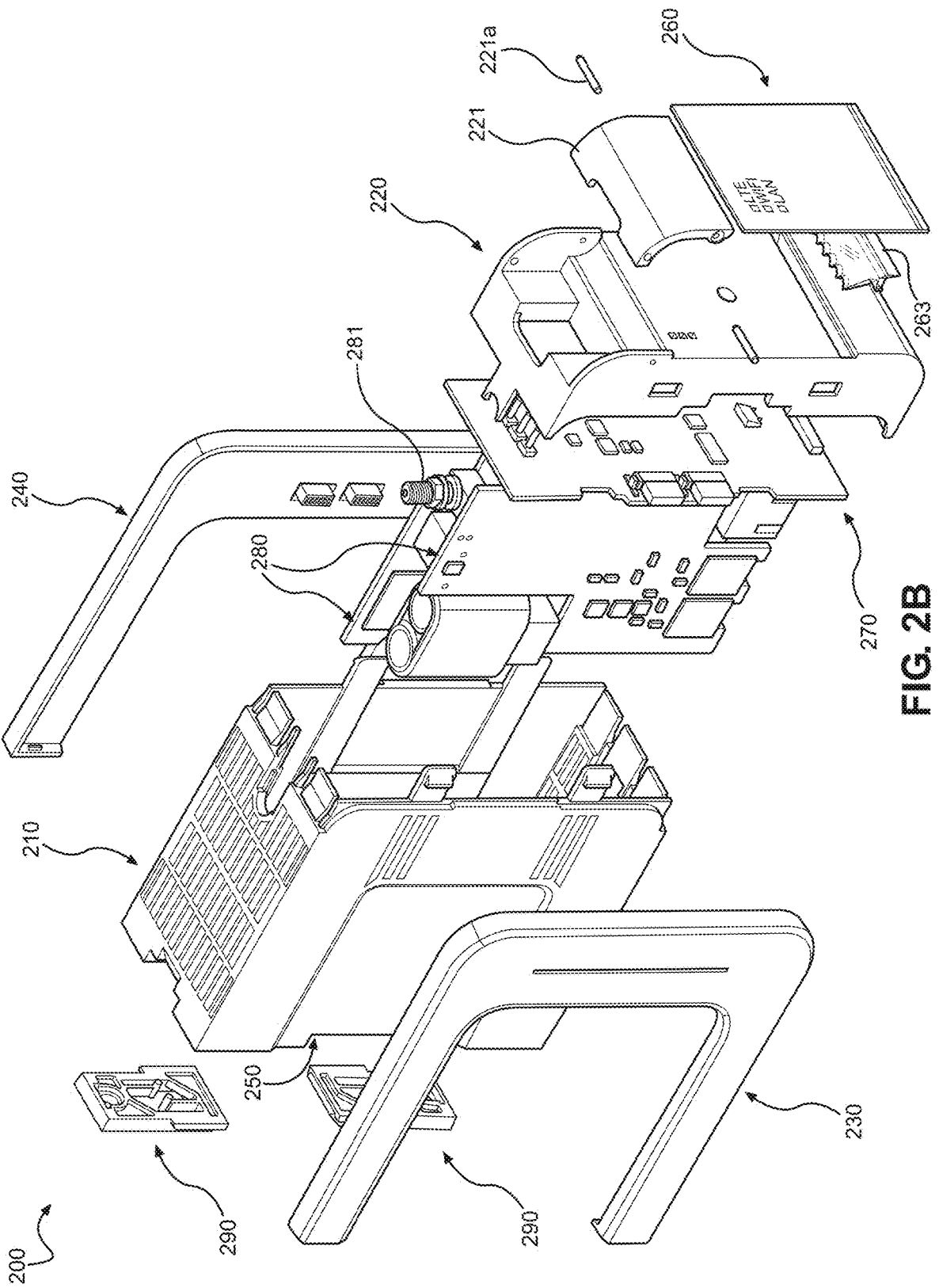
FIG. 2B illustrates in partially exploded perspective view the alternative computing device of FIG. 2A according to one embodiment of the present disclosure.

FIG. 2B illustrates alternative computing device 200 in partially exploded view. Again, computing device 200 can be a data receiver, such that its alternative modular computing housing assembly is specifically designed for the needs of a data receiver without departing from the common form factor for all related modular computing housing assemblies. Front lid 220 can similarly be readily removed from and coupled to a front open region of enclosure 210. Front lid 220 can include top hinged door 221, which can be pivotably coupled to the front lid by way of coiled spring pins 221a located on both sides of the hinged door, but does not include a bottom hinged door. Both left and right side covers 230, 240 can similarly be readily removed from and coupled to enclosure 210, such as along respective left and right side panels of the enclosure. Front panel 260 can similarly be affixed or firmly coupled to a front surface of front lid 220, and light guide 263 can abut a rear surface of the front panel to help form an illuminated light bar and can extend through front lid 220 into an inner region of the computing device. Mounting arrangement 250 can similarly include various similar features along a back panel of enclosure 210 and one or more spring clips 290 also located at the back panel, which spring clips can similarly be specialized bistate spring clips, as set forth in greater detail below.

Removing front lid 220 can expose various internal computing components of alternative computing device 200, such as first printed circuit board 270, and secondary printed circuit boards 280 among other items. First printed circuit board 270 can have a first plurality of processing components and a shape that is customized to interact physically with a front edge of enclosure 210. First printed circuit board 270 can be arranged to fit between enclosure 210 and front lid 220 such that the first printed circuit board covers a front opening of the enclosure when the front lid is removed, as shown. Secondary printed circuit board 280 can collectively have a second plurality of processing components and can be arranged transversely to and coupled to first printed circuit board 270 to form a T-shape, with the secondary printed circuit boards being readily installed into and removed from enclosure 210. In various arrangements, first printed circuit board 270 and secondary printed circuit boards 280 can be considered internal computing components of alternative computing device 200 that do not form part of its modular computing housing assembly around its exterior.

Figure 3A:
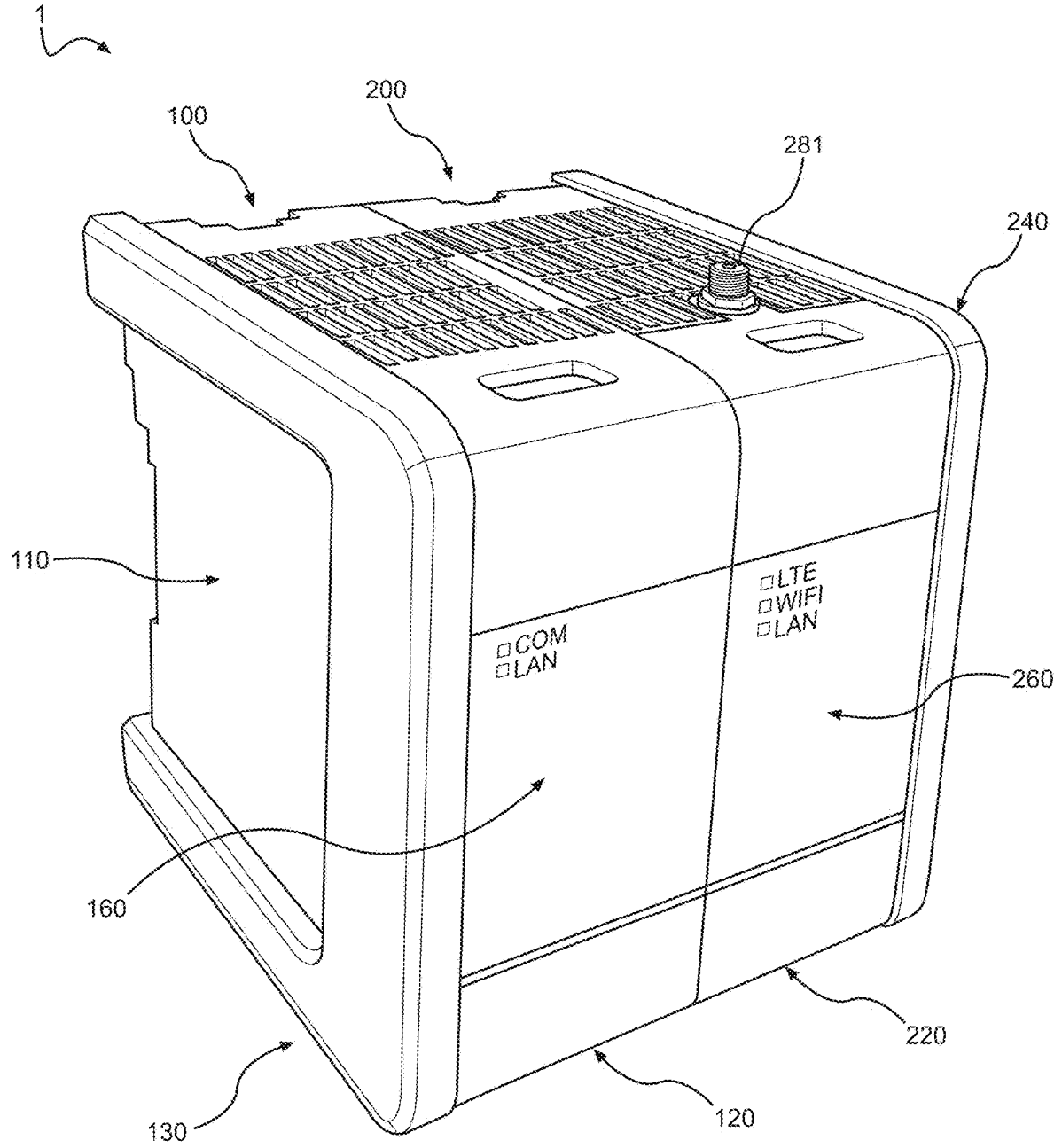
FIG. 3A illustrates in front perspective view an example environment with the computing devices of FIG. 1A and FIG. 2A coupled together according to one embodiment of the present disclosure.

Continuing with FIG. 3A, an example environment with the computing devices of FIG. 1A and FIG. 2A coupled together is shown in front perspective view. Environment 1 can include an initial or main computing device 100, which can be a data collector as set forth above, for example, and a first separate computing device 200, which can be a data receiver as set forth above, for example. Of course, other types of computing devices are also possible. Again, both computing devices 100, 200 can have substantially similar modular computing housing assemblies around their exteriors that can both conform to the same form factor, and as such can both include identical or substantially similar enclosures, front lids, side covers, mounting arrangements, spring clips, and front panels, among other components and features. First separate computing device 200 can be slightly different in that it can include or exclude one or more items or features. For example, first separate computing device 200 can include antenna connector 281 protruding from the top panel of its enclosure while main computing device 100 does not have a similar antenna connector. In some arrangements, antenna connector 281 can be considered as part of first separate computing device 200 but not part of its modular computing housing assembly, as will be readily appreciated for this and other computing device items.

As shown in FIG. 3A, main computing device 100 can have its right side cover removed and first separate computing device 200 can have its left side cover removed. In some arrangements a given side cover can be slightly taller than its respective enclosure and front lid such that it is readily apparent when a side cover has been removed from a computing device or modular computing housing assembly. As shown, main computing device 100 and first separate computing device 200 are arranged side-by-side where their side covers have been removed and are physically and electronically coupled directly together by mating corresponding computing ports (not visible) protruding from the sides of both computing devices. These computing ports become exposed when their respective side covers are removed to facilitate coupling together computing devices 100 and 200 by plugging the corresponding computing ports directly into each other without the need for any external buses, cables, or other connectors.

As shown, coupled computing devices 100 and 200 take up a compact amount of physical space, require no external buses or cables between them, and can be adjusted, moved, and mounted as a combined unit for various purposes. As a particular example, coupled computing devices 100 and 200 can be mounted together as a combined unit onto an external rail or other suitable external mounting component or feature within a network rack, server cabinet, or other relevant environment. Such a combined or simultaneous mounting of the combined unit of coupled computing devices 100 and 200 can be facilitated by identical or substantially similar mounting arrangements (not visible) located on both computing devices, such as along back panels of both enclosures. These mounting arrangements can be designed to align in series when computing devices 100 and 200 are coupled together as shown such that each computing device can readily mount along the same line to the same external rail or other suitable mounting component or feature.

Although only two computing devices 100, 200 are shown in FIG. 3A, it will be understood that additional computing devices can be readily added to the combined unit shown in a similar manner of coupling or connecting. For example, a second separate computing device (not shown) can similarly be coupled to the combined unit shown by removing the left side cover of main computing device 100, removing a right side cover of the second separate computing device, and then directly mating or coupling together exposed ports along the sides of both of the main computing device and the second separate computing device. This will then result in three computing devices being coupled side-by-side into a combined unit or stack. Further computing devices can also be coupled to either side of the combined unit or stack to create a series of computing devices that are all directly coupled together side-by-side. In some arrangements, a system can include a combined unit, stack, or series of up to five, ten, or even more computing devices that are directly coupled together side-by-side, as may be desired for a given application.

Figure 3B:
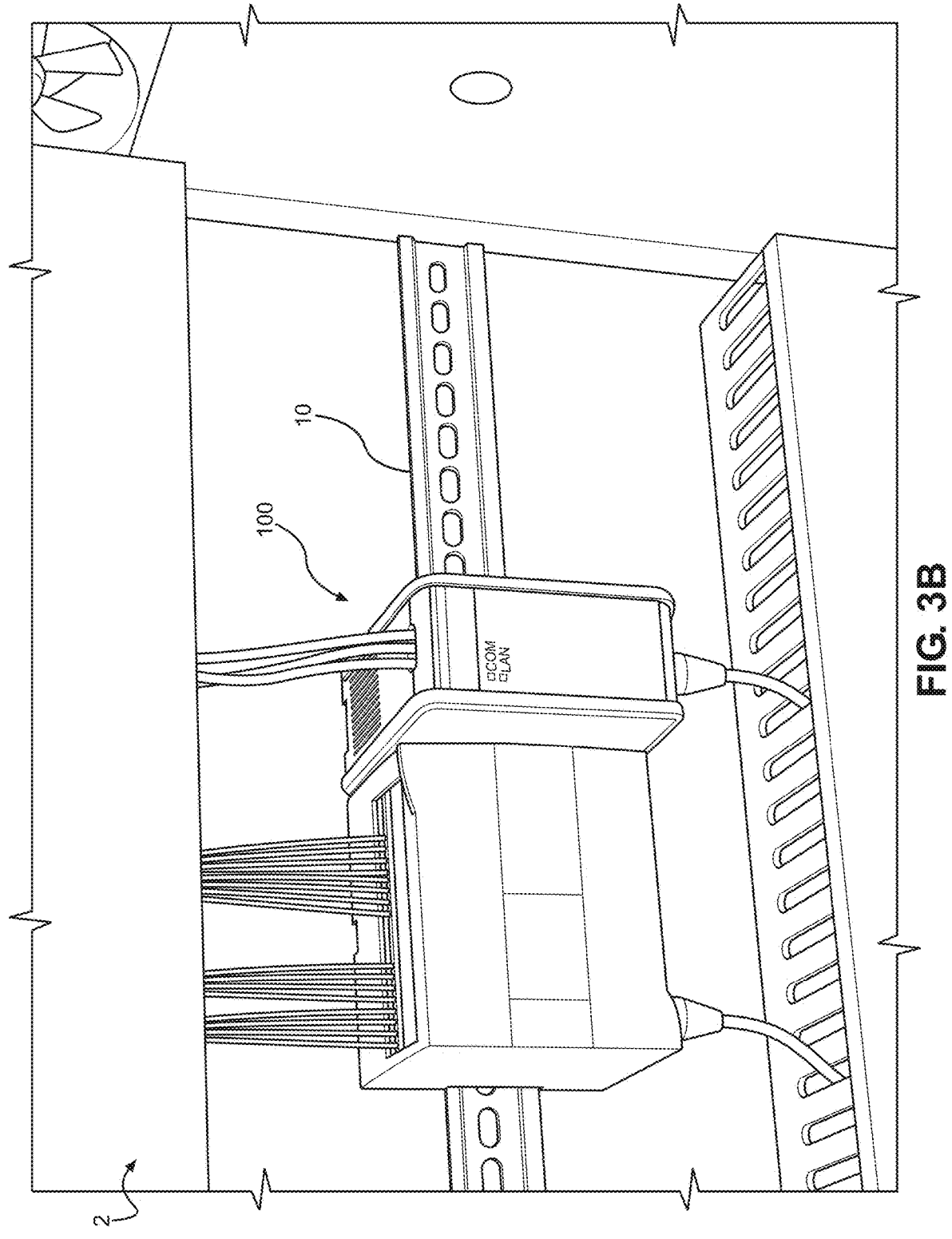
FIG. 3B illustrates in front perspective view an example environment with the computing device of FIG. 1A mounted within a server cabinet according to one embodiment of the present disclosure.

Moving next to FIG. 3B, an example environment with the computing device of FIG. 1A mounted within a server cabinet is illustrated in front perspective view. Environment 2 can be the interior of a server cabinet with computing device 100 mounted at its back side to external rail 10 along a wall within the server cabinet. Computing device 100 can be identical to the computing device disclosed above, and as such can have a modular computing housing assembly including a mounting arrangement (not visible) located at a back panel of its enclosure. Again, computing device 100 can be a data collector, although other types of computing devices are also possible. Although only a single computing device 100 is shown in FIG. 3B, it will be readily appreciated that multiple computing devices can be mounted along their back side panels to external rail 10. For example, the combined unit of computing device 100 and first separate computing device 200 shown in FIG. 3A could also be coupled to external rail 10, which can be a standard din rail, for example.

Figure 3C:
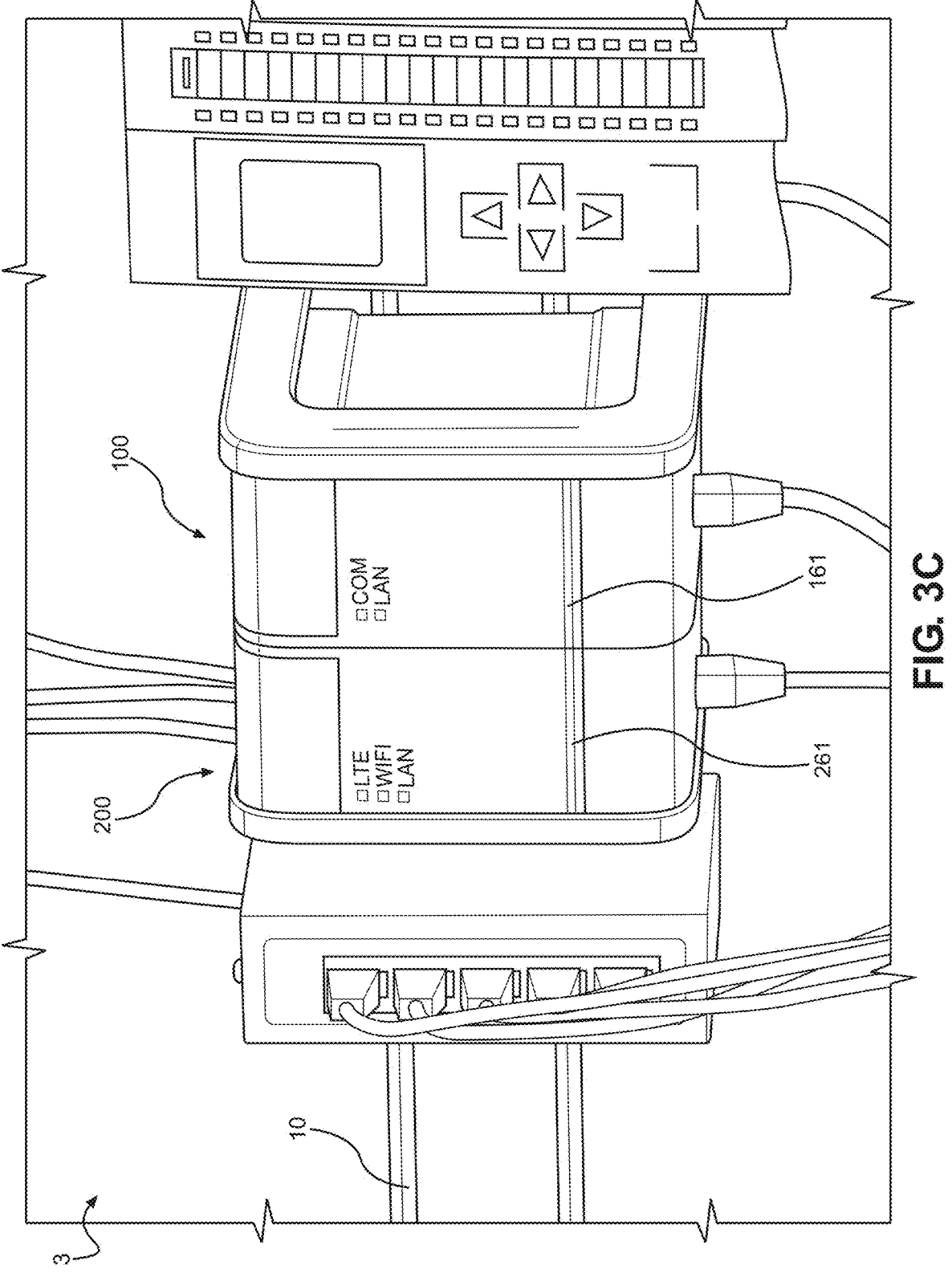
FIG. 3C illustrates in front perspective view an example environment with the computing devices of FIG. 1A and FIG. 2A coupled together and mounted within a server cabinet according to one embodiment of the present disclosure.

FIG. 3C illustrates in front perspective view an example environment with the computing devices of FIG. 1A and FIG. 2A coupled together and mounted within a server cabinet. Environment 3 can be the interior of a server cabinet with computing device 100 and computing device 200 both mounted at their back sides to external rail 10 along a wall within the server cabinet while also being coupled to each other as a combined unit. While the combined unit depicted in FIG. 3A shows the right side of computing device 100 being coupled to the left side of computing device 200, these computing devices can alternatively be coupled together in reverse order as shown in FIG. 3C. In some arrangements computing device 100 and computing device 200 can be coupled together before mounting both computing devices along their back side panels as a combined unit to external rail 10.

In some arrangements each computing device 100, 200 can be mounted separately to external rail 10 and then coupled together by sliding one or both of the computing devices laterally toward each other along the external rail. When computing devices 100 and 200 are coupled together side by side as shown, this can result in illuminated light bar 161 aligning with illuminated light bar 261 to provide an aesthetically pleasing continuous illuminated light bar arrangement across multiple computing devices as shown. This continuous illuminated light bar arrangement can occur whenever computing devices 100 and 200 are coupled together regardless of whether the computing devices are mounted to an external rail or other separate item.

Figure 3D:
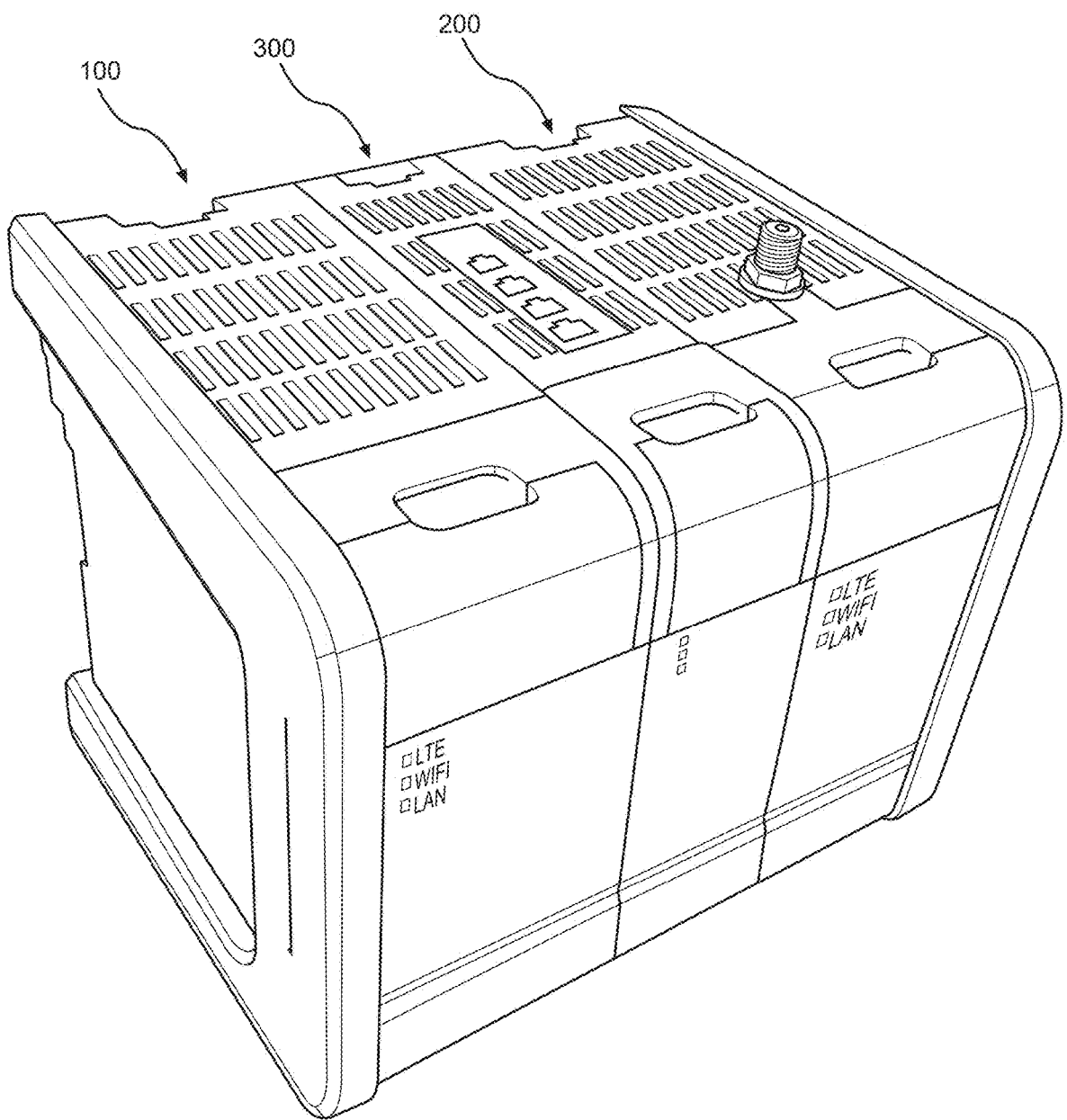
FIG. 3D illustrates in front perspective view an example environment with the computing devices of FIG. 1A and FIG. 2A coupled to another alternative computing device with another alternative modular computing housing assembly according to one embodiment of the present disclosure.

FIG. 3D illustrates in front perspective view an example environment with the computing devices of FIG. 1A and FIG. 2A coupled to another alternative computing device with another alternative modular computing housing assembly. Environment 4 can include an initial or main computing device 100, which can be a data collector as set forth above, for example, a first separate computing device 200, which can be a data receiver as set forth above, for example, and a second separate computing device 300, such as an input output module, for example. Of course, other types of computing devices are also possible. As noted above, a coupled system can include a combined unit, stack, or series of up more than just two computing devices that are directly coupled together side-by-side. As such, main computing device 100 can be coupled to the left side of second separate computing device 300 while second computing device 200 can be coupled to the right side of the second separate computing device. Other orders of device couplings can be possible such that any of computing devices 100, 200, 300 can be the middle computing device in such a three-device coupled system.

As shown, second separate computing device 300 can have the same height and same depth as but can have a narrower width than both of computing devices 100 and 200. In such an arrangement, an alternative modular computing housing assembly for second separate computing device 300 can still meet the requirements of a common form factor for multiple separate substantially similar modular computing housing assemblies. For example, the common form factor can require that every substantially similar modular computing housing assembly have the same height and same depth, but that the width can vary as may be desired for different devices. Such an allowance for varying widths but standardized heights and depths in a common form factor can still result in computing ports always aligning on opposing sides of adjacent modular computing housing assemblies as well as mounting arrangements aligning along the same plane across the enclosure back panels of adjacent modular computing housing assemblies.

Coupling multiple different computing devices together in a side-by-side manner as shown can allow for various additional advantages beyond those noted above. For example, such device couplings can provide communications and power from one coupled device to another. As such, a given coupled system or combined unit can be configured to operate by supplying power to only one of the coupled devices, whereupon the power supply can then be provided to some or all of the remaining coupled devices through the coupled side ports. This can result in a reduced need for power cables to supply power to each separate computing device individually. Further advantages will also be apparent to those of skill in the art.

Figure 4:
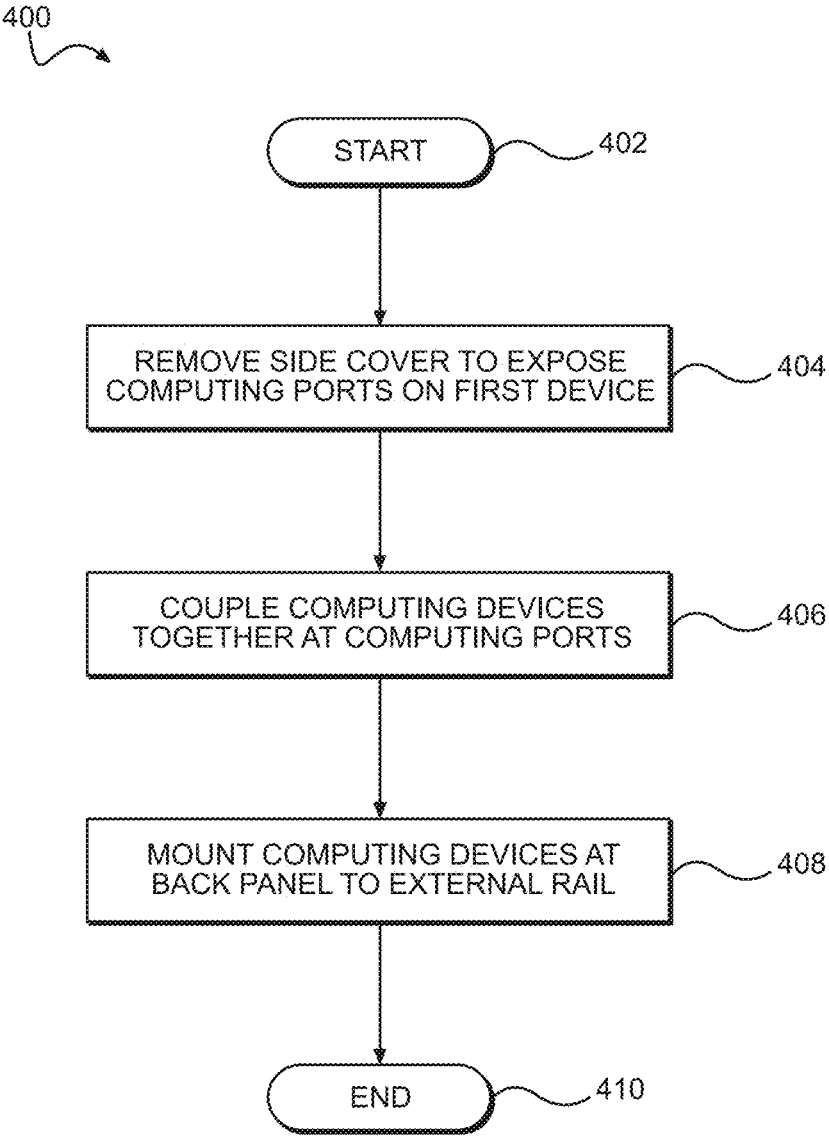
FIG. 4 illustrates a flowchart of an example summary method of using a modular computing housing assembly according to one embodiment of the present disclosure.

Moving to FIG. 4, a flowchart is provided for a summary method of using a modular computing housing assembly. Summary method 200 can represent one broad aspect of various overall methods of using modular computing housing assemblies as disclosed herein, and it will be understood that various other steps and details of such broad overall methods are not provided here for purposes of simplicity. While summary method 200 can involve the use of one or more modular computing housing assemblies on multiple data receivers, for example, it is also contemplated that the various disclosed methods can also be applied to other types of computing devices and systems beyond data receivers.

After a start step 402, a first process step 404 can involve removing a side cover from a first side of a modular computing housing assembly to expose one or more computing ports along a first side of a first computing device. As noted above, the modular computing housing assembly can have a box-shaped enclosure, a front lid, first and second side covers, and a mounting arrangement, and the first side cover can include an outer face, an inner face, and one or more computing port plugs extending from the inner face. Removing the first side cover can unplug the one or more computing port plugs from and expose a first set of one or more computing ports on the first computing device.

At a following process step 406, the first computing device can be coupled with a second computing device by directly mating, plugging, or otherwise connecting together the first set of exposed computing ports into a corresponding exposed set of computing ports on the second computing device. This coupling can be a physical and electronic coupling of the devices and can result in the first and second computing devices being arranged side-by-side, such as that which is shown in FIG. 3A above.

The next process step 408 can involve mounting the first and second computing devices to an external rail or other suitable mounting item or feature. Such a mounting can be accomplished by using a mounting arrangement located along an outer surface of an enclosure back panel of each of the first and second computing devices. Each mounting arrangement can include multiple spring clips configured to slide between closed and open positions, such that pushing each mounting arrangement against the external rail results in actuating the mounting arrangement to lock onto and mount the entire computing device onto the external rail. Various components and features for such a mounting arrangement, such as one or more bistate spring clips, are provided in greater detail below.

Summary method 400 can then end at end step 410. In some arrangements, one or more of the foregoing steps can be performed simultaneously or in a different order. For example, step 408 can be partially or fully performed before step 404 and/or step 406 in some arrangements. Not all steps are necessary in all situations, and additional steps and details can be added. For example, an additional step can involve removing a side cover on the second computing device to expose the computing ports on that computing device. Further steps, details, and variations are provided in detailed method 1000 set forth below.

Transitioning now to FIGS. 5A through 5E, a computing device with a modular computing housing assembly is shown in different views and with various components adjusted or removed for purposes of illustration and discussion. It will be understood that the computing device shown in these figures can be identical or substantially similar to the fully assembled computing device 100 specifically designated as a data collector as shown and described in FIGS. 1A-1B above. Although some differences may exist with respect to the alternative computing device 200 designated as a data receiver shown in FIGS. 2A-2B above, it will be understood that the following examples can apply to both disclosed computing devices 100, 200 and any other computing device having a substantially similar modular computing housing assembly that conforms to a standard form factor.

Figure 5A:
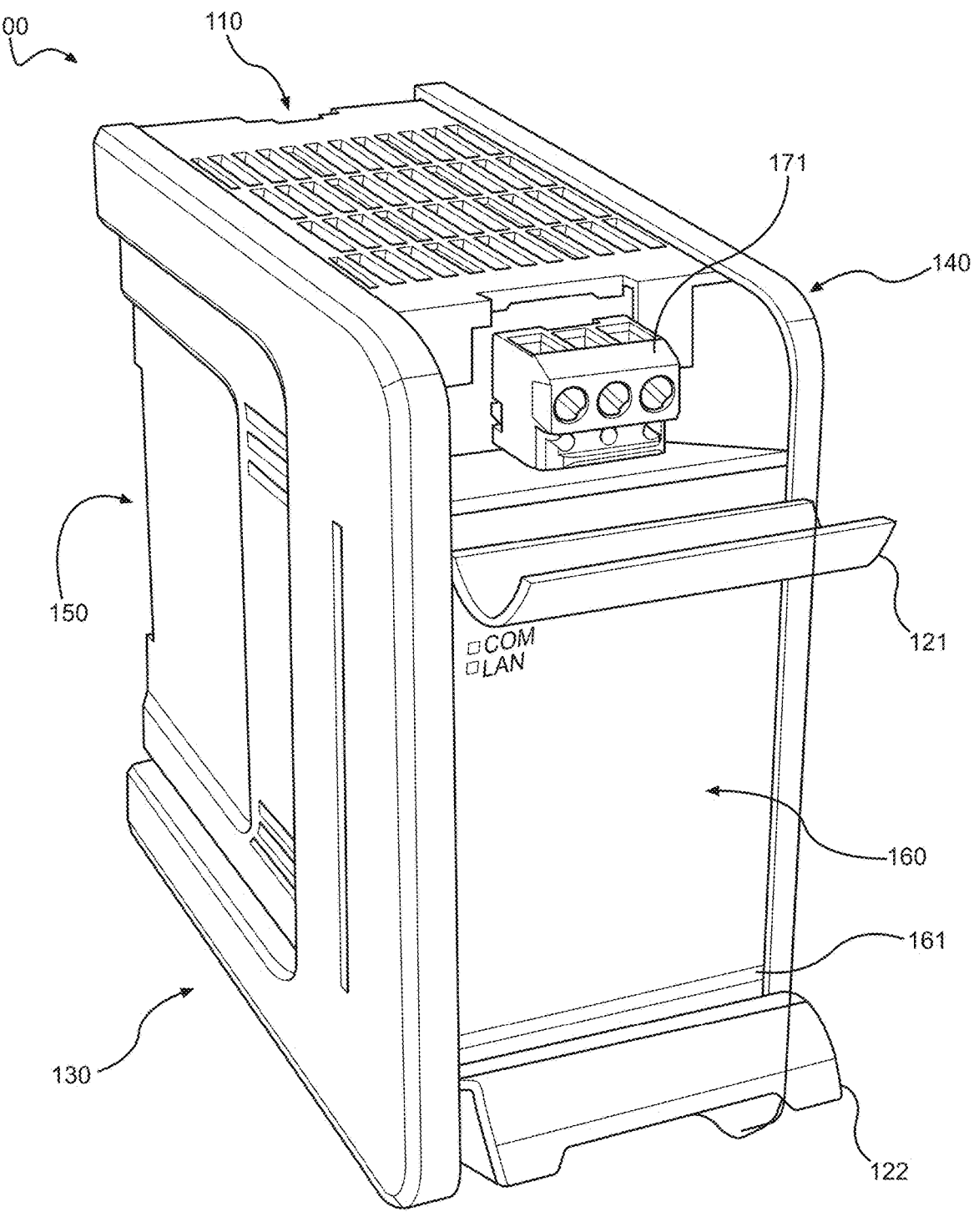
FIG. 5A illustrates in front perspective view the computing device of FIG. 1A with its front hinged doors opened according to one embodiment of the present disclosure.

Starting with FIG. 5A, computing device 100 is illustrated in front perspective view with its front hinged doors opened to reveal internal components and features of the computing device. Again, computing device 100 can have a modular computing housing assembly that can include enclosure 110, front lid 120, left side cover 130, right side cover 140, mounting arrangement 150 (not visible), and front panel 160 including illuminated light bar 161 near its bottom. Front lid 120 can include top hinged door 121 and bottom hinged door 122, both of which can be pivoted or otherwise moved between closed positions (as shown in FIG. 1A) and open positions (as shown in FIG. 5A). Both top and bottom hinged doors 121, 122 can be configured to cover and provide access to one or more internal components of computing device 100, such as power input 171 located behind the top hinged door.

Figure 5B:
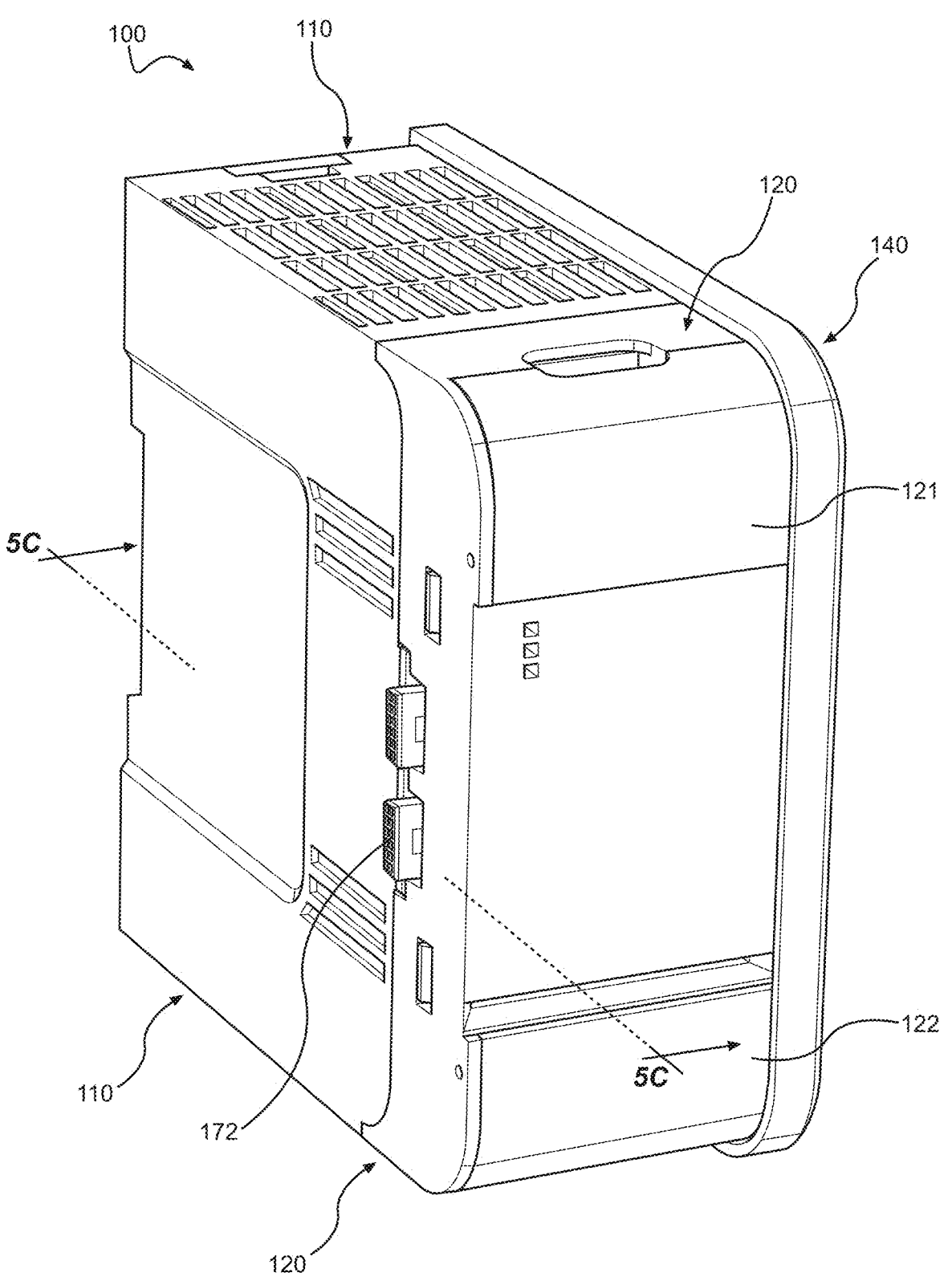
FIG. 5B illustrates in front perspective view the computing device of FIG. 1A with its left side cover removed according to one embodiment of the present disclosure.

FIG. 5B illustrates in front perspective view computing device 100 with its left side cover removed. As in FIG. 1A above, computing device 100 is shown with top and bottom hinged doors 121, 122 in their closed positions. The left side cover of computing device 100 has been removed to expose computing ports 172 along the left side of the computing device, as well as some regions along the outer surfaces of enclosure 110 and front lid 120 that were previously covered by the left side cover. Computing ports 172 can protrude through openings along a left side region of front lid 120 as shown such that these computing ports can be physically and electronically coupled to corresponding computing ports on a separate similar computing device. Computing ports 172 can be mounted to a printed circuit board within computing device 100, such as first printed circuit board 170 shown above. While two computing ports 172 are shown for purposes of illustration, it will be appreciated that only one computing port might be used or more computing ports might be used for a given system or application.

It will also be understood that an identical or similar arrangement to that which is shown can be mirrored on the right side of computing device 100, with right side cover 140 being removable to expose further computing ports on the right side of the computing device. In some arrangements, a system of multiple identical or similar computing devices can be designed such that the one or more computing ports on the left side of each computing device can plug into or otherwise couple with one or more corresponding computing ports on the right side of another computing device. This can involve meeting one requirement of a common form factor for all devices. For example, computing ports 162 on the left side of computing device 100 as shown in FIG. 3C can both be male computing ports while corresponding computing ports on the right side of identical and similar computing devices can be female computing ports configured to mate with the male computing ports when two computing devices are arranged side-by-side. Accordingly, the computing ports on the right side of computing device 100 can be arranged opposite to the left side computing ports as shown to facilitate coupling with other identical or substantially similar computing devices in an overall system, as will be readily appreciated.

Figure 5C:
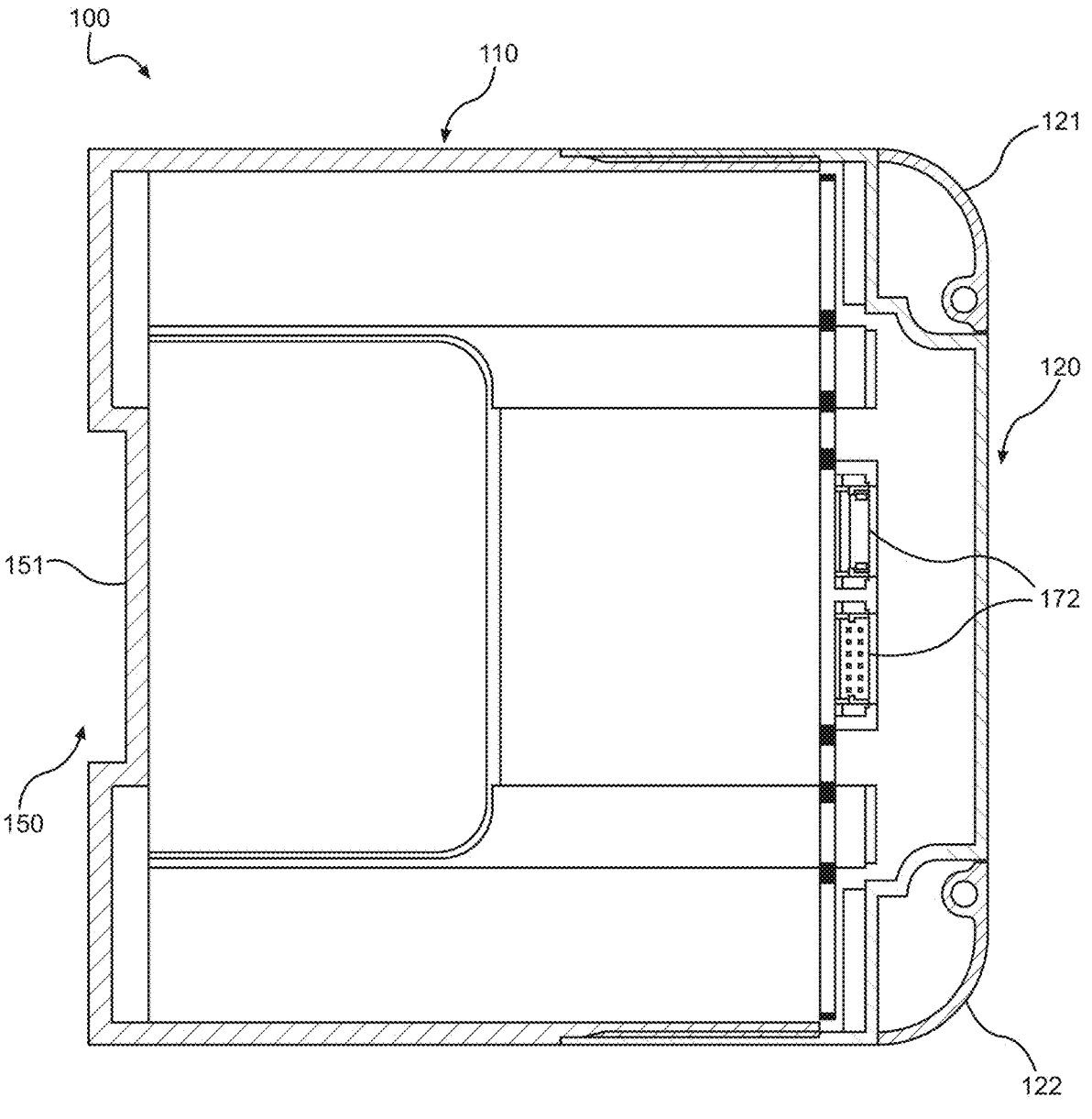
FIG. 5C illustrates in side cross-section view the computing device of FIG. 5D according to one embodiment of the present disclosure.

FIG. 5C depicts computing device 100 in side cross-section view as taken along line 5C-5C in FIG. 5B to provide additional perspective on various components of the disclosed modular computing housing assembly. In addition to previously illustrated items, a portion of mounting arrangement 150 is shown at the back of computing device 100. As shown, mounting arrangement 150 can include a recessed region 151 in a back panel of enclosure 110, with this recessed region being located between spring clips or other mounting components (not visible) positioned at its top and bottom. Recessed region 151 can extend from one side of computing device 100 to its other side and can be configured to accommodate a separate external rail extending therethrough, as set forth in greater detail below. While FIG. 5C illustrates a set of computing ports 172 as having one male and one female computing port, it will be understood that other configurations are also possible, such as two male or two male computing ports.

Figure 5D:
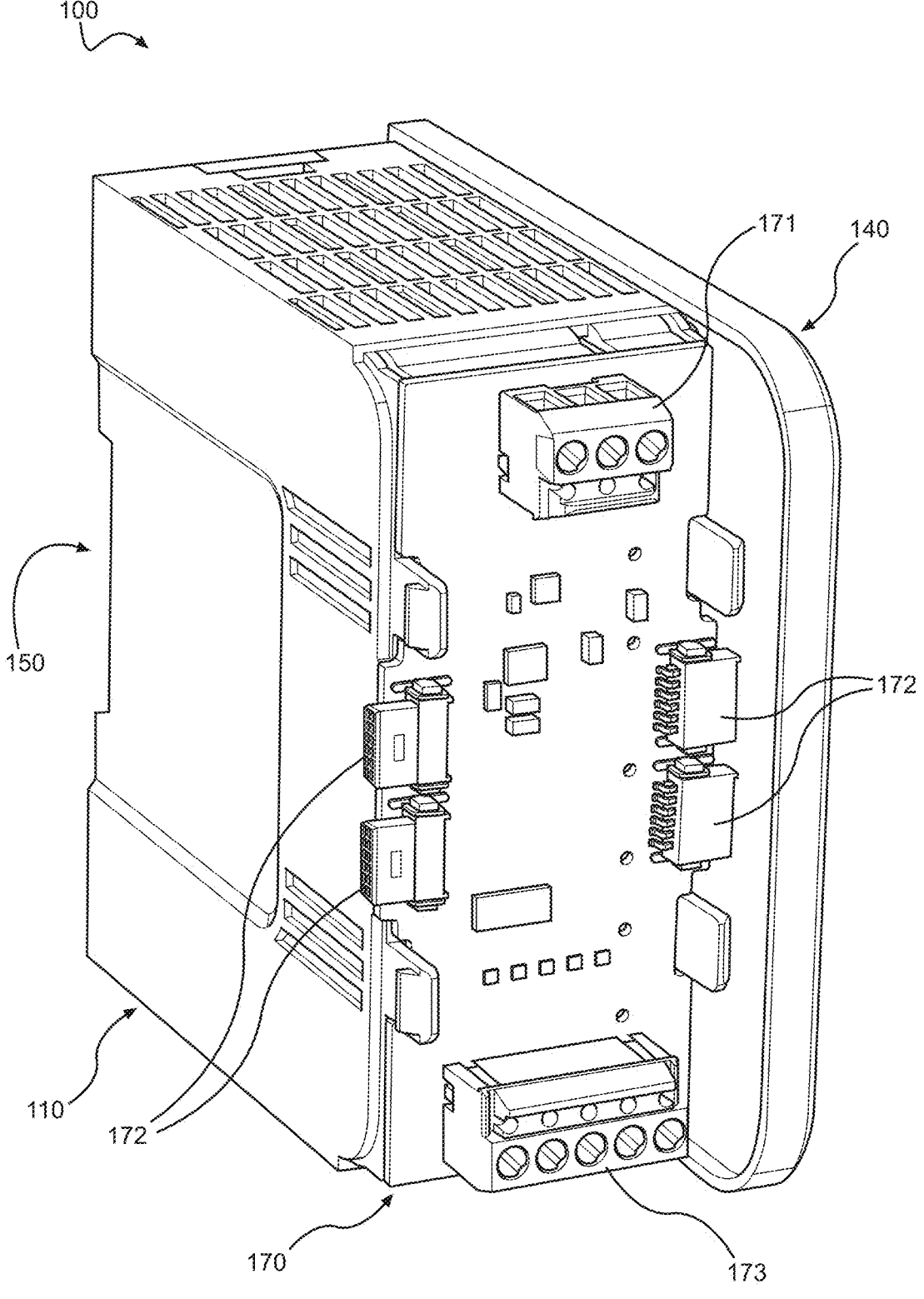
FIG. 5D illustrates in front perspective view the computing device of FIG. 5B with its front lid also removed according to one embodiment of the present disclosure.
Figure 5E:
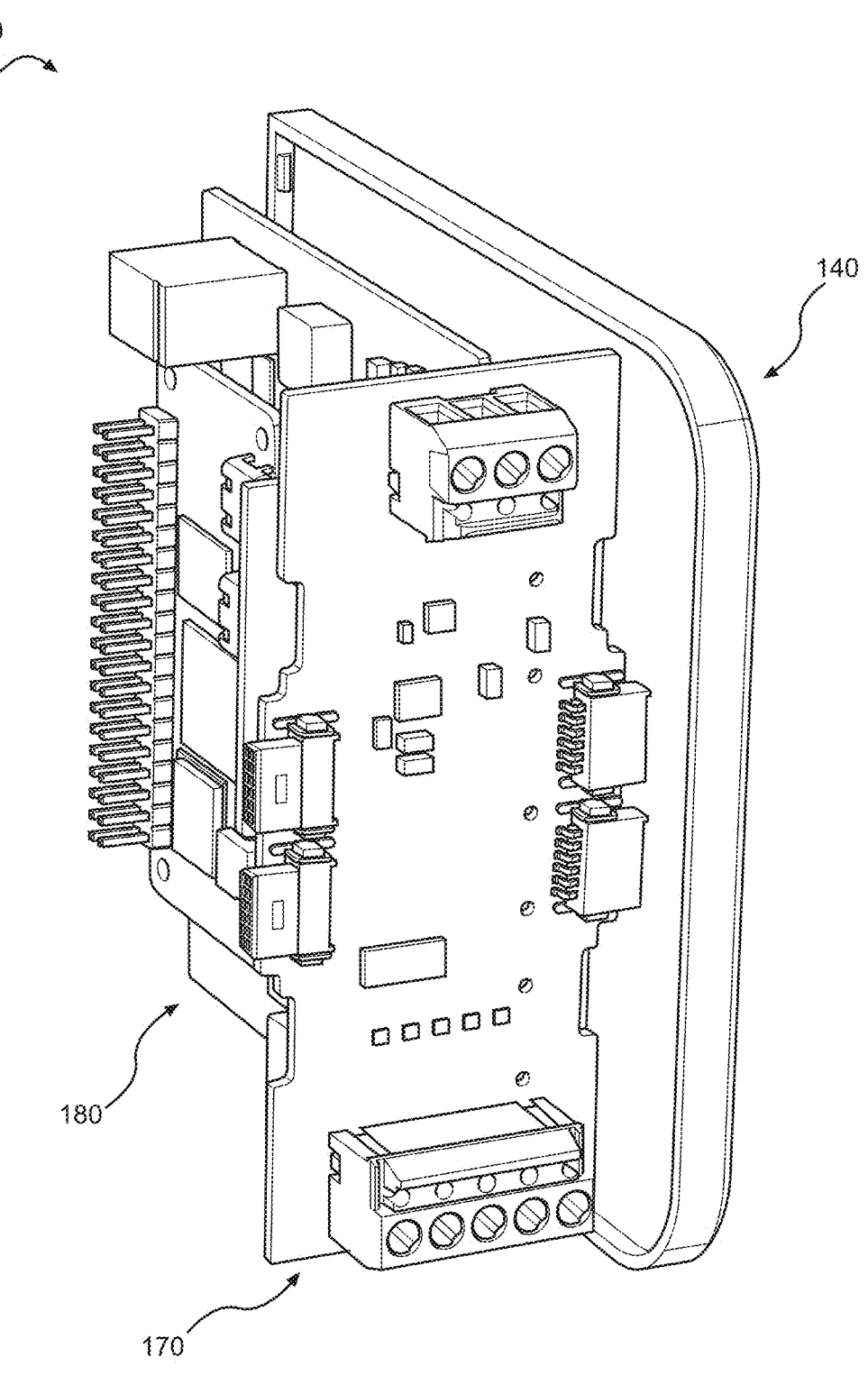
FIG. 5E illustrates in front perspective view the computing device of FIG. 5D with its enclosure also removed according to one embodiment of the present disclosure.

Continuing with FIGS. 5D and 5E, computing device 100 is again shown in front perspective views with its left side cover 130 and front lid 120 being removed in FIG. 5D, and then with its enclosure 110 also being removed such that only its right side cover 140 and various internal components remain in FIG. 5E. In addition to the components and features previously noted, first printed circuit board 170 can further include a communications port 173 mounted thereto, which can be located at a lower region of the first printed circuit board such that it resides behind the bottom hinged door of the front lid. Second printed circuit board 180 can be located within enclosure 110 and can include a second plurality of processing components and a geometry that is customized to interact physically with features along internal surfaces of the enclosure to reside within its internal volume. Second printed circuit board 180 can be coupled to and arranged perpendicularly to first printed circuit board 170 to form a T-shape of the first and second printed circuit boards, as shown. Various other processing components can be disposed on both of first and second printed circuit boards 170, 180 as will be readily appreciated by those of skill in the art.

FIGS. 6A through 9D illustrate for discussion various components and features of a modular computing housing assembly for a computing device shown in various views. While these drawings primarily illustrate various components and features for the modular computing housing assembly of computing device 100 above (e.g., a data collector), some show variations that apply for the alternative modular computing housing assembly of alternative computing device 200 above (e.g., a data receiver). It will be readily appreciated that many components and features shown with respect to computing device 100 can either identically apply to alternative computing device 200 or any other similarly suited alternative computing device or can be reasonably extrapolated to such an alternative computing device without departing from the requirements of a suitable common form factor between all devices.

Figure 6A:
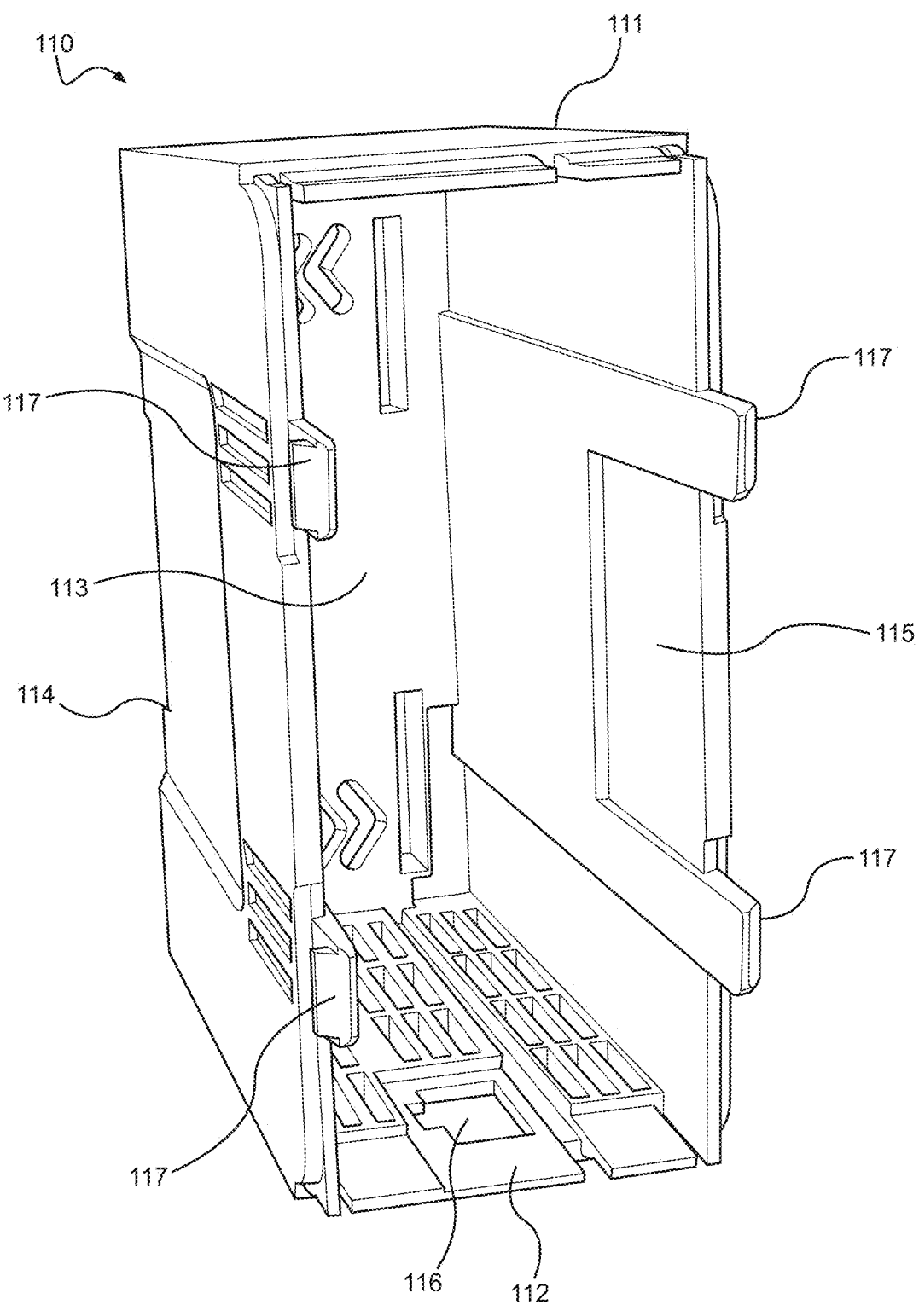
FIG. 6A illustrates in front perspective view an example enclosure for a modular computing housing assembly in isolation according to one embodiment of the present disclosure.
Figure 6B:
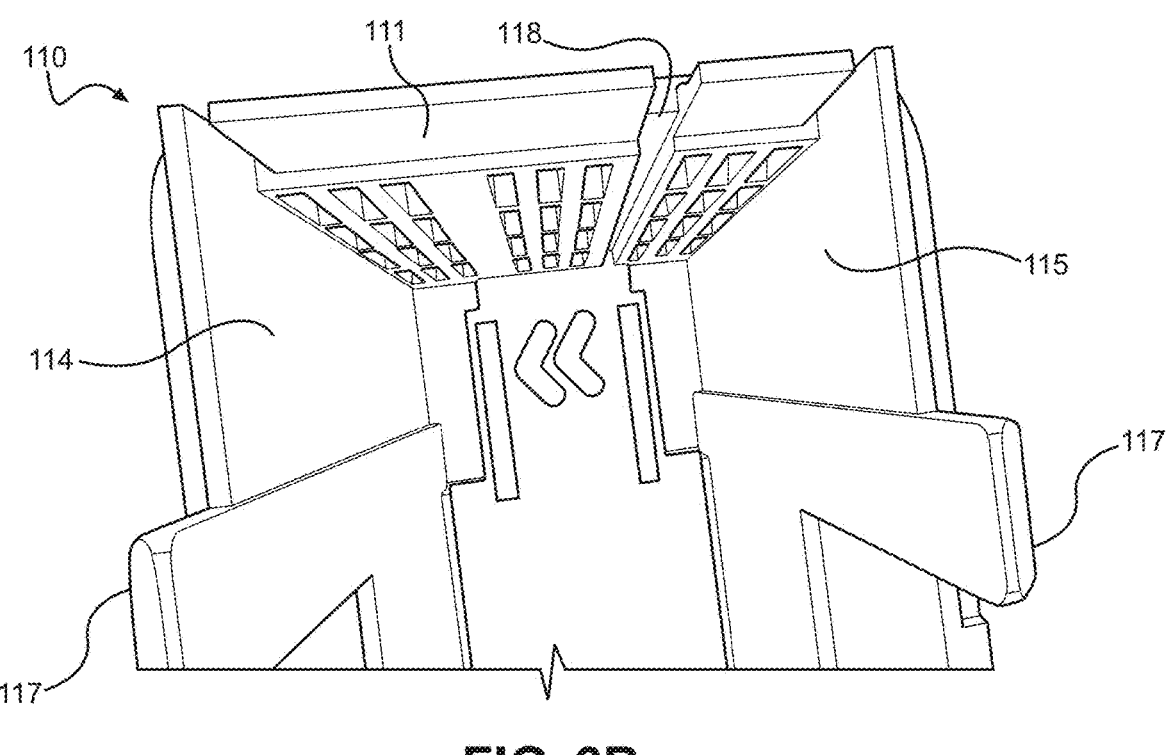
FIG. 6B illustrates in bottom perspective view an upper internal region of the enclosure of FIG. 6A according to one embodiment of the present disclosure.
Figure 6C:
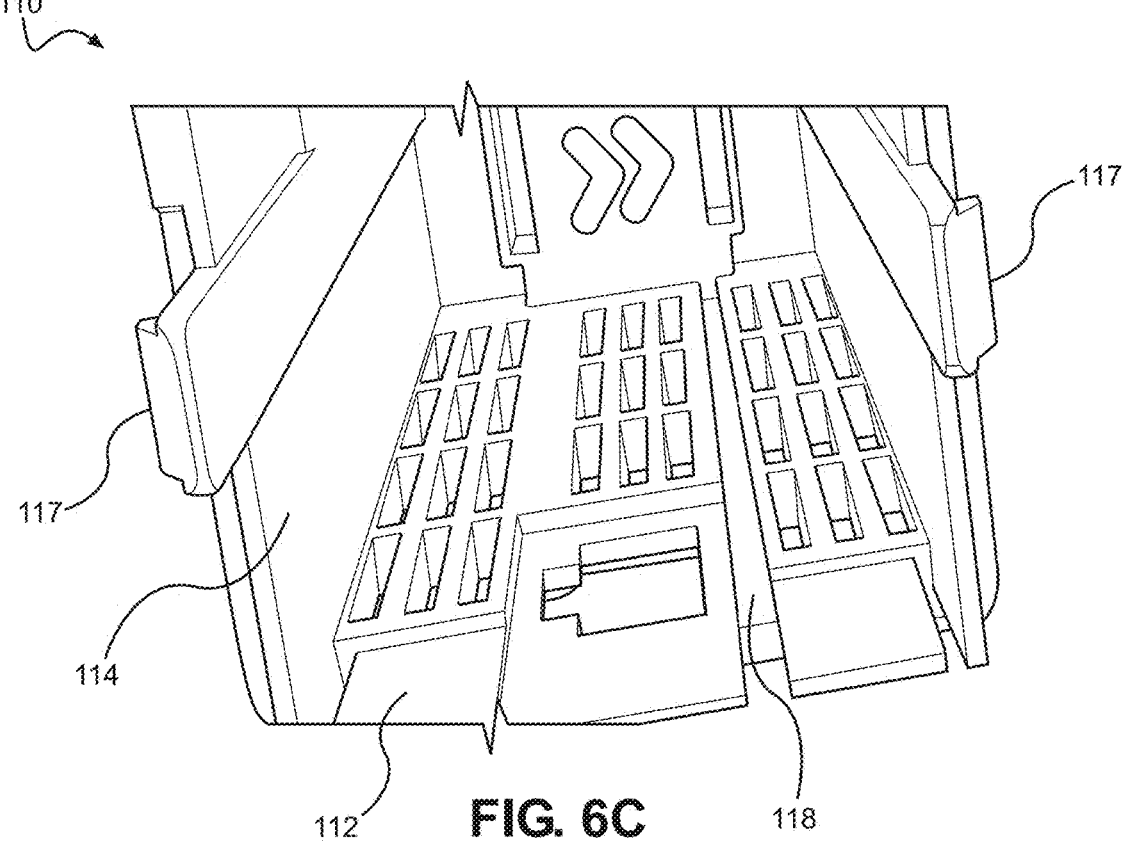
FIG. 6C illustrates in top perspective view a lower internal region of the enclosure of FIG. 6A according to one embodiment of the present disclosure.

First, FIG. 6A illustrates in front perspective view an example enclosure 110 for a modular computing housing assembly, while FIGS. 6B and 6C show an upper internal region and a lower internal region of the enclosure in bottom and top perspective views respectively. In various embodiments, enclosure 110 can be box-shaped and can include a plurality of connected panels, such as top panel 111, bottom panel 112, back panel 113, left side panel 114, and right side panel 115 (i.e., first and second side panels). One or more of these panels can include features or openings to facilitate the use of other device and system components and items. For example, opening 116 through bottom panel 112 can be configured for use with an ethernet port to allow for an ethernet connection to the overall computing device. Such an ethernet port can be coupled to second printed circuit board 180 shown above, for example. As shown, enclosure 110 can define a front opening spanning across the front edges of top panel 111, bottom panel 112, left side panel 114, and right side panel 115, and can also define an internal volume configured to contain a plurality of internal computing components therein. In some arrangements, enclosure 110 can be integrally formed from a single rigid polycarbonate or thermoplastic material, for example, among other possible suitable materials.

As noted above, the disclosed modular computing housing assembly can eschew the use of screws, bolts, glues, and the like as coupling features for its removable parts in favor of more beneficial and toolless coupling features such as press fits, protrusion tabs, and the like. Accordingly, enclosure 110 can also include multiple protrusion tabs 117 configured to facilitate removably coupling the enclosure to the front lid of the modular computing housing assembly. As shown, multiple protrusion tabs 117 can extend forward from the front edges of both left side panel 114 and right side panel 115, and these protrusion tabs can be configured to mate into openings along side regions of the front lid. Each protrusion tab 117 can have a geometry that facilitates slight bending or bowing of the protrusion tab until a front nub of the tab clicks into a corresponding opening in the front lid to lock the tab in place. As will be readily appreciated by those of skill in the art, some or all of the front nubs of protrusion tabs 117 can be manually pushed inward through the openings in the front lid to facilitate removal of the front lid to unlock the protrusion tabs and allow the front lid to slide forward away from enclosure 110 when removal of the front lid is desired.

In various arrangements, one or more panels of enclosure 110 can have a pattern of openings therethrough to facilitate cooling and airflow through the overall computing device. For example, top panel 111 and bottom panel 112 can have a pattern of airflow openings therethrough. Such openings may not be practical for left side panel 114 or right side panel 115, however, due to the modular computing housing assembly being configured to arrange multiple computing devices side-by-side with little to no space between adjacent side panels. In some embodiments, enclosure 110 can also have one or more grooves 118 located along internal surfaces of panels, such as along top panel 111 and bottom panel 112 as shown. Grooves 118 can be dimensioned and configured to facilitate the installation and support of one or more internal computing components. For example, grooves 118 as shown can be dimensioned and configured such that top and bottom edges of second printed circuit board 180 as shown above can slide into the inner cavity of enclosure 110 along the grooves and can be supported thereby.

Figure 6D:
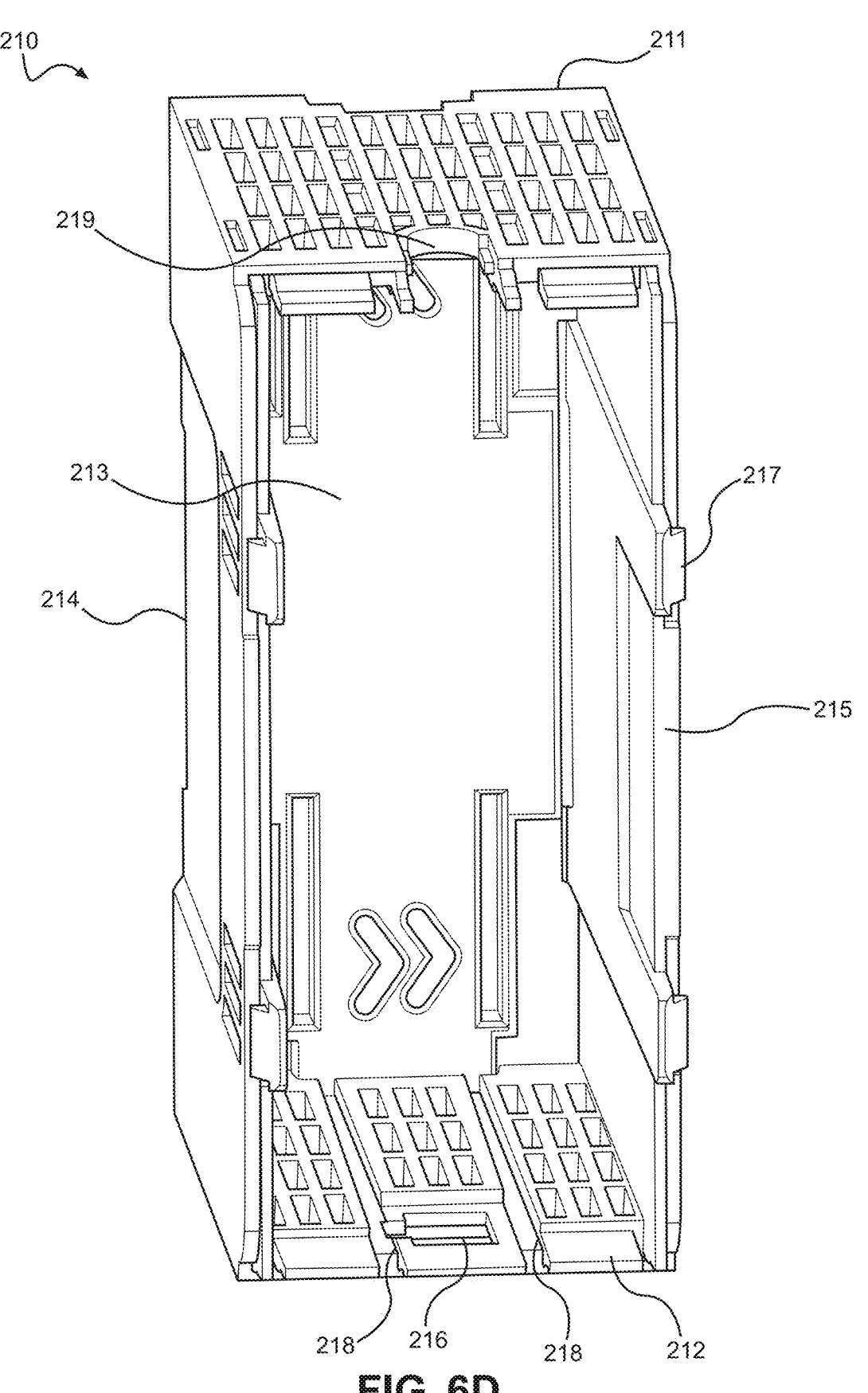
FIG. 6D illustrates in front perspective view an example alternative enclosure for an alternative modular computing housing assembly in isolation according to one embodiment of the present disclosure.

FIG. 6D illustrates in front perspective view an example alternative enclosure for an alternative modular computing housing assembly. Enclosure 210 can be that which is disclosed above for use with an alternative computing device 200 (e.g., a data receiver). Enclosure 210 can be identical in most regards with respect to enclosure 110 shown in FIGS. 6A-6C. Unlike enclosure 110, however, enclosure 210 can have multiple grooves 218 formed along its bottom panel 212 and can also include multiple corresponding grooves formed along its top panel 211. These multiple grooves 218 can accommodate multiple secondary printed circuit boards, as used within the interior of alternative computing device 200. In addition, top panel 211 can have a center slot 219 extending inward from its front edge, with this center slot being configured to allow an antenna connector (281 in FIG. 2A) to protrude from the top panel. Other differences between enclosure 210 and enclosure 110 are also possible, with all such differences still allowing each enclosure to conform to a standard form factor.

Figure 7A:
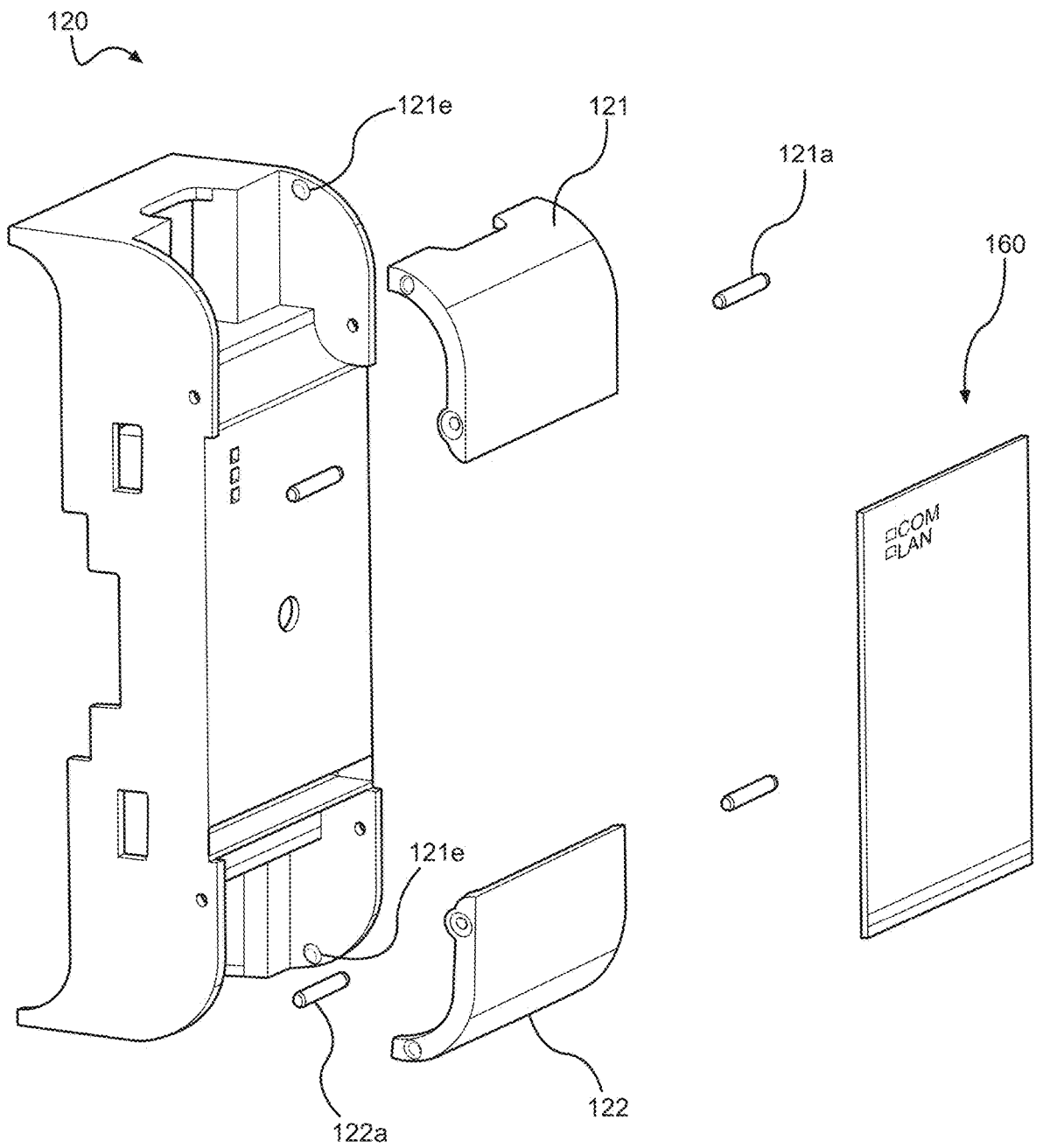
FIG. 7A illustrates in exploded perspective view an example front lid for a modular computing housing assembly according to one embodiment of the present disclosure.
Figure 7B:
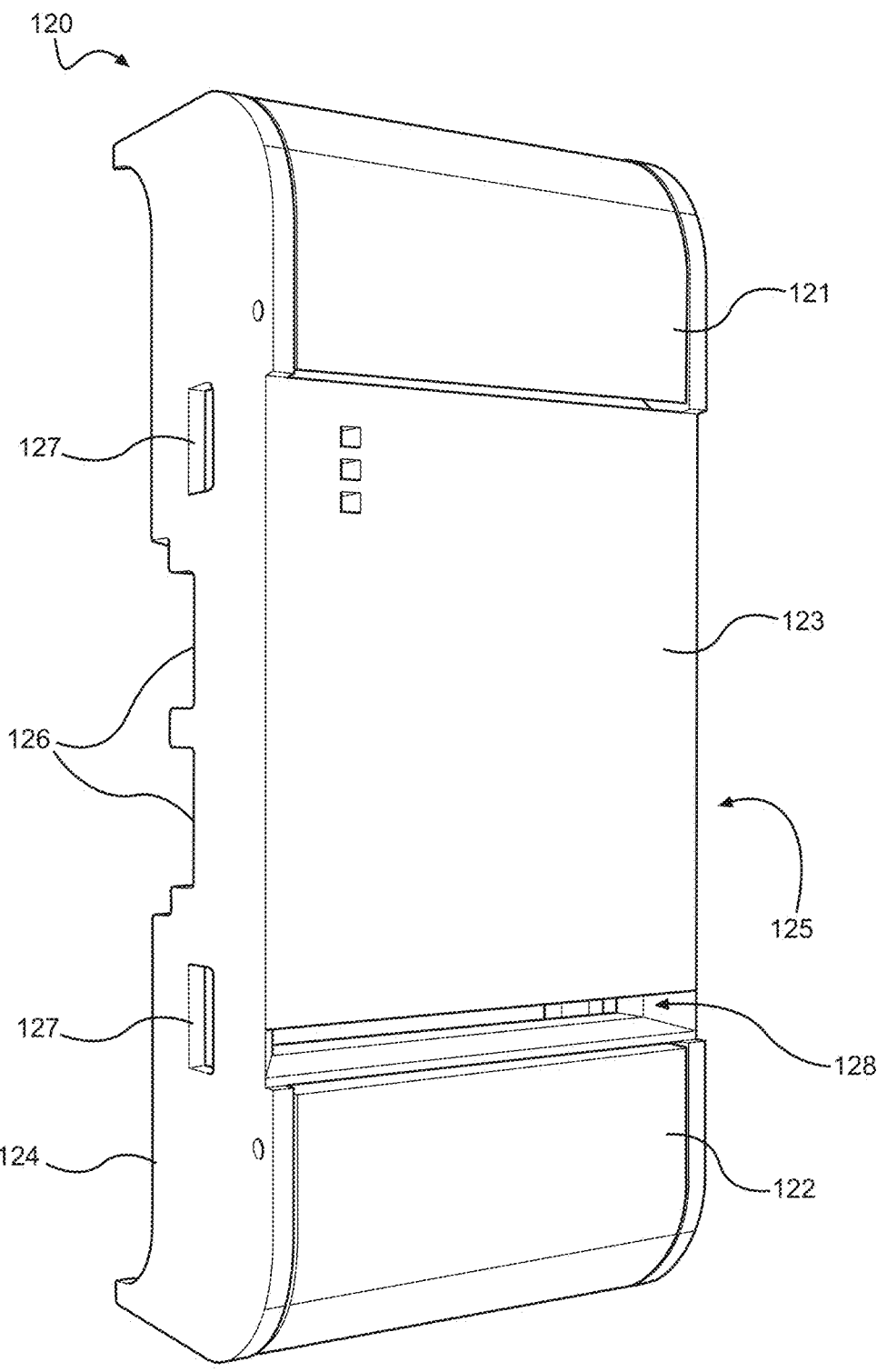
FIG. 7B illustrates in front perspective view the front lid of FIG. 7A in isolation according to one embodiment of the present disclosure.

FIGS. 7A through 7G provide various views of front lids for modular computing housing assemblies. FIGS. 7A and 7B illustrate an example front lid in exploded perspective and front perspective views respectively. Front lid 120 can include top hinged door 121 coupled to the front lid by way of coiled spring pins 121a, bottom hinged door 122 coupled to the front lid by way of coiled spring pins 122a, and front panel 160 affixed or firmly coupled to a front surface of the front lid, which front surface can be slightly recessed such that the front panel and both hinged doors all align flush with each other at their respective front surfaces.

Front lid can also include front portion 123, left side portion 124, and right side portion 125 (i.e., first and second side portions), with the left and right side portions being identical mirror images of each other. Left and right side portions 124, 125 can both include one or more side openings 126 configured to allow computing ports (162 above) to protrude therethrough, as noted above. Left and right side portions 124, 125 can also both include one or more tab openings 127 configured to allow end nubs of protrusion tabs (117 above) on the enclosure to snap into the tab openings to help couple front lid 120 to the enclosure, as also noted above. Front portion 123 can include a light guide slot 128 configured to locate a light guide (not shown) that can display different lights for the computing device at front panel 160.

As noted above, front lid 120 can be removably coupled to the enclosure and such that it covers the enclosure front opening to fully enclose the enclosure inner volume. This can be done by sliding front lid 120 onto the front edge of the disclosure until the protrusion tabs of the enclosure engage into tab openings 127 to mechanically lock the front lid in place against the enclosure. One or more additional protrusion tabs, press fit components, and/or other physical locking features can be located along top and bottom edges of front lid 120 to engage with corresponding features on the enclosure to further physically coupling the front lid to the enclosure as may be desired. In some arrangements, some or most of front lid 120 can be integrally formed from a single rigid polycarbonate or thermoplastic material, for example, among other possible suitable materials. For example, front portion 123, left side portion 124, and right side portion 125 can be integrally formed as a single unit.

Figure 7C:
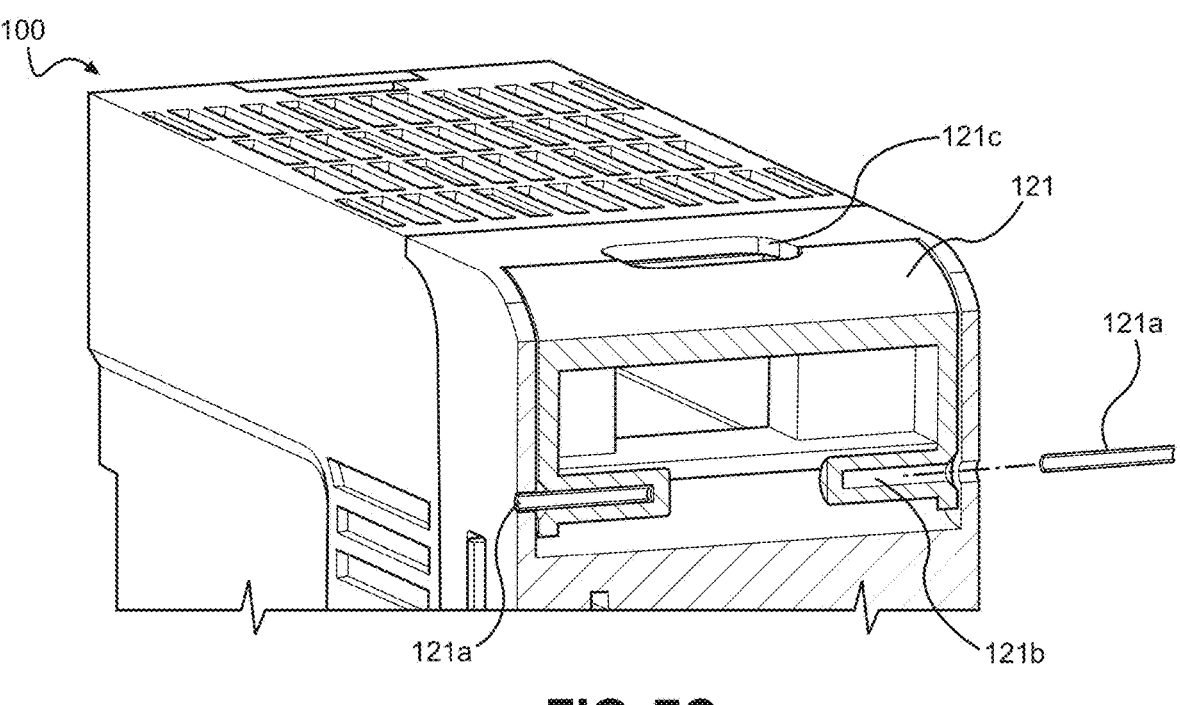
FIG. 7C illustrates in front perspective cross-section view a top hinged door region of the front lid of FIG. 7A according to one embodiment of the present disclosure.

FIG. 7C illustrates in front perspective cross-section view a top hinged door region of the front lid. Top hinged door 121 can include internal cavities 121b configured to hold coiled spring pins 121a therein. These coiled spring pins 121a can be configured to provide rotational resistance to top hinged door 121 such that the top hinged door can be pivoted to and held at a range of multiple different open positions. Top hinged door 121 can also include opening 121c along a top surface thereof, with this opening being configured to pass one or more cables or other connectors therethrough when the top hinged door is closed.

Figure 7D:
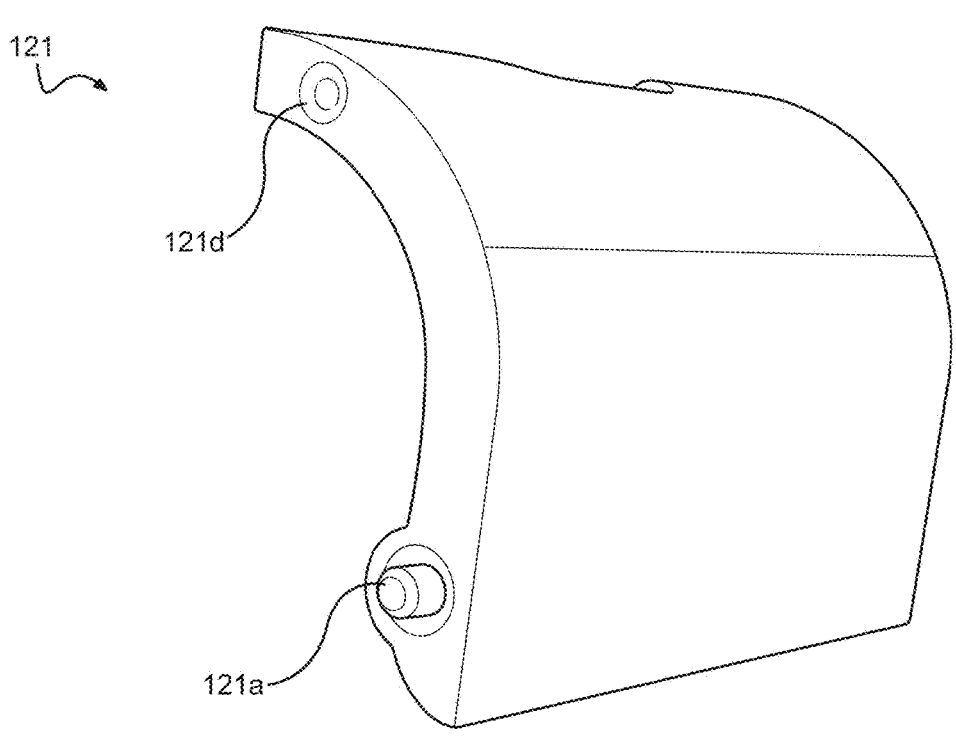
FIG. 7D illustrates in front perspective view a top hinged door of the front lid of FIG. 7A in isolation according to one embodiment of the present disclosure.

FIG. 7D depicts top hinged door 121 in isolation in front perspective view. Top hinged door 121 can be pivotably coupled to the front lid by way of coiled spring pins 121a located on both sides of the top hinged door towards a lower region of the door. Again, coiled spring pins 121a can insert into openings on the lower sides of top hinged door 121 and also into corresponding openings along inner surfaces of the left and right side portions of the front lid such that the top hinged door cannot be readily removed from the front lid. Coiled spring pins 121a can function to bias hinged rotation of top hinged door 121 to a fully open position such that the top hinged door does not flop around loosely when it is opened.

One or more hemispherical protrusions 121d can be located on both sides of top hinged door 121 towards an upper region of the door opposite the coiled spring pins 121a. These hemispherical protrusions 121d can be configured to snap into corresponding divots or dimples (121e in FIG. 7A) along inner surfaces of the left and right side portions of the front lid to physically keep top hinged door 121 in place when the door is pivoted or rotated to its closed position. The closing force generated by snapping hemispherical protrusions 121b into corresponding divots along the front lid can be sufficient to overcome any possible biasing force generated by coiled spring pins 121a but can also be low enough such that a user can readily open top hinged door 121 manually. In some arrangements this protrusion 121b and divot 121e arrangement can be inverted. Other physical locking features are also possible. In various embodiments, bottom hinged door 122 can be identical or substantially similar to top hinged door 121 but can be arranged in a relatively inverted position as illustrated herein.

Figure 7E:
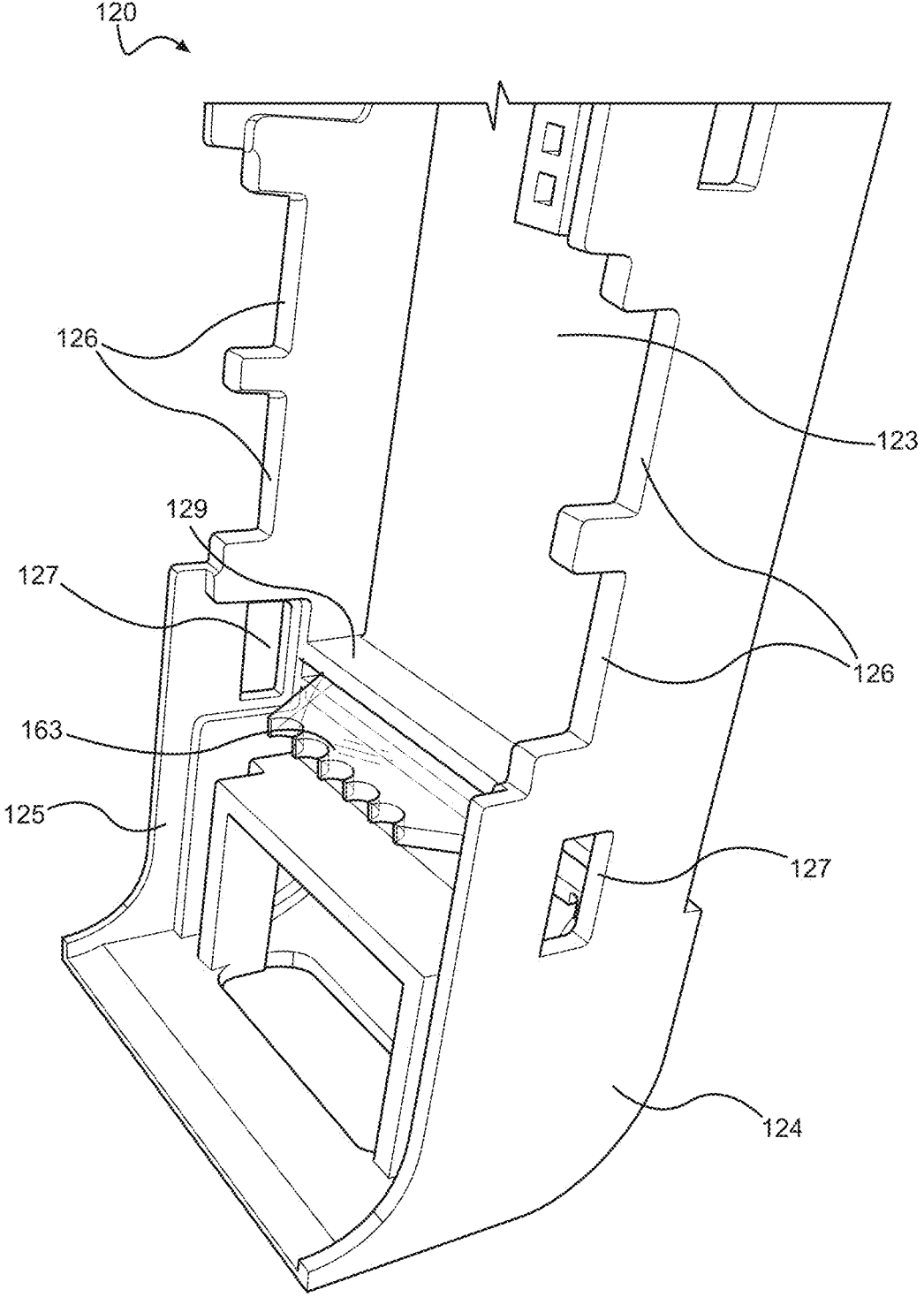
FIG. 7E illustrates in rear perspective view a lower region of the front lid of FIG. 7A according to one embodiment of the present disclosure.

FIG. 7E illustrates in rear perspective view a lower region of front lid 120. As shown, right side portion 125 can have side openings 126 and tab openings 127 that are identical or similar to those on left side portion 124. Light guide 163 can be located at an inner region of front lid 120 proximate the light guide slot, and this light guide can be configured to guide light from multiple light sources within the computing device to front panel 160 coupled to a front surface of front lid 120. For example, light guide 163 can guide light from five separate light emitting diodes located on the first printed circuit board through the light guide slot to an illuminated light bar near the bottom of front panel. Other amounts, types of light sources, and internal light source locations are also possible.

Figure 7F:
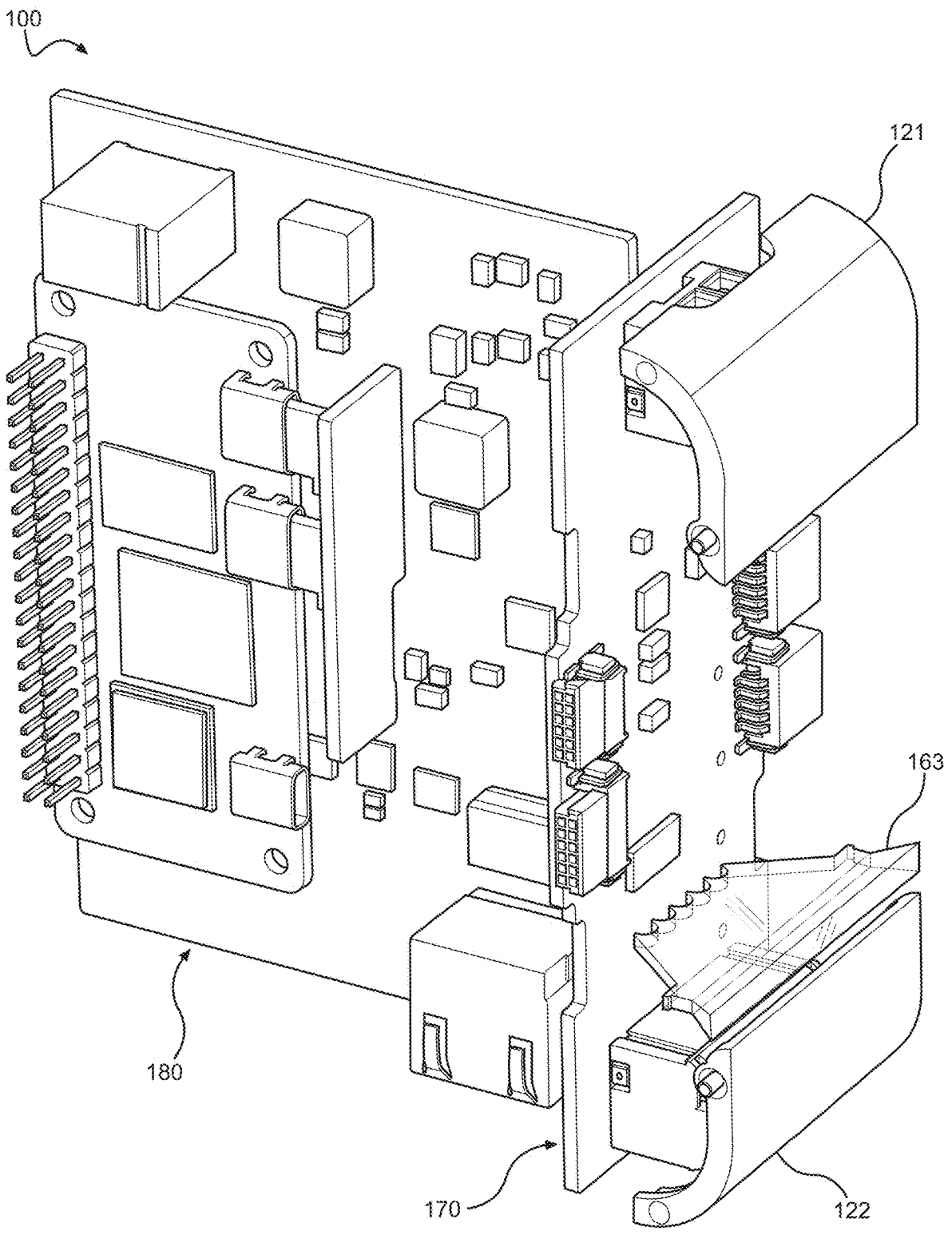
FIG. 7F illustrates in side perspective view internal components of an example computing device with only the hinged doors and light guide of the front lid of FIG. 7A in place according to one embodiment of the present disclosure.

FIG. 7F illustrates in side perspective view various internal components of computing device 100 with a few parts of the front lid shown for purposes of illustration and perspective. In particular, light guide 163 can be arranged such that its back edge is proximate various light sources located on first printed circuit board 170 to guide light from those sources through the light guide slot in the front lid, which slot can reside just above bottom hinged door 122, and to the illuminated light bar near the bottom of the front panel.

Figure 7G:
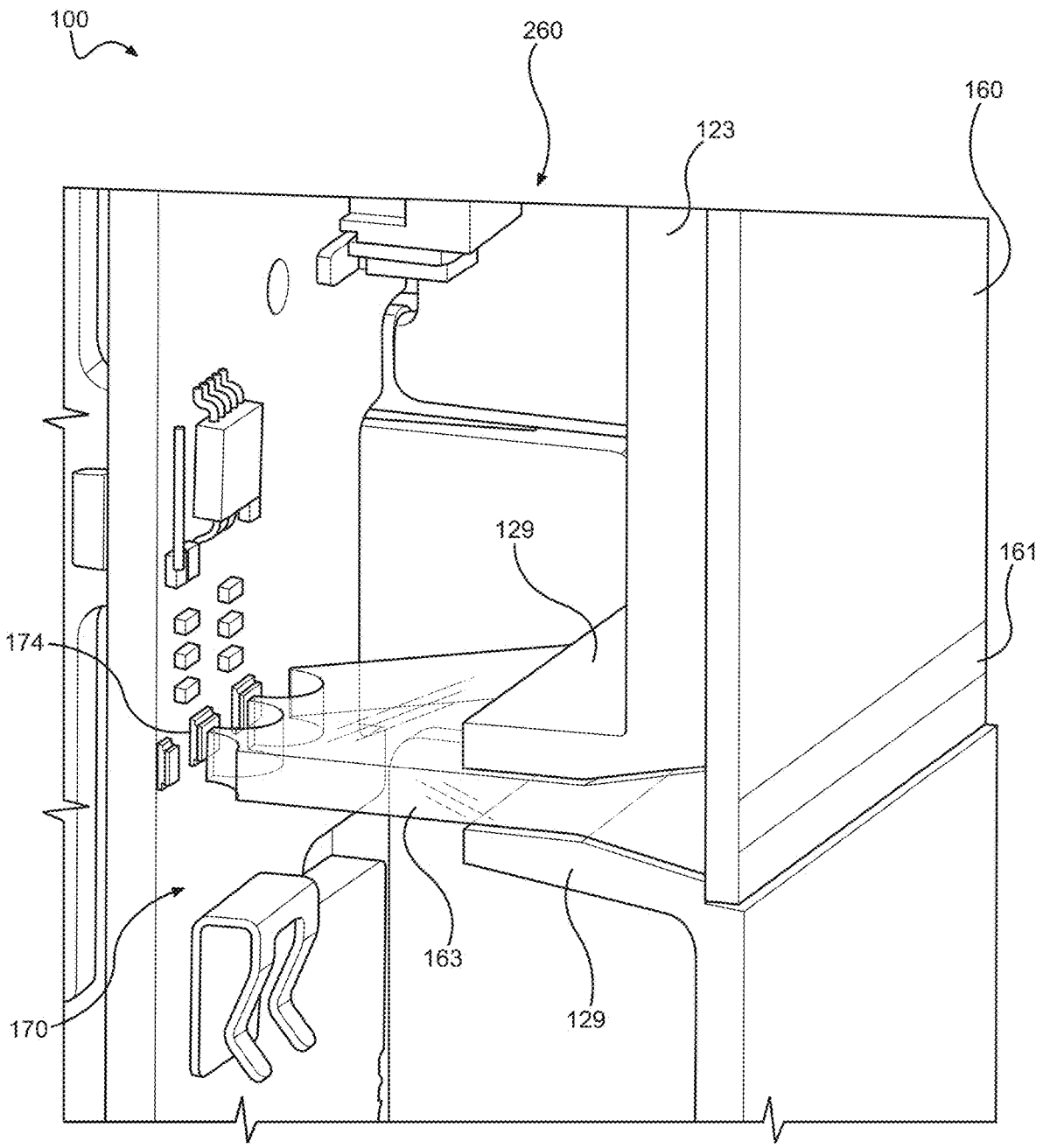
FIG. 7G illustrates in side perspective cross-section view a light guide region of the front lid of FIG. 7A according to one embodiment of the present disclosure.

FIG. 7G illustrates in side perspective cross-section view a light guide region of the front lid. As shown, light guide support arrangement 129 can extend laterally inward from the rear surface of the front lid front portion 123. This light guide support arrangement 129 can be configured to support and hold light guide 163 in place internally within computing device 100 such that light is directed from one or more light sources 174 through the light guide to illuminated light bar 161 at front panel 160. Light sources 174 can include, for example, multiple light emitting diodes located on first printed circuit board 170. Light guide support arrangement 129 can include upper and lower flanges configured to sandwich light guide 163 to hold it in place. As shown, light guide 163 and light guide support arrangement 163 can both define geometries such that the light guide can be inserted into the front of the front lid at its light guide slot but cannot pass all the way through the light guide support arrangement. Affixing front plate 160 to the front surface of front lid front portion 123 can then secure light guide 163 in place such that it cannot move in any direction.

Figure 7H:
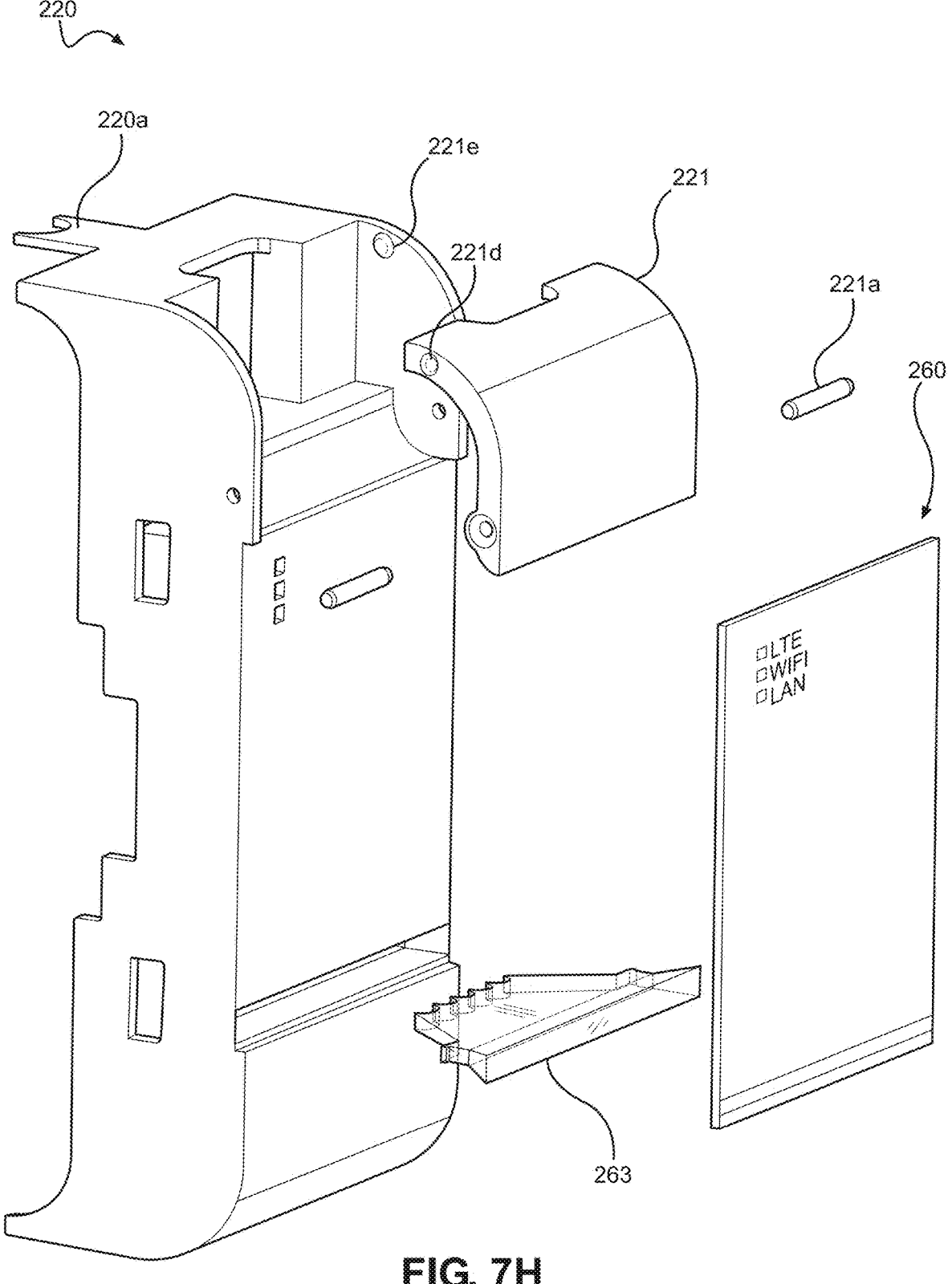
FIG. 7H illustrates in exploded perspective view an example alternative front lid for an alternative modular computing housing assembly in isolation according to one embodiment of the present disclosure.

FIG. 7H illustrates in exploded perspective view an example alternative front lid for an alternative modular computing housing assembly. Similar to enclosure 210 above, front lid 220 can be that which is disclosed above for use with an alternative computing device 200 (e.g., a data receiver). Front lid 220 can be identical in most regards with respect to front lid 120 shown in FIGS. 7A-7G. For example, front lid 220 can have a top hinged door 221 with identical features in the door and front lid arrangement, such as hemispherical protrusions 221d that snap into and out of hemispherical divots 221e. Unlike front lid 120, however, front lid 220 can have only a top hinged door 221 and no bottom hinged door. In addition, a covering extension 220a can extend inward from the top center of front lid 220, with this covering extension 220a being configured to cover an excess front portion of a center slot (219 shown in FIG. 6D) in the enclosure that is not used for a protruding antenna. Other differences between front lid 220 and front lid 120 are also possible, with all such differences still allowing each front lid to conform to a standard form factor. In further alternative arrangements, a different front lid can include a bottom hinged door and no top door, while still another front lid can include no hinged doors.

Next, FIGS. 8A through 8F illustrate an example left side cover for a modular computing housing assembly in various views in isolation and also as coupled to other housing assembly components. It will be readily appreciated that the right side cover can be identical or substantially similar to the left side cover such that some or all of the following features and functionalities of the left side cover can apply equally to the right side cover. Of course, the right side cover can be configured and arranged such that it couples at the right side of the modular computing housing assembly and that some differences can be accounted for with respect to a mirrored arrangement and the need for opposite types of computing port plugs to plug opposite computing ports on the right side of the computing device. Similar to enclosure 110 and front lid 120 above, each of left side cover 130 and right side cover 140 can be integrally formed from a single rigid polycarbonate or thermoplastic material, for example, among other possible suitable materials. Accordingly, left and right side covers 130, 140 can be formed through a customized injection molding process as will be readily understood by those of skill in the art.

Figure 8A:
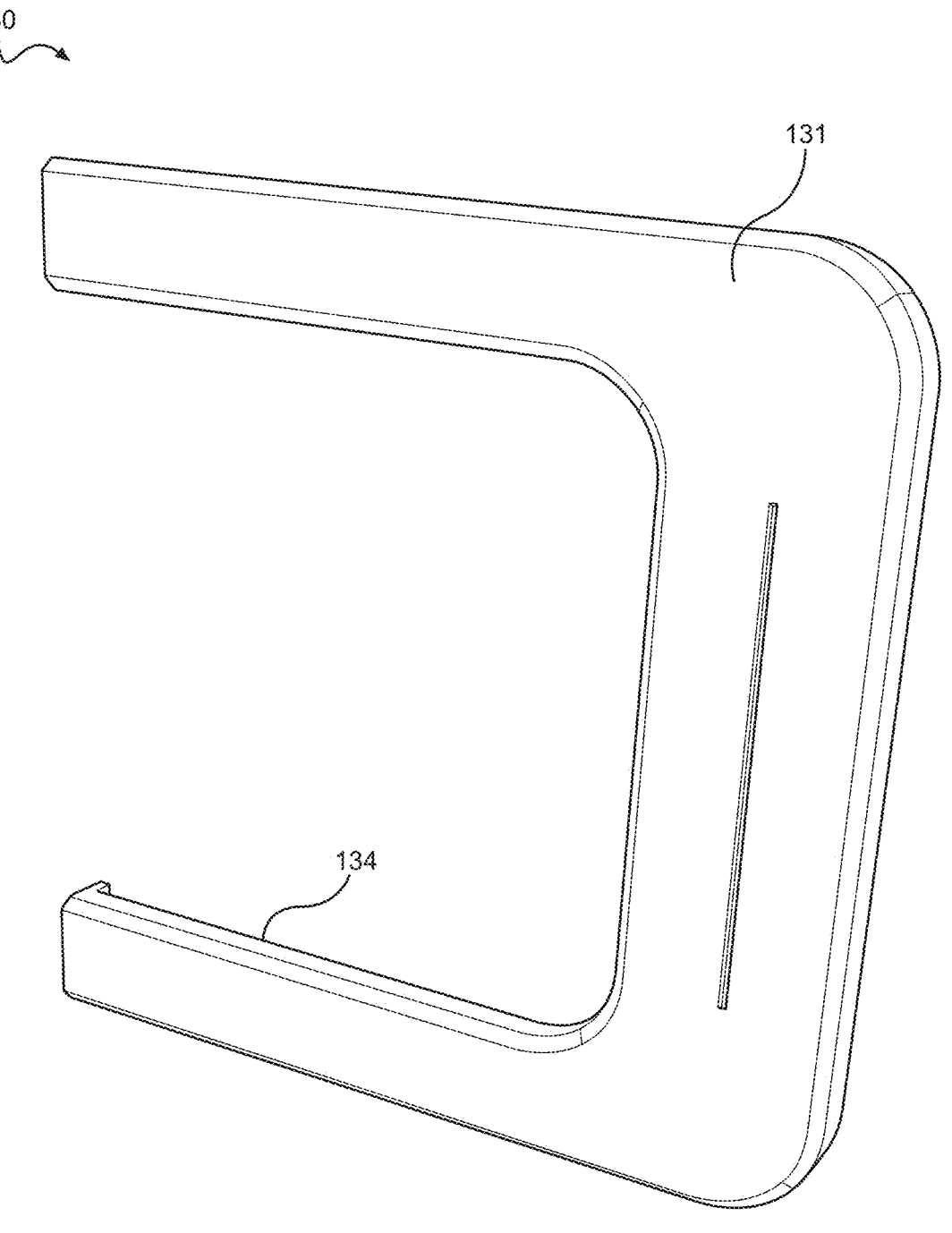
FIG. 8A illustrates in side perspective view an example left side cover for a modular computing housing assembly in isolation according to one embodiment of the present disclosure.
Figure 8B:
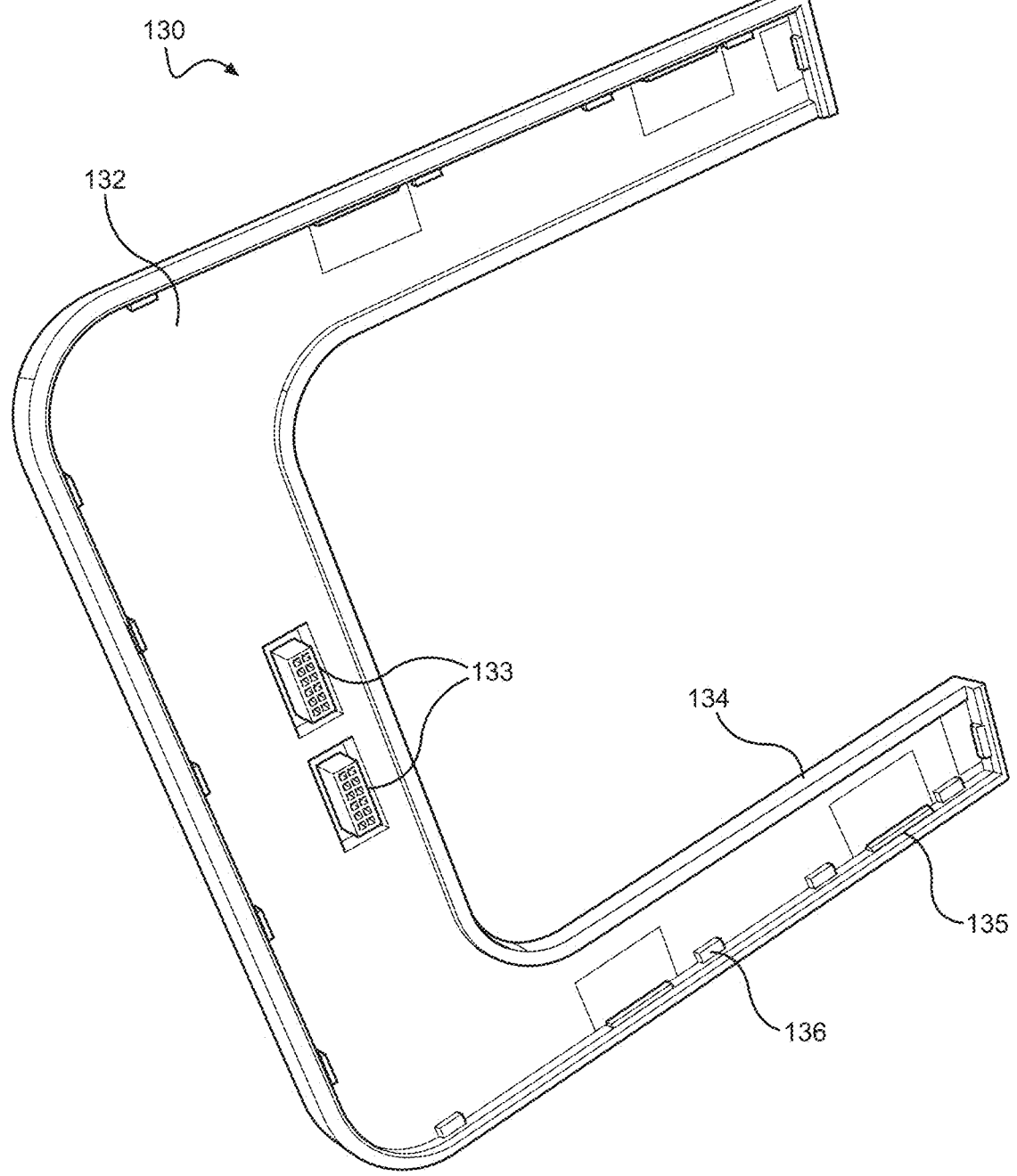
FIG. 8B illustrates in reverse side perspective view the left side cover of FIG. 8A according to one embodiment of the present disclosure.
Figure 8C:
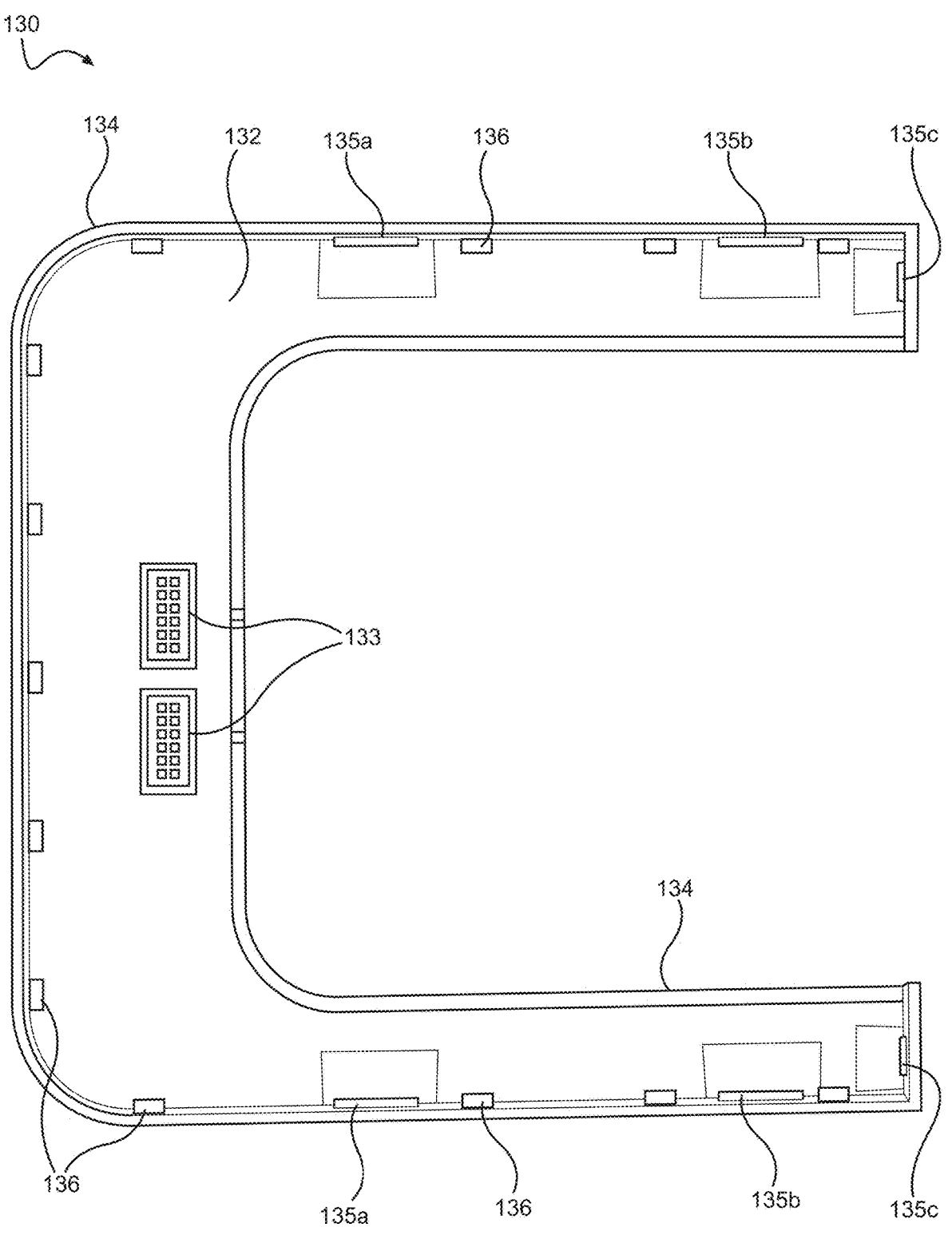
FIG. 8C illustrates in reverse side elevation view the left side cover of FIG. 8A according to one embodiment of the present disclosure.

FIGS. 8A through 8C show the left side cover in isolation in side perspective, reverse side perspective, and reverse side elevation views respectively. Left side cover 130 can be configured to removably couple to one or more computing ports protruding from the left side of the computing device, the left side portion of the front lid, the left side panel of the enclosure, or any combination thereof. Left side cover 130 can be readily assembled to and removed from the left side panel of the enclosure by moving the left side cover orthogonally to and away from the enclosure. Left side cover 130 can generally form a C-shape as shown, and can include outer face 131, inner face 132, one or more computing port plugs 133 extending from the inner face, a thin sidewall 134 extending from the inner face around its outer circumference, a plurality of snap protrusions 135 located along the sidewall, and a plurality of lateral stoppers 136 extending from the inner face proximate the sidewall, among other possible features.

In various arrangements, left side cover 130 can be configured such that it is readily coupled to and removed from the rest of the modular computing housing assembly without the need for tools or difficult assembly or removal techniques. This can be accomplished at least in part by way of multiple strategically designed and located snap protrusions 135 arranged to snap into and out of divots on outer surfaces of the enclosure, the front lid, or both. As noted in greater detail below, such divots can be located on the top, bottom, and back surfaces of the enclosure, for example, such that snap protrusions 135 can protrude from sidewall 134 at various locations along the top, bottom, and back of the inner sidewall. Left side cover 130 can thus have a slightly greater height and depth than the enclosure such that it effectively wraps around and snap locks onto the enclosure along the top, bottom, and back of the enclosure. Where the enclosure is box-shaped with a height of about 10 cm and a depth of about 10 cm as noted above, for example, then left side cover 130 can have a height of about 10.4 cm, a depth of about 10.4 cm, and a width of about 0.7 cm. Of course, other dimensions are also possible.

In some arrangements, the ready coupling and removal of left side cover 130 can also be accomplished at least in part by way of computing port plugs 133 arranged to mate with computing ports extending from the left side of the computing device. Computing port plugs 133 can be sized and shaped to plug a first set of computing ports extending from the left side of the computing device, such as computing ports 162 shown and described above. Computing port plugs 133 can be formed from an inert material that does not conduct power or communications such that plugging the computing ports can serve as a safety function, particularly where the computing ports may be live and may contain a high voltage trace or other hazardous element. In some embodiments, each computing port plug 133 can be specifically designed to match a computing port that it plugs. For example, where a given computing port is a 12-pin male port, then its corresponding computing port plug 133 on left side cover 130 can be a 12-hole female plug. Similarly, where a given computing port is an 18-hole female port, then its corresponding computing port plug 133 can be an 18-pin male plug. Accordingly, a computing port plug 133 can not only cover a computing port to prevent external exposure, but it can also prevent individual pins or leads from contacting each other when the computing port is not in use.

When left side cover 130 is removed from its respective computing device, such removal can unplug computing port plugs 133 from their respective computing ports to expose that set of computing ports, which in turn can facilitate directly plugging the exposed computing ports into a corresponding set of exposed computing ports on a separate computing device when the computing device and the separate computing device are placed side-by-side. In some arrangements, specific or detailed computing port plugs 133 can be replaced by simpler computing port recesses or divots (not shown) along inner face 132 that are configured to accommodate and cover computing ports extending from the left side of the computing device. Such recesses or divots can protect the computing ports from being exposed to external elements when they are not coupled to a separate computing device Sidewall 134 can extend from inner face 132 around some or all of the entire outer circumference of left side cover 130. As noted above, left side cover 130 can be slightly taller and deeper than its corresponding enclosure and front lid. As such, sidewall 134 can extend farther around its far outside circumference where it extends over the top, bottom, front, and back edges of the enclosure and front lid, and can extend less at its inner circumference region where the edge of the sidewall abuts the outer surface of the enclosure left side panel. These varying depths for sidewall 134 are also reflected in FIGS. 8E and 8F below.

Various snap protrusions 135 spaced apart and located along an inner region of sidewall 134 can interact with corresponding divots or other physical features on the enclosure to facilitate a firm coupling of left side cover 130 to the rest of the modular computing housing assembly and overall computing device. Various lateral stoppers 136 spaced apart and located along inner face 132 proximate sidewall 134 can be arranged such that they abut and directly contact the outer surface of the enclosure left side panel to provide increased rigidity, stiffness, and stability for the overall left side cover 130 when it is installed. Although four spaced apart lateral stoppers 136 are shown along each of the inner top, bottom, and front edges of left side cover 130, it will be readily appreciated that more or fewer lateral stoppers can be used.

In some arrangements, some snap protrusions 135 can be larger or smaller than others to facilitate an easier removal or disassembly of left side cover 130 at a specific edge or location. As a nonlimiting example shown for purposes of illustration in FIG. 8C, left side cover 130 can have top and bottom snap protrusions 135*a* closer to the front that are smaller and designed for relatively weaker snap fits with the enclosure, top and bottom snap protrusions 135*b* closer to the rear that are larger and designed for stronger snap fits with the enclosure, and top and bottom snap protrusions 135*c* along the rear edge that are also larger and designed for stronger snap fits with the enclosure. With this arrangement of six varying size snap protrusions 135*a*, 135*b*, 135*c* resulting in varying strength snap fits, left side cover 130 can be manually removed from the enclosure without tools more readily by prying or peeling its front edge away from the enclosure as opposed to any other location of the left side cover. Of course, different amounts, locations, sizes, and configurations of snap protrusions are also possible.

Figure 8D:
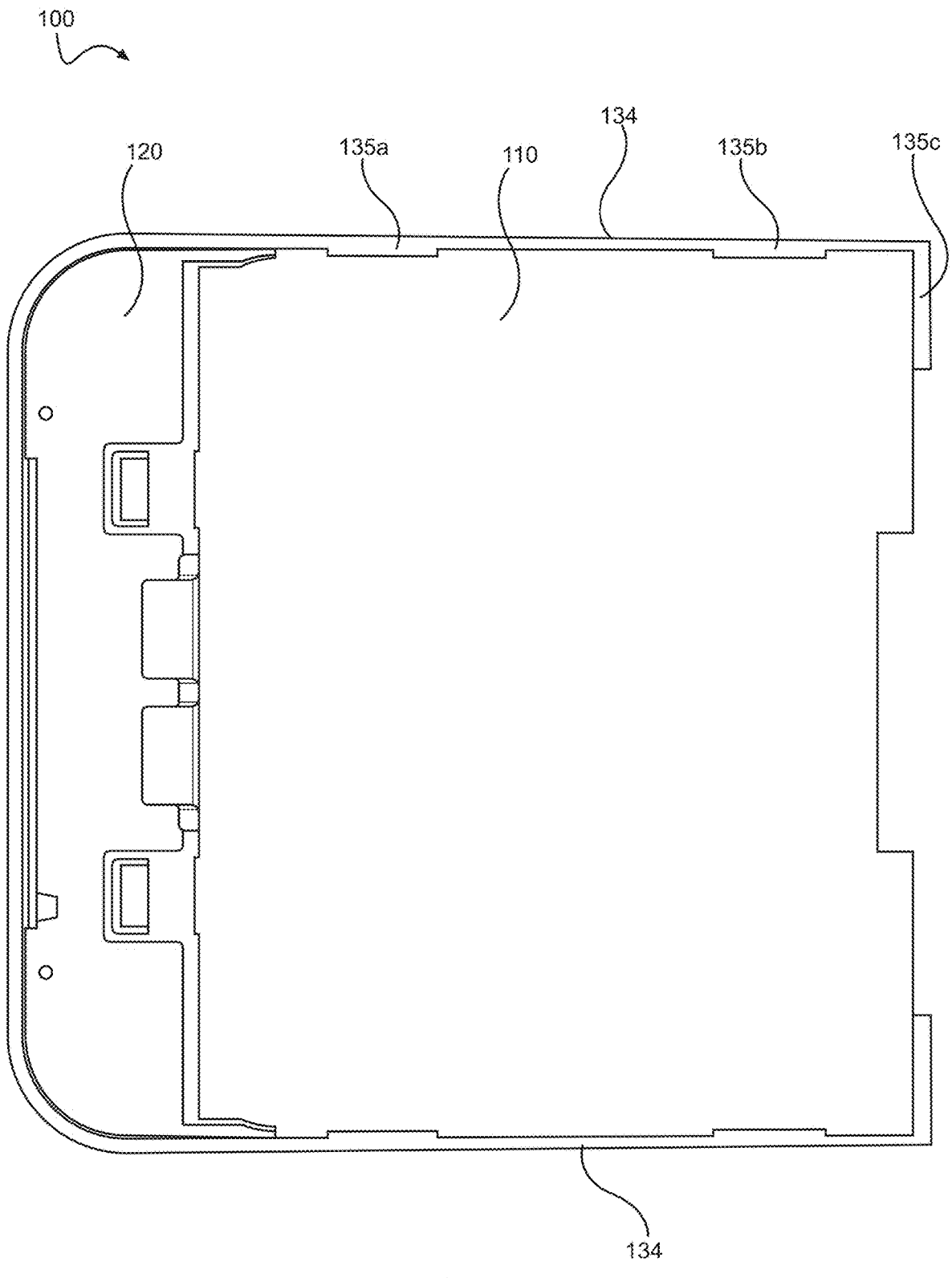
FIG. 8D illustrates in reverse side cross-section view the left side cover of FIG. 8A assembled to the rest of the modular computing housing assembly according to one embodiment of the present disclosure.

FIG. 8D shows the left side cover assembled to the rest of the modular computing housing assembly in reverse side cross-section view. As shown from this inner cross-section view, the outer portion of sidewall 134 of the left side cover can extend around the top, bottom, and rear of enclosure 110 and around the top, bottom, and front edges of front lid 120. Again, snap protrusions 135*a*, 135*b*, 135*c* can snap into and be readily removed from divots along the outer surfaces of enclosure 110 to hold the left side cover in place when installed. In some arrangements, left side cover 130 can be designed such that its sidewall 134 along its top and bottom edges does not extend perfectly orthogonally from its sidewall along its front edge. Rather, sidewall 134 along the top and bottom edges of the left side cover 130 can extend at a slightly tapered angle with respect to the front edge to result in a slight inward inclination from the front to the rear of the left side cover. This can also facilitate tighter snap fits toward the rear of the left side cover and can also result in the ability to have broader dimensional tolerances in the formation of the left side cover without sacrificing part interaction and functionality.

Figure 8E:
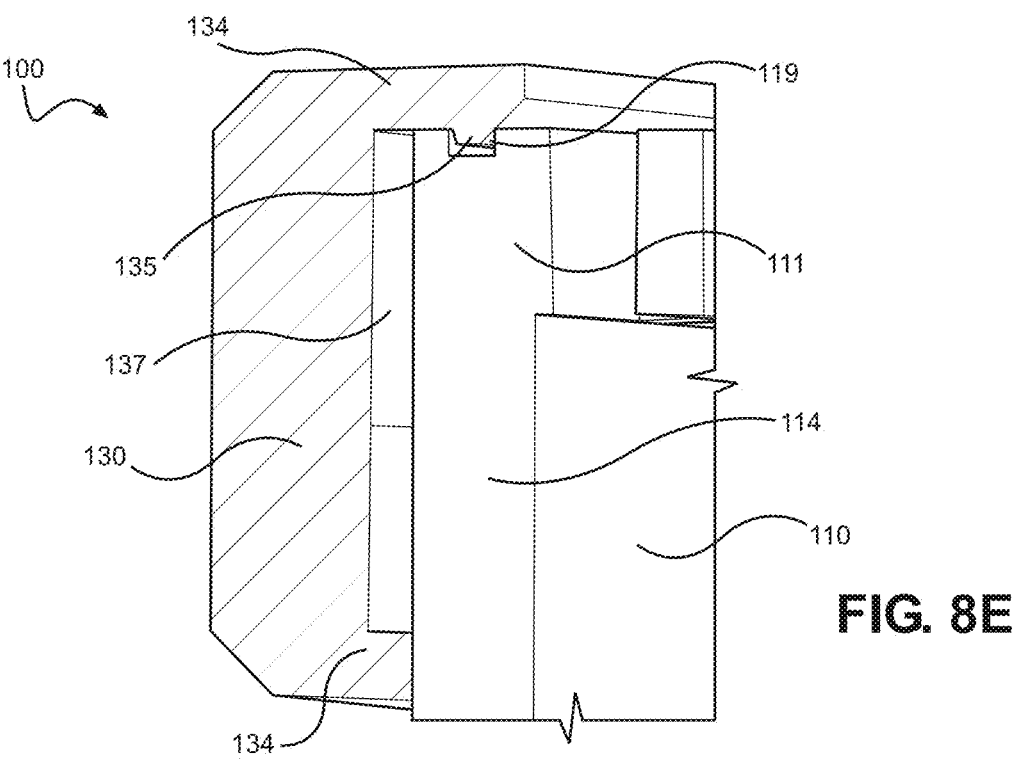
FIG. 8E illustrates in front perspective cross-section view a snap protrusion of the left side cover of FIG. 8A coupled into a divot of the modular computing housing assembly enclosure according to one embodiment of the present disclosure.
Figure 8F:
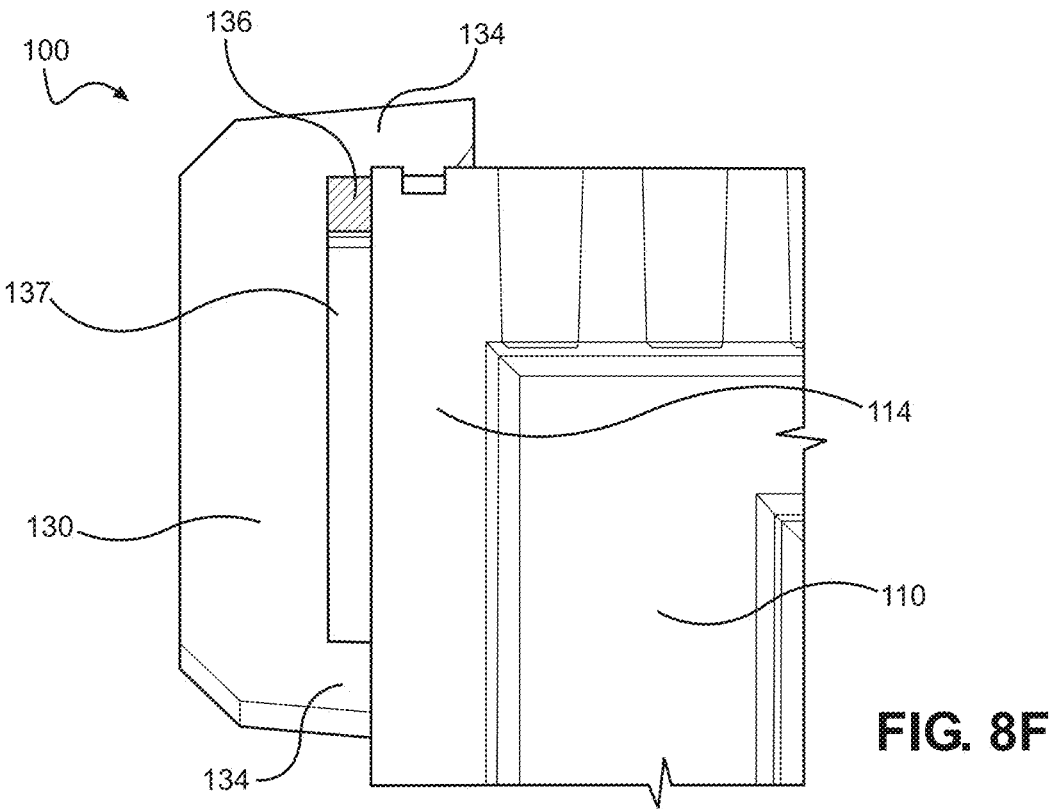
FIG. 8F illustrates in front cross-section view a lateral stopper of the left side cover of FIG. 8A abutting an outer surface of the modular computing housing assembly enclosure according to one embodiment of the present disclosure.

FIG. 8E shows in front perspective cross-section view a snap protrusion of the left side cover coupled into a divot of the modular computing housing assembly enclosure, while FIG. 8F shows in front cross-section view a lateral stopper of the left side cover abutting an outer surface of the modular computing housing assembly enclosure. As shown in FIG. 8E, left side cover 130 can include snap protrusion 135 that extends downward from an inner surface of sidewall 134 and into divot 119 located on an upper surface of top panel 111 of enclosure 110 where the top panel meets left side panel 114. Similar physical arrangements can exist for every snap protrusion 135 to divot 119 coupling along the left side cover to enclosure interface. As shown in FIG. 8F, left side cover can include lateral stopper 136 that extends from its inner face at sidewall 134 to provide structural rigidity by abutting the outer surface of left side panel 114. This can be beneficial since the far outside edge of sidewall 134 extends above and past left side panel 114 such that it does not abut the enclosure for direct contact, while the inner edge of sidewall 134 does abut the outer surface of left side panel 114, as shown in both FIGS. 8E-8F. Where left side cover 130 forms a C-shape, thin sidewall 134 can create a small setoff from the rest of the modular computing housing assembly such that a thin C-shaped gap 137 can be formed between the left side cover and the front lid and enclosure of the modular computing housing assembly.

Again, the various features and functionalities of left side cover 130 can apply equally to right side cover 140, albeit in mirrored fashion for some features or with opposing plugs in the case of the computing port plugs. In addition, the left side cover 230 and right side cover 240 of alternative computing device 200 above can be identical to left and right side covers 130, 140, although various minor differences may be possible.

Figure 9A:
FIG. 9A illustrates in rear perspective view an example mounting arrangement at a rear region of a modular computing housing assembly according to one embodiment of the present disclosure.
Figure 9B:
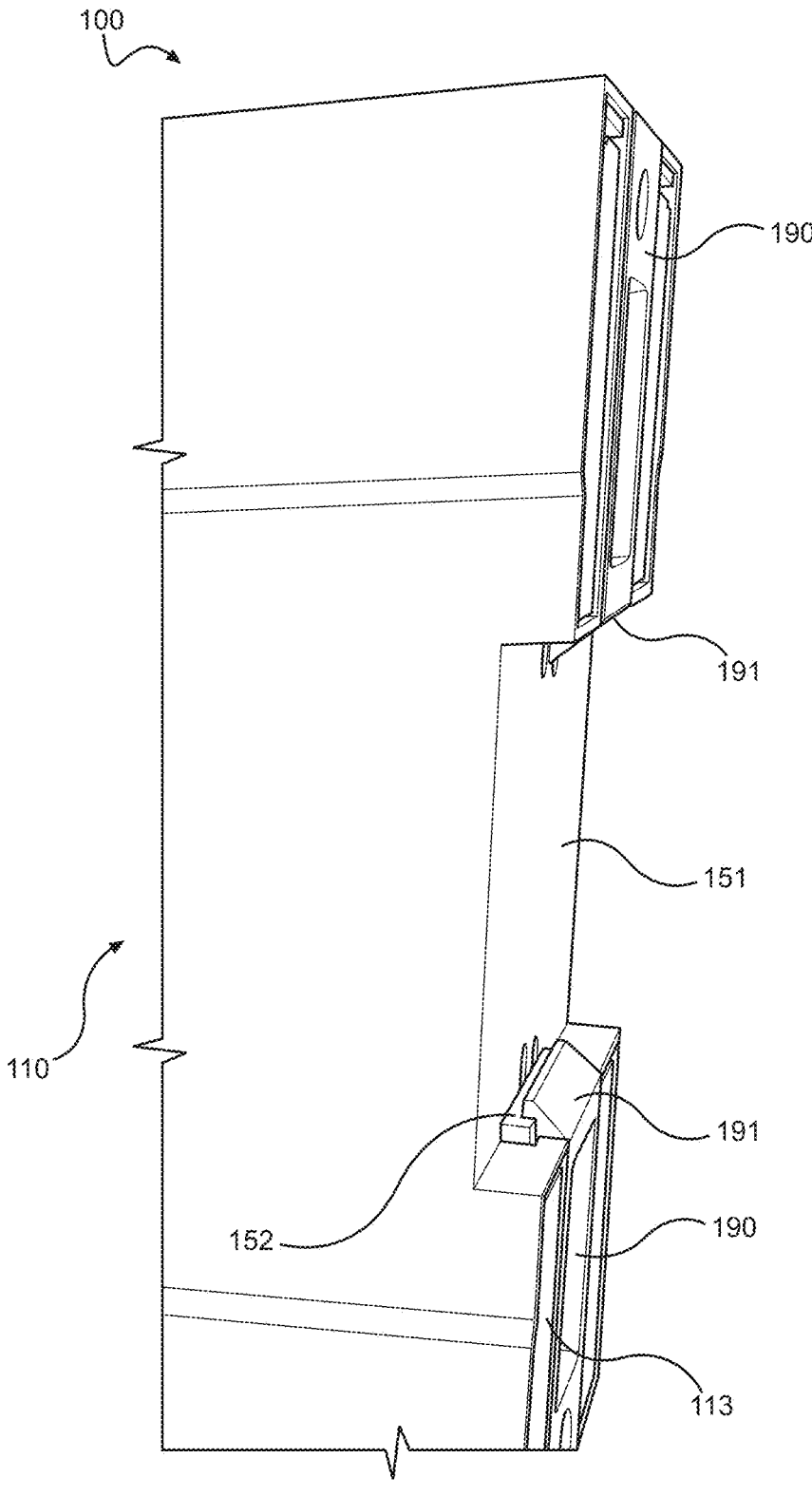
FIG. 9B illustrates in side perspective view the mounting arrangement of FIG. 9A according to one embodiment of the present disclosure.
Figure 9C:
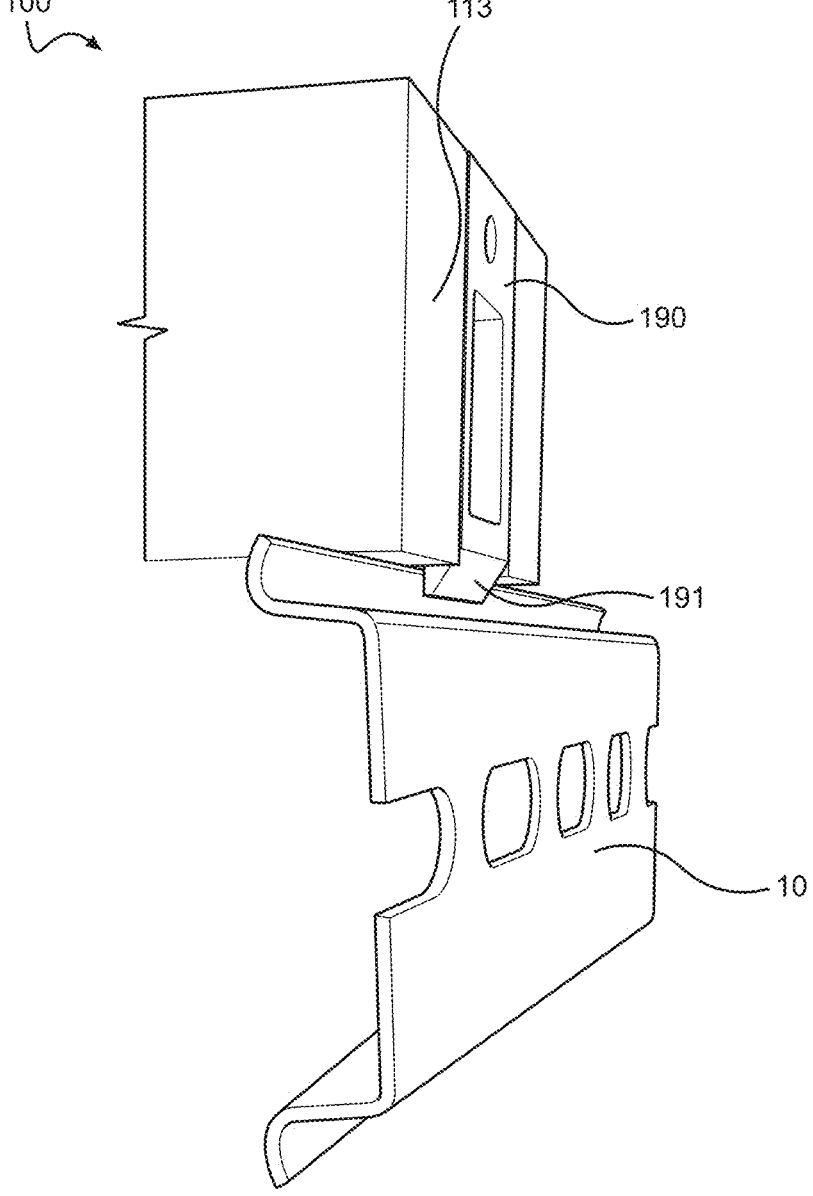
FIG. 9C illustrates in side perspective view the mounting arrangement of FIG. 9A mounted to an external rail according to one embodiment of the present disclosure.

FIGS. 9A-9D illustrate an example mounting arrangement at a back or rear region of a modular computing housing assembly in rear perspective, side perspective, side perspective, and top perspective views respectively, with FIG. 9C showing a portion of the mounting arrangement being mounted to an external din rail. The illustrated spring clip arrangement can be one specific embodiment of mounting arrangement 150 disclosed above, and it will be understood that alternative mounting arrangements are also possible. Mounting arrangement 150, which can specifically be a spring clip arrangement, can generally be located along an outer surface of enclosure 110, such as at back panel 113. As noted above, mounting arrangement 150 can include a recessed region 151 in back panel 113, with this recessed region being located between spring clips 190 or other suitable mounting components positioned at its top and bottom. Recessed region 151 can extend from one side of computing device 100 to its other side and can be configured to accommodate a separate external rail extending therethrough, such as a standard din rail.

Each suitable mounting component can be configured to move between different positions such that pushing mounting arrangement 150 against a separate external rail results in actuating the mounting arrangement to lock onto and mount the entire computing device 100 onto the separate external rail. In the case of a specific spring clip arrangement, mounting components can be bistate spring clips 190 configured to slide between different positions. Each bistate spring clip 190 can slide along a vertical track or grooves formed in back panel 113. Various features and functions specific to a bistate spring clip 190 and associated mounting arrangement features in back panel 113 are provided in greater detail below in FIGS. 11A-11G.

As shown in FIG. 7B, one or both spring clips 190 can have a chamfered front edge 191 that is configured to be pushed against laterally to slide the spring clip from a closed position to an open position. A gap 152 to the surface of back panel 113 at recessed region 151 can exist behind this chamfered front edge 191 to capture a portion of the external rail between a spring clip 190 and the back panel 113 of enclosure 110 after the spring clip opens to pass the rail therethrough and then snaps back to a closed position to lock itself onto the rail. For example, the bottom spring clip 190 in FIG. 9B is shown in a closed position, can be slid downward to an open position when a separate external rail is pushed laterally against its chamfered front edge 191, and can snap back to the closed position to lock the rail in place within gap 152 after the rail pushes past the chamfered front edge. The top spring clip 190 can similarly be pushed against to force it to slide upward to an open position before snapping back downward to a closed position as shown.

FIG. 9C shows an upper portion of a spring clip arrangement mounted to an external rail 10, which can be a standard din rail, for example. Again, spring clip 190 can be configured to slide upward from a closed position to an open position when the mounting arrangement is pushed laterally against external rail 10 such that the rail contacts chamfered front edge 191 to force the spring clip upward. Once external rail 10 moves laterally past chamfered front edge 191, then a spring bias in spring clip 190 can force the spring clip to slide back downward to a closed position to latch or lock the spring clip in place onto the external rail, as shown. Similar actions can take place at the lower portion of the spring clip arrangement (not shown), as will be readily appreciated. Again, each spring clip 190 can be a bistate spring clip configured to operate in multiple disparate states, as detailed below. In some arrangements, a single spring clip can be used for a mounting arrangement, such as where an opposing feature does not move but rather holds an opposing edge of an external rail in place as a single spring clip opens and closes to lock onto an external rail, such as a din rail.

Figure 9D:
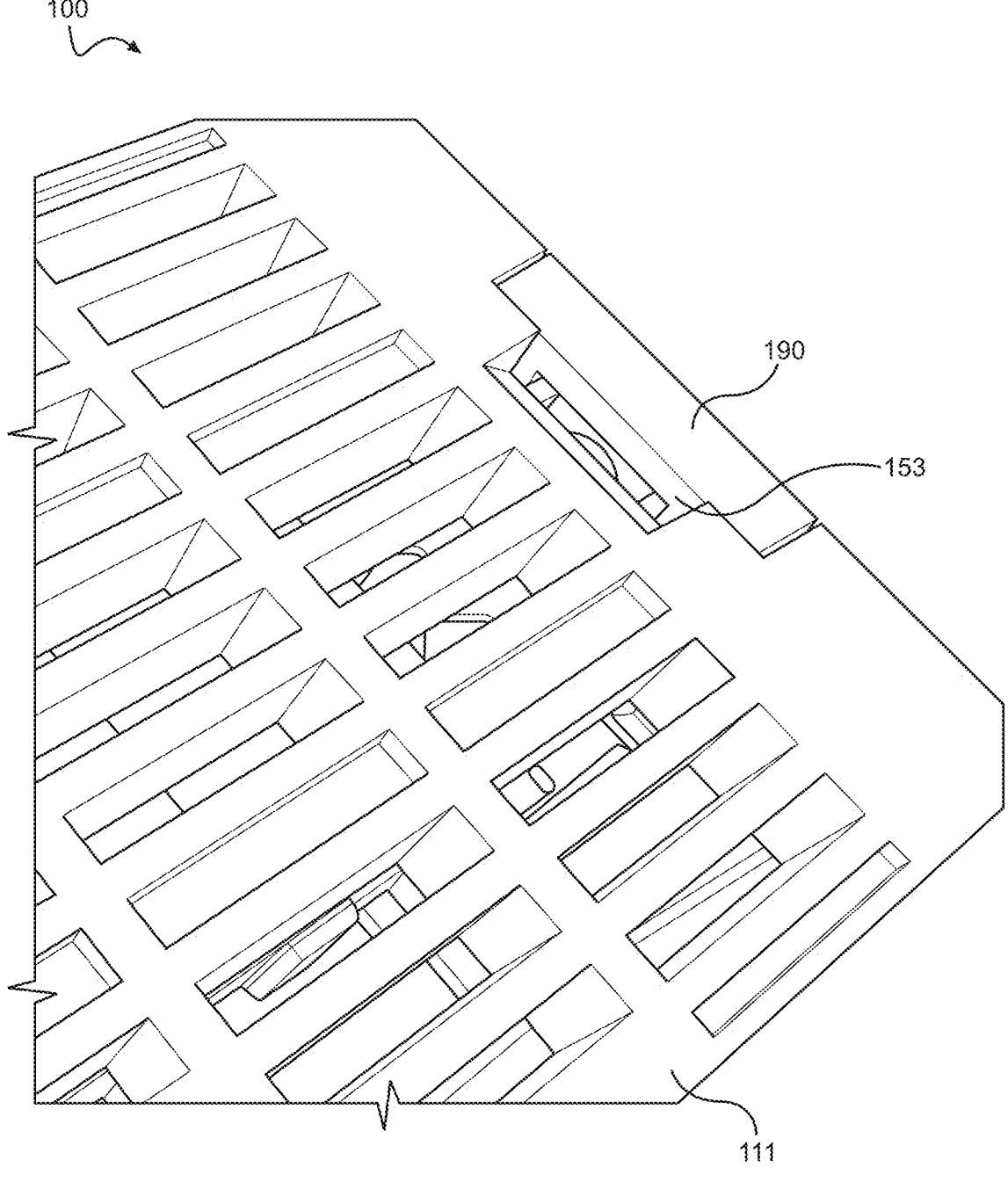
FIG. 9D illustrates in top perspective view the mounting arrangement of FIG. 9A according to one embodiment of the present disclosure.

FIG. 9D shows an upper portion of a mounting arrangement from a top view of a modular computing housing assembly. As shown, spring clip 190 can have a back edge that aligns with an upper surface of top panel 111 of the enclosure. This back edge of spring clip 190 can move above the level of top panel 111 when the spring clip is actuated to or beyond its open position below, such as when the spring clip is transitioned from a first state to a second state. One or more openings 153 or other features in the enclosure proximate this back edge of spring clip 190 can facilitate the use of a tool or other item to manually force the spring clip open in the event that this cannot be readily done to disengage the spring clip from a given external rail when desired. For example, computing device 100 can be mounted to an external rail in a manner such that its back panel is very close to the external rail and a wall or other items proximate the external rail. As such, the lower regions of spring clip 190 may generally be difficult to access or manipulate. A tool or foreign item can then be inserted into opening 153 in top panel 111 of the enclosure to pry behind spring clip 190 to move the spring clip upward and release its clamp or grip on the external rail for device removal.

Figure 10:
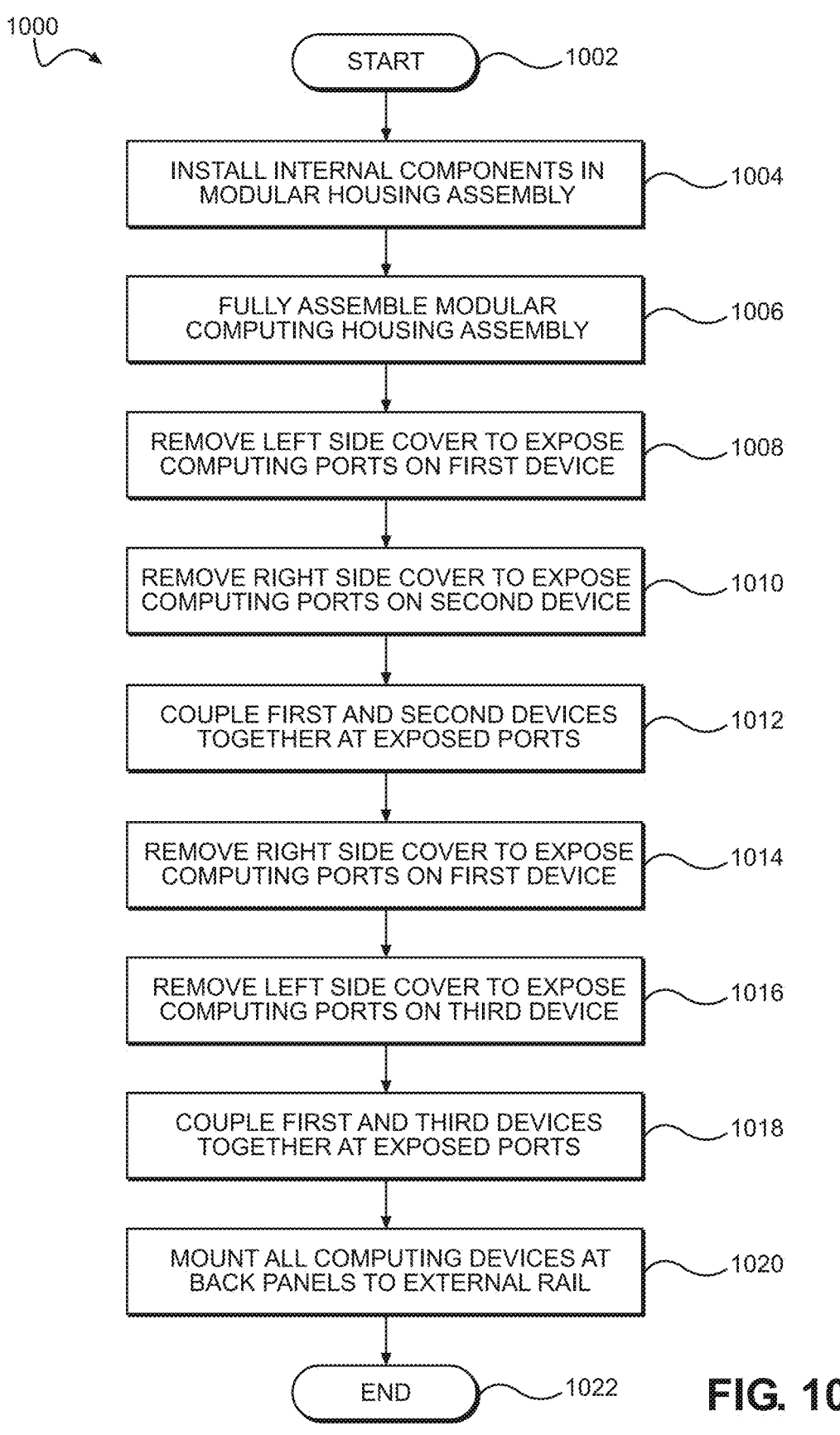
FIG. 10 illustrates a flowchart of an example detailed method of using a modular computing housing assembly according to one embodiment of the present disclosure.

Next, FIG. 10 illustrates a flowchart of an example detailed method of using a modular computing housing assembly. Detailed method 1000 can represent one possible way of using a modular computing housing assembly, and it will be understood that various other steps, features, and details of such a detailed method are not provided here for purposes of simplicity. Detailed method 1000 can include some or all steps and details of summary method 400 above, as will be readily appreciated. While detailed method 1000 contemplates the use of modular computing housing assemblies with data collectors, data receivers, and other related computing devices, for example, it will be readily appreciated that other types of computing devices can also be included or can alternatively be used.

After start step 1002, a first process step 1004 can involve installing internal components within a modular computing housing assembly of a first computing device. This can include, for example, sliding a second printed circuit board into an inner volume of an enclosure and coupling a first printed circuit board to the second printed circuit board to form a T-shaped arrangement, as set forth above, among other possible installation substeps. The first computing device can be a data collector, for example, among other possible computing devices.

At a following process step 1006, the modular computing housing assembly of the first computing device can be fully assembled with the internal components installed therein. This can involve, for example, sliding a front lid onto an enclosure to couple these components together and coupling left and right side covers onto the left and right sides of the modular computing housing assembly, as set forth above, among other possible assembly substeps.

The next process step 1008 can involve removing a left side cover from a left side of the modular computing housing assembly to expose one or more computing ports along a left side of the first computing device. Process step 1008 can be identical or substantially similar to process step 404 above, for example. Subsequent process step 1010 can involve removing a corresponding side cover from a modular computing housing assembly of a second computing device. This can be a right side cover on the right side of the second computing device, for example. Removing the corresponding side cover can expose a corresponding set of computing ports on the second computing device, which can be a data receiver, for example, among other possible computing device types.

At a following process step 1012, the first computing device can be coupled with the second computing device by directly mating, plugging, or otherwise connecting together the first set of exposed computing ports into the corresponding exposed set of computing ports on the second computing device. Process step 1012 can be identical or substantially similar to process step 406 above, for example. Again, this coupling can be a physical and electronic coupling of the devices and can result in the first and second computing devices being arranged side-by-side.

The next process step 1014 can involve removing a right side cover from a right side of the modular computing housing assembly of the first computing device, wherein removing the right side cover unplugs and exposes a second set of computing ports on the right side of the first computing device. At process step 1016, a corresponding left side cover can be removed from a modular computing housing assembly of a third computing device. Removing the corresponding left side cover can expose a corresponding set of computing ports on the third computing device, which can be a power supply unit or input output module, for example, among other computing device types.

Subsequent process step 1018 can involve coupling the first computing device with the third computing device by directly plugging the exposed second set of computing ports on the first computing device into the corresponding exposed set of computing ports on the third computing device. This coupling can result in the first and third computing devices being arranged side-by-side. As such, all three of the first, second, and third computing devices can be physically and electronically coupled together in series and arranged side-by-side, with the first computing device being located between the second and third computing devices.

The next process step 1020 can involve mounting all of the computing devices to an external rail or other suitable mounting item or feature. Process step 1020 can be identical or substantially similar to process step 408 above, for example. Again, mounting can be accomplished by using a spring clip arrangement located along an outer surface of an enclosure back panel of each of the first, second, and third computing devices. Each spring clip arrangement can include multiple bistate spring clips configured to slide between closed and open positions within a first state of the spring clip, such that pushing each spring clip arrangement against the external rail results in actuating the spring clip arrangement to lock onto and mount the entire computing device onto the external rail.

The method can then end at step 1022. For foregoing detailed method 1000, it will be appreciated that not all process steps are necessary, and that other process steps may be added in some arrangements. For example, steps 1004 and 1006 may be unnecessary where the relevant computing devices are already formed and assembled. Steps can also be performed in different orders where practical, and some steps can be performed simultaneously. For example, steps 1014 through 1018 can be performed before steps 1008 through 1012. Although known process steps are provided for the various techniques in detailed method 1000, it will be appreciated that other similar methods for using the disclosed modular computing housing assemblies are also possible. As noted above, each of the different modular computing housing assemblies can be similar in that they all conform to a common form factor requiring at least some identical features and allowing for at least some variable features. Other types of computing devices can also or alternatively be used, and multiple identical computing devices can also be used for detailed method 1000 in some arrangements, as will be readily appreciated.

Lastly, FIGS. 11A through 11G depict a bistate spring clip at various positions as part of a mounting arrangement for a modular computing housing assembly. FIGS. 11A-11G depict portions of a mounting arrangement that can be identical or substantially similar to the mounting arrangement shown in FIGS. 9A-9D, such that these mounting arrangement drawings and descriptions can be equally applied to each other. While only a single top spring clip 190 is shown throughout FIGS. 11A-11G, for example, it will be appreciated that an identical or substantially similar bottom spring clip can also be present in the mounting arrangement shown, with such a bottom spring clip being excluded for purposes of illustration and discussion.

Figure 11A:
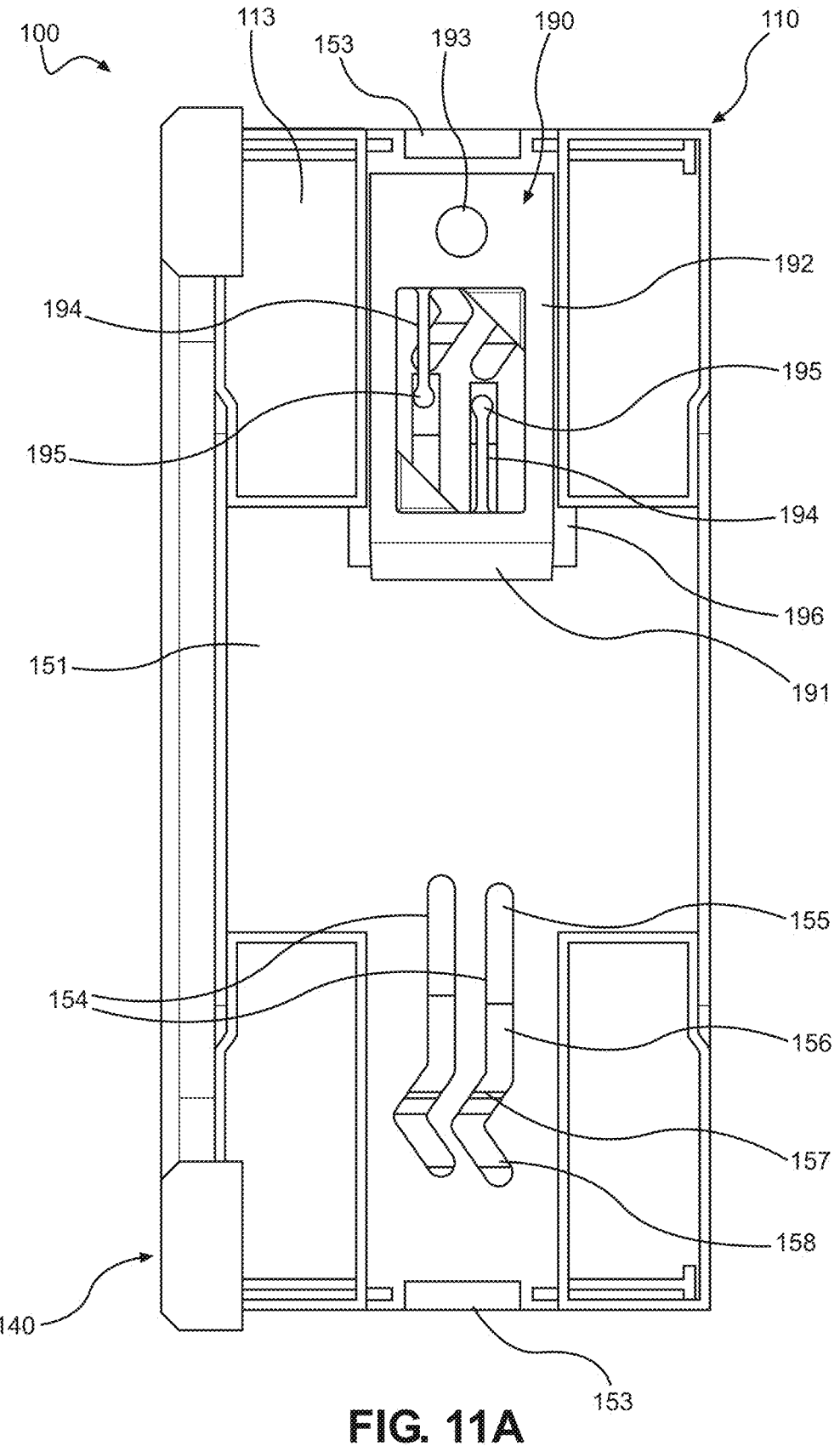
FIG. 11A illustrates in rear elevation view an example mounting arrangement of a modular computing housing assembly using a bistate spring clip according to one embodiment of the present disclosure.
Figure 11B:
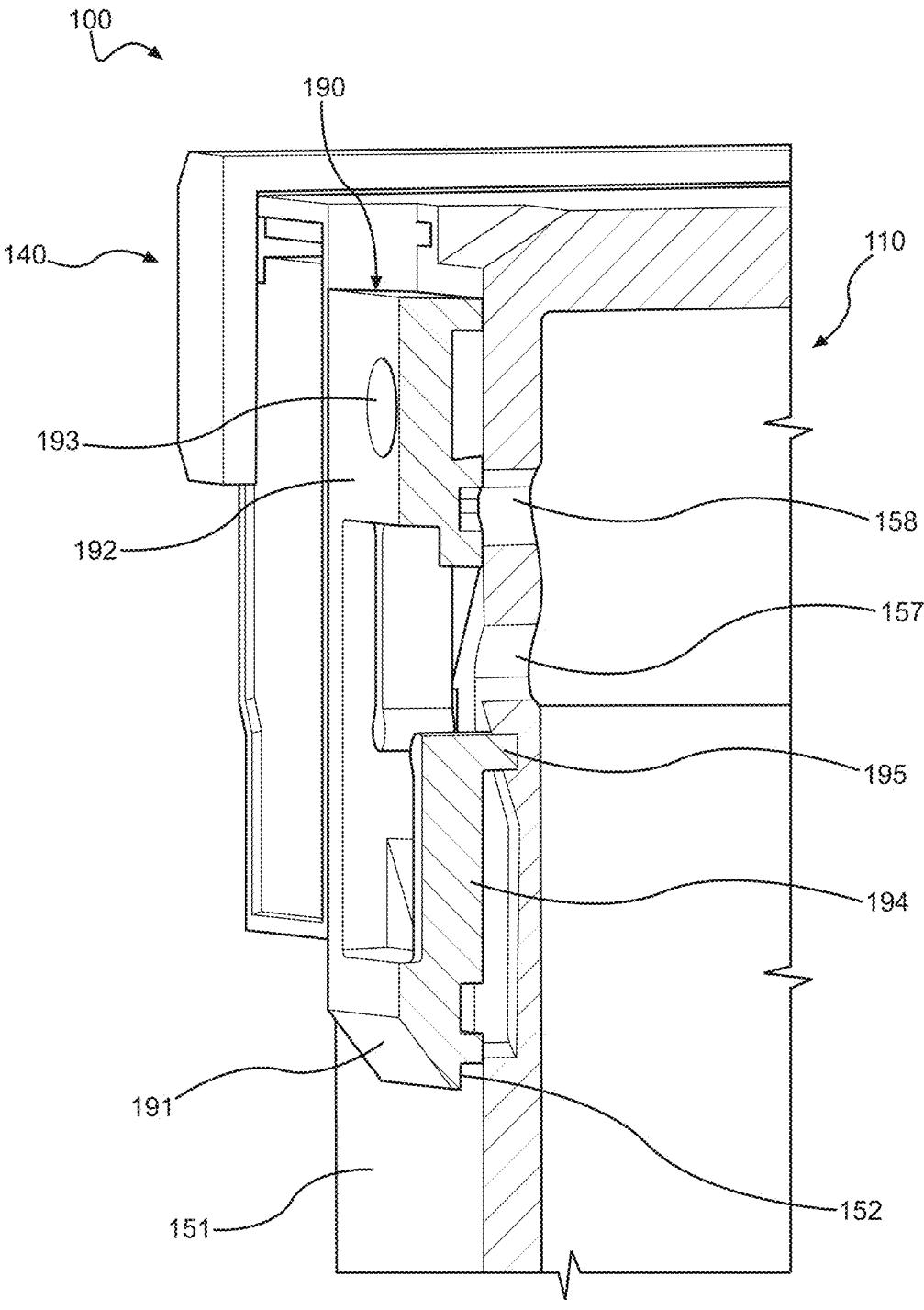
FIG. 11B illustrates in side perspective cross-section view the mounting arrangement of FIG. 11A according to one embodiment of the present disclosure.

FIGS. 11A and 11B illustrate an example mounting arrangement of a modular computing housing assembly using a bistate spring clip in rear elevation and side perspective cross-section views respectively. Bistate spring clip 190 can generally be configured to operate in two separate phases or states. In a first state the bistate spring clip 190 can operate under a first biasing spring force to bias the clip in a forward direction, while in a second state the bistate spring clip can operate under a second biasing spring force to bias the clip an opposite backward direction. The forward direction can involve sliding or otherwise moving the bistate spring clip toward another bistate spring clip or an external rail to grip or clamp onto the external rail, while the backward direction can involve sliding or otherwise moving the bistate spring clip away from the other bistate spring clip or external rail. Various advantages can be realized by using one or more bistate spring clips within an overall mounting arrangement. For example, the disclosed bistate spring clips can be configured to clamp or grip more tightly and securely onto an external rail such that rail locks and other similar devices are unnecessary.

As another advantage, operating the bistate spring clips in the first state can facilitate mounting the computing device to an external rail by moving the spring clips toward each other to grip or clamp onto the external rail, while operating the bistate spring clips in the second state can facilitate mounting the computing device to a wall or other component by moving the spring clips away from each other such that an outer region of each spring clip is exposed to allow for mounting by another approach. Such other approach can include, for example, inserting screws, nails, or other items through openings or other mounting features in the bistate spring clips that become exposed when the bistate spring clips move away from each other while operating in the second state.

As shown in FIG. 11A, a first bistate spring clip 190 can be located at a top region of enclosure back panel 113 above recessed region 151. Again, a second bistate spring clip (not shown) can be located opposite first bistate spring clip 190 at a bottom region of enclosure back panel 113 below recessed region 151. First and second bistate spring clips 190 can be identical to each other with identical functionalities but can be placed in a mirrored arrangement such that they move toward each other or away from each other depending on the spring clip state. Each bistate spring clip 190 can be configured to move or slide along one or more tracks 154 formed into back panel 113 of the enclosure of computing device 100.

Each bistate spring clip 190 can include a chamfered front edge 191 located at a front portion of a main component 192, a mounting feature 193 located proximate a rear edge portion of the main component, one or more elongated spring members 194 coupled to and extending away from the main component, a protrusion 195 coupled to and extending away from each elongated spring member into a track 154, and one or more lateral ribs 196 protruding from outer edges of the main component. Although two opposing elongated spring members 194 are shown as being implemented for a given bistate spring clip 190, it will be appreciated that only one elongated spring member or more elongated spring members can alternatively be used.

Each elongated spring member 194 can be coupled at a proximal end to main component 192 and can extend to a distal end opposite the proximal end. Each protrusion 195 can be coupled to the distal end of an elongated spring member 194 and can extend into one track 154 located along a mounting outer surface of a modular computing housing assembly enclosure, such as enclosure back panel 113. Each protrusion 195 can be cylindrically shaped and can extend from an elongated spring member distal end in a direction that is orthogonal to the extension direction of the elongated spring member. Each track 154 can be configured to force a respective protrusion 195 to move in different directions as the protrusion travels along the track. Moving a protrusion 195 in different directions can cause the elongated spring member distal end coupled to the protrusion to correspondingly move in different directions.

In various arrangements, each elongated spring member 194 can be sized, shaped, and formed from a suitably stiff material such that the spring member is predisposed to spring back to its original position when its distal end is moved laterally to bend or bow the spring member. Each protrusion 195 can be integrally formed with a respective elongated spring member 194 such that moving the protrusion along its respective track 154 will move the protrusion laterally to one side or the other side according to the track and thus correspondingly push the elongated spring member distal end laterally to the same side or the other side. In some arrangements, an entire bistate spring clip 190 can be integrally formed from the same stiff or rigid polycarbonate or thermoplastic material, for example, among other possible suitable materials, and can be formed through a customized injection molding process as will be readily understood by those of skill in the art.

Each elongated spring member 194 can be configured to impart at least a portion of a first biasing spring force onto main component 192 when its distal end is moved in a first spring member direction and to impart at least a portion of a second biasing spring force onto the main component when its distal end is moved in a second spring member direction different than the first spring member direction. For example, when distal ends of elongated spring members 194 as shown in FIG. 11A are pushed sideways due to movement along their respective tracks 154, then the biasing spring forces formed in the elongated spring members bias main component 192 and overall bistate spring clip 190 to move in direction along the respective tracks that will return the elongated spring members to their original states.

In some arrangements, main component 192 can define a flat frame having outer edges and an open central region having inner edges, as shown in FIG. 11A. First and second elongated spring members 194 can extend from opposing inner edges of the flat frame toward each other within the open central region. Using multiple elongated spring members 194 can serve to reduce overall stresses on a single spring member, can provide overall balance in a cumulative biasing spring force, and can provide redundancy in the event that one of the spring members fails or is weakened over many use cycles.

Each track 154 can be formed within back panel 113 or any other suitable mounting component working in conjunction with one or more bistate spring clips 190. Each track 154 can include an install region 155 with a ramped portion 156, a first region 157 that causes the bistate spring clip 190 to operate in the first state, and a second region 158 that causes the bistate spring clip to operate in the second state. Operating in the first state results from creating a first biasing spring force by pushing a protrusion 195 sideways when the protrusion is within first region 157. Operating in the second state results from creating a second biasing spring force by pushing that same protrusion 195 sideways when the protrusion is within second region 158.

As can be seen from the geometry of each track 154, when protrusion 195 is within first region 157 of the track, the spring force of the corresponding bowed elongated spring member 194 will tend to push the protrusion towards the straight portion of the track such that main component 192 is moved toward the center of recessed region 151 (e.g., both spring clips move toward each other). Bistate spring clips 190 thus operate in their first state when their protrusions 195 are located within first regions 157 of tracks 154. As can similarly be seen from track geometries, when a given protrusion 195 is within second region 158 of a track 154, then the spring force of the corresponding bowed elongated spring member 194 will tend to push the protrusion away from the straight portion of the track such that main component 192 is moved away from the center of recessed region 151 (e.g., both spring clips move away from each other). Bistate spring clips 190 thus operate in their second state when their protrusions 195 are located within second regions 157 of tracks 154.

In various embodiments, bistate spring clip 190 can be manually pushed to overcome any biasing spring force to slide or otherwise move the bistate spring clip from one state to the other state. For example, manually pushing bistate spring clip 190 upward as shown in FIG. 11A can result in moving this spring clip from its first state to its second state. Again, moving bistate spring clip 190 into its second state can result in mounting feature 193 rising above a top edge of enclosure back panel 113 such that this mounting feature can be used to nail, screw, or otherwise fasten bistate spring clip 190 to an external wall or other external item such that the entire computing device 100 can be mounted to the external wall or item.

Figure 11C:
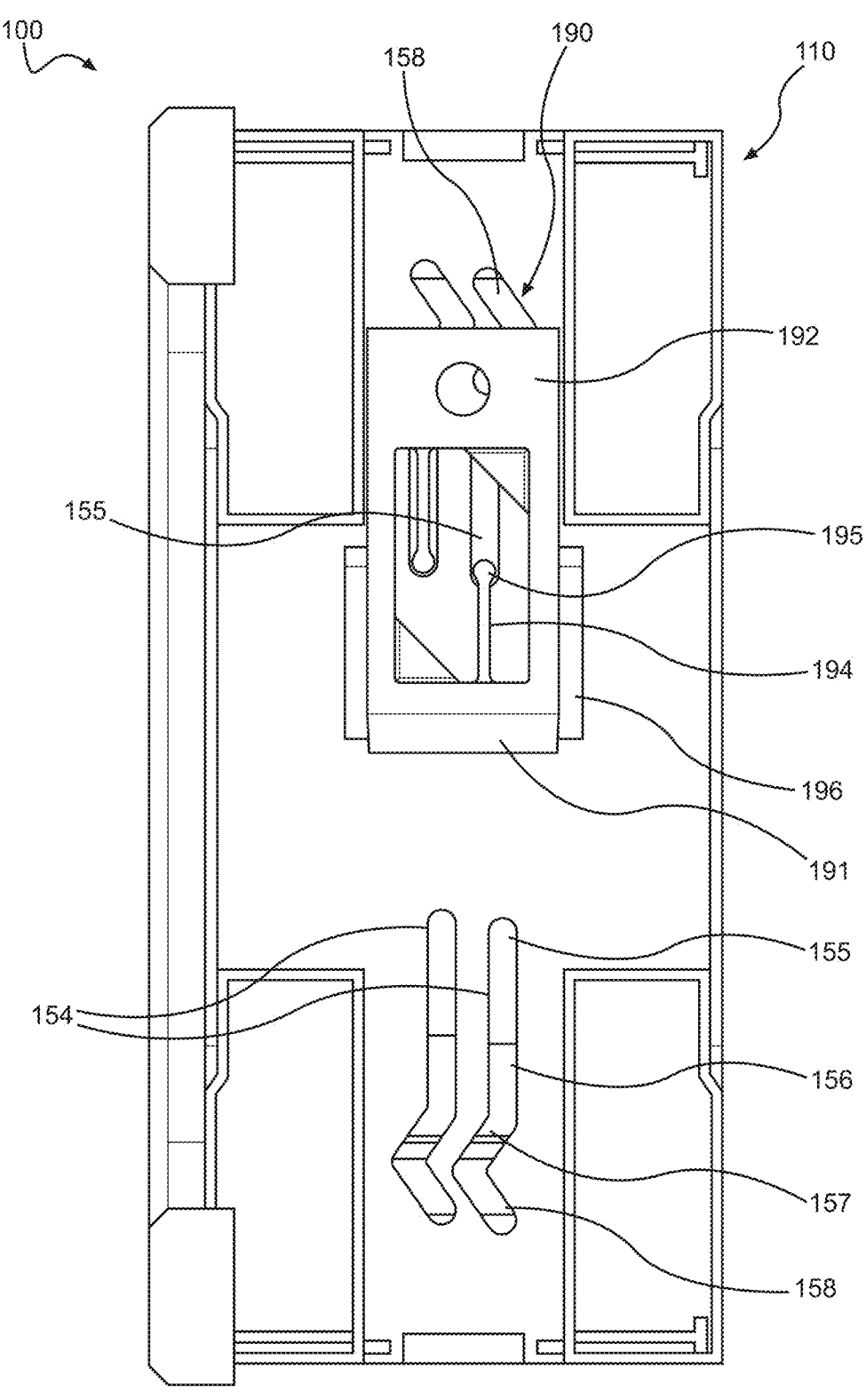
FIG. 11C illustrates in rear elevation view the mounting arrangement of FIG. 11A with the bistate spring clip in a pre-assembly position according to one embodiment of the present disclosure.
Figure 11D:
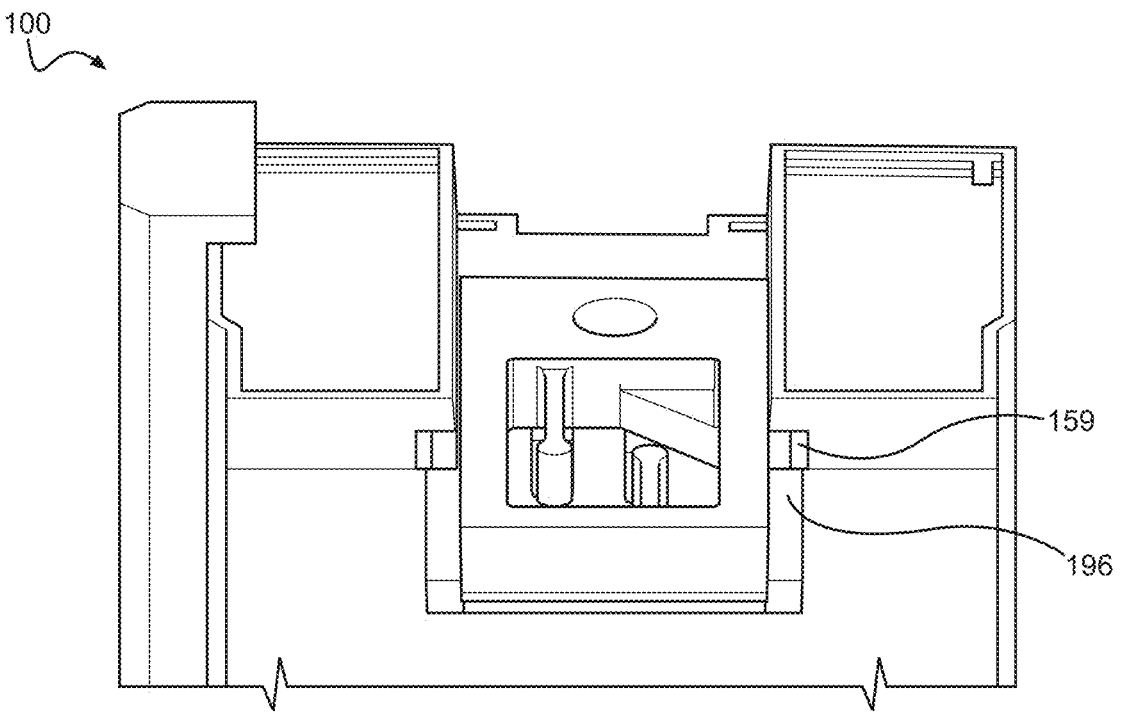
FIG. 11D illustrates in bottom perspective view the mounting arrangement of FIG. 11C with the bistate spring clip in the pre-assembly position according to one embodiment of the present disclosure.

FIGS. 11C and 11D illustrate the same mounting arrangement with the bistate spring clip in a pre-assembly position in rear elevation and bottom perspective views respectively. In various arrangements, a bistate spring clip 190 can be installed to enclosure back panel 113 such that the bistate spring clip is not readily removable. FIGS. 11C and 11D reflect an initial stage of assembly where bistate spring clip 190 is positioned to be installed within tracks 154 and grooves 159 located along a mounting outer surface of the enclosure, such as enclosure back panel 113. Lateral ribs 196 can protrude from opposite outer edges of main component 192 and can engage with grooves 159 located along the mounting outer surface of the enclosure to facilitate movement of bistate spring clip 190. Protrusions 195 can extend into tracks 154 formed in the mounting outer surface of the enclosure to also facilitate spring clip movement. In some arrangements, protrusions 195 cannot be readily removed from the portion of track 154 including only first region 157 and second region 158 once the protrusions are installed to that specific portion of the track.

Figure 11E:
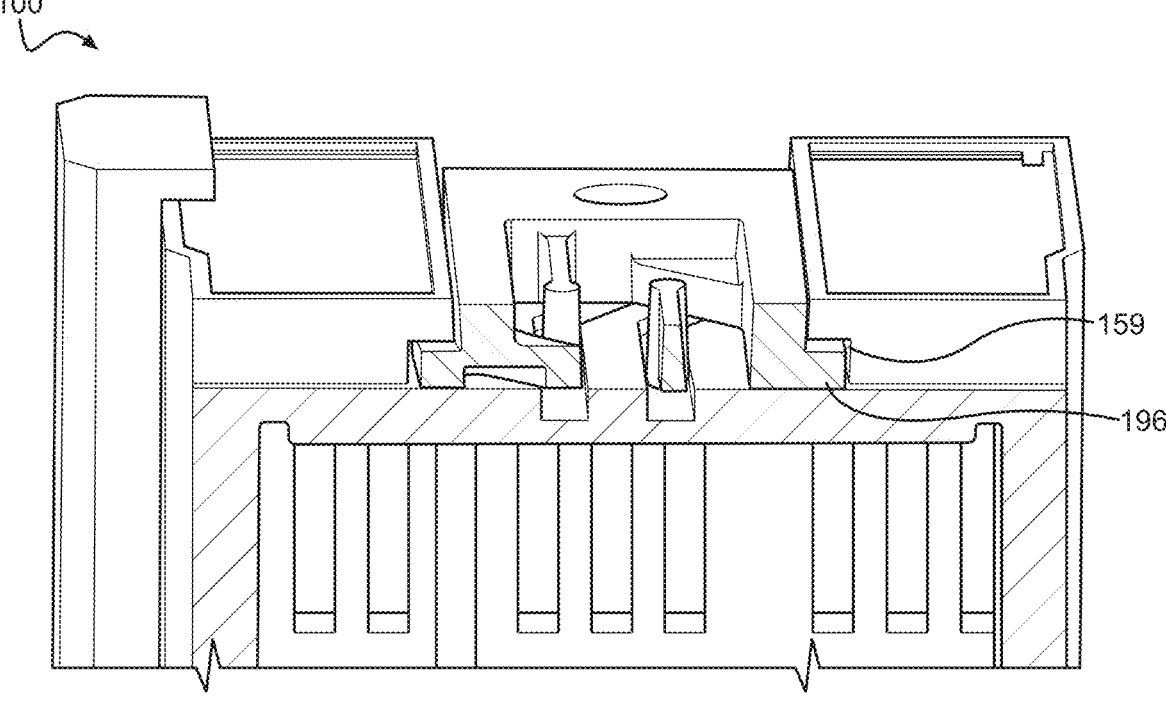
FIG. 11E illustrates in bottom perspective cross-section view the mounting arrangement of FIG. 11D with the bistate spring clip in an assembled position according to one embodiment of the present disclosure.

FIG. 11E illustrates in bottom perspective cross-section view the same mounting arrangement with the bistate spring clip in an assembled position. As shown, lateral ribs 196 of the bistate spring clip can be inserted into grooves 159 formed within the enclosure back panel to allow the bistate spring clip to slide laterally up and down as detailed above and to hold the bistate spring clip within this lateral range of motion. The geometry of a track 154 can prevent a corresponding protrusion 195 from readily escaping from the track once the protrusion has entered the portion of track including only first region 157 and second region 158. In some arrangements, this can involve first region 157 and second region 158 extending deeply into mounting outer surface, such as all the way through enclosure back panel 113.

Figure 11F:
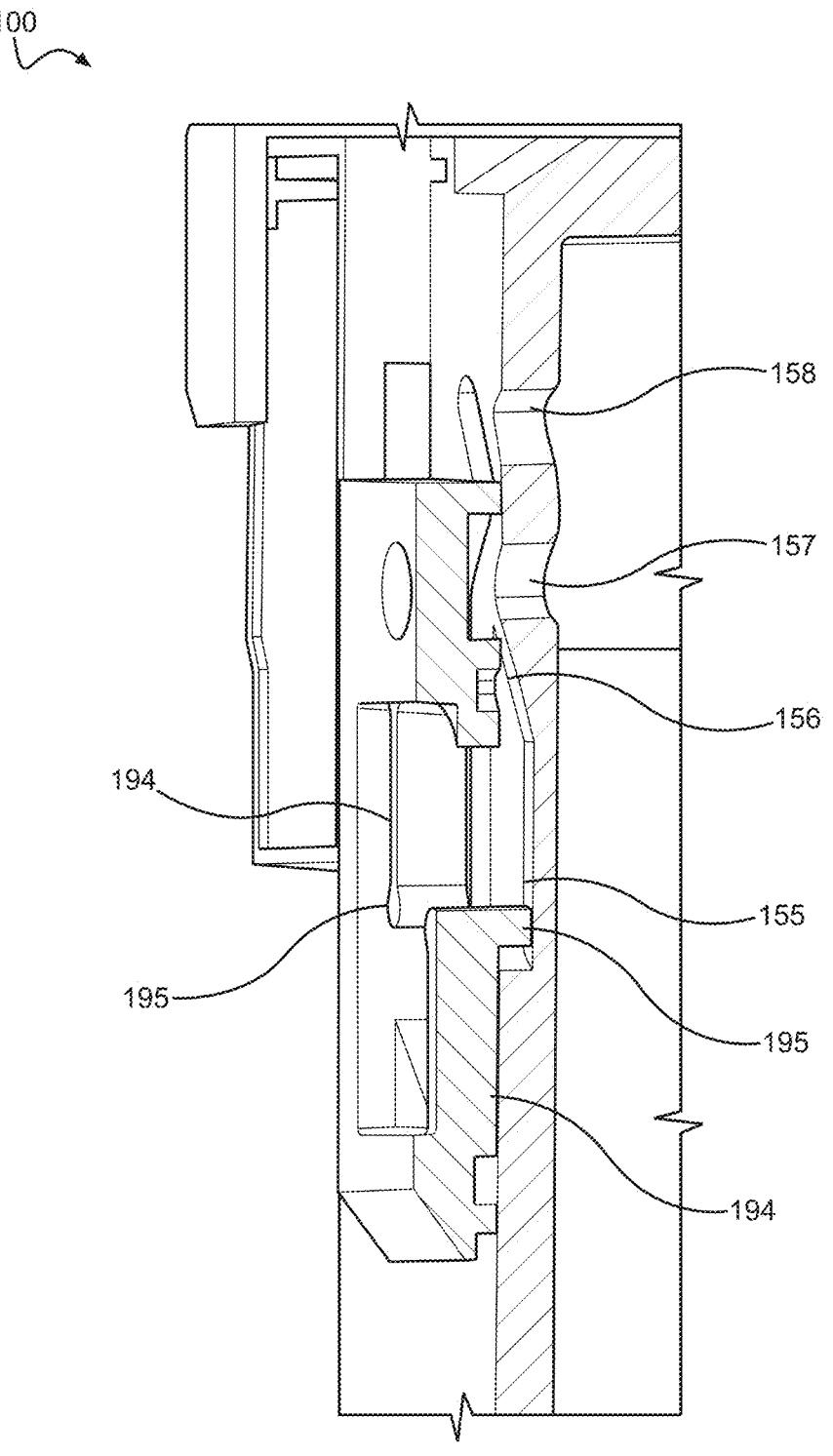
FIG. 11F illustrates in side perspective cross-section view the mounting arrangement of FIG. 11A with the bistate spring clip in the pre-assembly position according to one embodiment of the present disclosure.
Figure 11G:
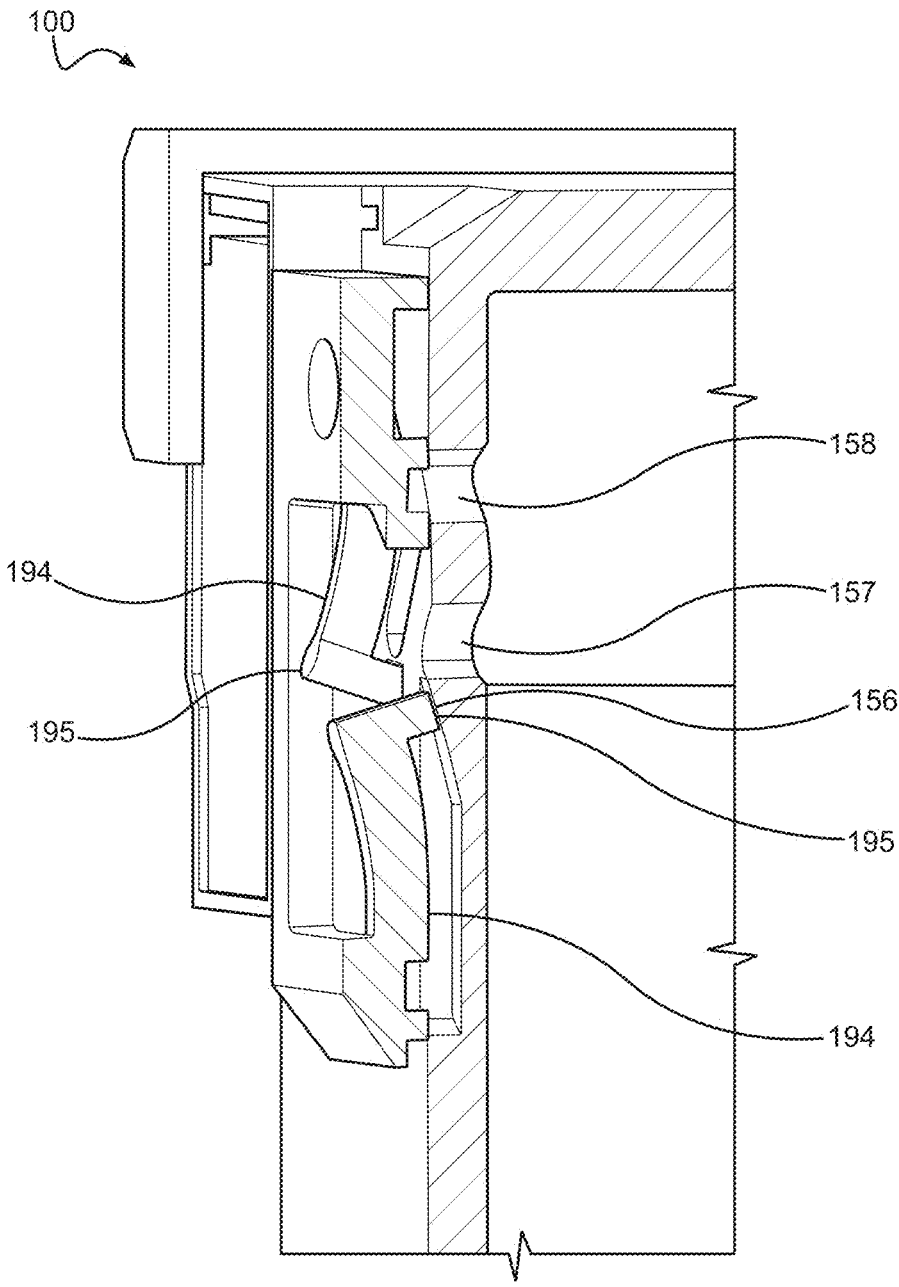
FIG. 11G illustrates in side perspective cross-section view the mounting arrangement of FIG. 11F with the bistate spring clip transitioning to the assembled position according to one embodiment of the present disclosure.

FIGS. 11F and 11G illustrate in side perspective cross-section views the same mounting arrangement with the bistate spring clip in the pre-assembly position and with the bistate spring clip transitioning to the assembled position respectively. In various embodiments, install region 155 of each track 154 can have a shallower depth into the mounting outer surface than first region 157 and second region 158. During installation, a bottom distal surface of each protrusion 195 can be guided into an install region 155 of a track, and the overall bistate spring clip 190 can then be moved laterally in the direction of track first and second regions 157, 158. This can result in protrusion 195 traveling along the length of track install region 155 and up its ramped portion 156, which can push the bottom distal surface of the protrusion upward and thus cause the corresponding elongated spring member 194 to bend or bow upward. This process is reflected in FIG. 11G, where protrusions 195 are at ramped portions 156 of tracks 154 during installation of bistate spring clip 190. Once protrusions 195 pass the increasingly shallow ramped portions 156 and enter the much deeper first regions 157 of their respective tracks 154, then the protrusions and their respective elongated spring members 194 snap back to their original shapes and positions. Removal of protrusions 195 from the deeper regions 157, 158 of tracks 154 is then not readily accomplished without significant tooling, increased efforts, or possible damage to the bistate spring clip and/or tracks and mounting surface.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details but rather is to be defined by the scope of the appended claims.

What is claimed is:

1. A computing device, comprising:
   a plurality of internal computing components; and a computing housing assembly having multiple components that are readily removable from and reassembled to the computing housing assembly without the use of tools, the computing housing assembly including:
   an enclosure having a plurality of connected panels, the enclosure defining a front opening and an internal volume containing at least a portion of the plurality of internal computing components therein, wherein the enclosure includes front toolless coupling features along its front opening and side toolless coupling features along its plurality of connected panels, wherein the front toolless coupling features include multiple protrusion tabs extending forward from the enclosure past its front opening, each protrusion tab having a front nub and a geometry that facilitates bending or bowing of the protrusion tab during removal and reassembly of the front lid,
   a front lid removably coupled to the enclosure and covering the front opening to fully enclose the inner volume, wherein the front lid includes lid toolless coupling features configured to interact with the front toolless coupling features of the enclosure to facilitate the ready removal and reassembly of the front lid from and to the enclosure without the use of tools, and
   a first side cover removably coupled to a first side of the enclosure, the first side cover including an outer face and an inner face, wherein the first side cover includes a first set of side cover toolless coupling features configured to interact with the side toolless coupling features of the enclosure to facilitate the ready removal and reassembly of the first side cover from and to the enclosure without the use of tools.

2. The computing device of claim 1, wherein the computing device is a data receiver, data collector, energy vibration sensor, input output module, or power supply unit.

3. The computing device of claim 1, wherein the computing housing assembly conforms to a common form factor for multiple separate substantially similar computing housing assemblies, the common form factor requiring that all substantially similar computing housing assemblies have the same front toolless coupling features, lid toolless coupling features, side toolless coupling features, and first set of side cover toolless coupling features.

4. The computing device of claim 3, wherein the common form factor allows for other variable features between the substantially similar computing housing assemblies.

5. The computing device of claim 1, wherein the computing housing assembly further includes:
   a second side cover removably coupled to a second side of the enclosure, the second side cover including an outer face and an inner face, wherein the second side cover includes a second set of side cover toolless coupling features configured to interact with the side toolless coupling features of the enclosure to facilitate the ready removal and reassembly of the second side cover from and to the enclosure without the use of tools.

6. The computing device of claim 1, wherein the front toolless coupling features and side toolless coupling features are integrally formed with the enclosure.

7. The computing device of claim 6, wherein the lid toolless coupling features are integrally formed with the front lid and the first set of side cover toolless coupling features are integrally formed with the first side cover.

8. The computing device of claim 1, wherein the lid toolless coupling features include multiple tab openings configured to receive the front nubs of the multiple protrusion tabs to facilitate the ready removal and reassembly of the front lid from and to the enclosure.

9. The computing device of claim 1, wherein the side toolless coupling features include multiple divots located along multiple outer surfaces of the enclosure.

10. The computing device of claim 1, wherein the first side cover further includes a plurality of lateral stoppers spaced apart along its inner face, the plurality of lateral stoppers configured to abut and directly contact the first side of the enclosure when the first side cover is installed to the enclosure.

11. The computing device of claim 1, wherein the front lid includes a front panel having an illuminated portion coupled to a front surface of the front lid.

12. The computing device of claim 1, wherein the computing housing assembly further includes:

a mounting arrangement located along an outer surface of the enclosure, the mounting arrangement including one or more mounting components configured to move between different positions, wherein pushing the mounting arrangement against a separate external rail results in actuating the mounting arrangement to lock onto and mount the entire computing device onto the separate external rail without the use of tools.

13. A computing device, comprising:

a plurality of internal computing components; and a computing housing assembly having multiple components that are readily removable from and reassembled to the computing housing assembly without the use of tools, the computing housing assembly including:

an enclosure having a plurality of connected panels, the enclosure defining a front opening and an internal volume containing at least a portion of the plurality of internal computing components therein, wherein the enclosure includes front toolless coupling features along its front opening and side toolless coupling features along its plurality of connected panels, the side toolless coupling features including multiple divots located along multiple outer surfaces of the enclosure, a front lid removably coupled to the enclosure and covering the front opening to fully enclose the inner volume, wherein the front lid includes lid toolless coupling features configured to interact with the front toolless coupling features of the enclosure to facilitate the ready removal and reassembly of the front lid from and to the enclosure without the use of tools, and a first side cover removably coupled to a first side of the enclosure, the first side cover including an outer face and an inner face, wherein the first side cover includes a first set of side cover toolless coupling features configured to interact with the side toolless coupling features of the enclosure to facilitate the ready removal and reassembly of the first side cover from and to the enclosure without the use of tools, wherein the first side cover further includes a sidewall extending from its inner face around its outer circumference such that an outer portion of the sidewall extends over the multiple outer surfaces of the enclosure, the sidewall having multiple snap protrusions arranged to snap into and out of the multiple divots to facilitate the ready removal and reassembly of the first side cover from and to the enclosure.

14. The computing device of claim 13, wherein the multiple snap protrusions increase in size along the first side cover toward the back of the computing device to facilitate stronger snap fits with the enclosure toward the back of the enclosure.

15. The computing device of claim 13, wherein the sidewall includes an inner portion that is shorter than the outer portion, the inner portion of the sidewall having an inner edge configured to abut and directly contact the first side of the enclosure when the first side cover is installed to the enclosure.

16. The computing device of claim 13, wherein the computing housing assembly further includes:

a second side cover removably coupled to a second side of the enclosure, the second side cover including an outer face and an inner face, wherein the second side cover includes a second set of side cover toolless coupling features configured to interact with the side toolless coupling features of the enclosure to facilitate the ready removal and reassembly of the second side cover from and to the enclosure without the use of tools.

17. The computing device of claim 13, wherein the lid toolless coupling features are integrally formed with the front lid.

18. The computing device of claim 13, wherein the first side cover further includes a plurality of lateral stoppers spaced apart along its inner face, the plurality of lateral stoppers configured to abut and directly contact the first side of the enclosure when the first side cover is installed to the enclosure.

19. The computing device of claim 13, wherein the front lid includes a front panel having an illuminated portion coupled to a front surface of the front lid.

20. The computing device of claim 13, wherein the computing housing assembly further includes:

a mounting arrangement located along an outer surface of the enclosure, the mounting arrangement including one or more mounting components configured to move between different positions, wherein pushing the mounting arrangement against a separate external rail results in actuating the mounting arrangement to lock onto and mount the entire computing device onto the separate external rail without the use of tools.

21. A computing device, comprising:

a plurality of internal computing components; and a computing housing assembly having multiple components that are readily removable from and reassembled to the computing housing assembly without the use of tools, the computing housing assembly including:

an enclosure having a plurality of connected panels, the enclosure defining a front opening and an internal volume containing at least a portion of the plurality of internal computing components therein, wherein the enclosure includes front toolless coupling features along its front opening and side toolless coupling features along its plurality of connected panels, a front lid removably coupled to the enclosure and covering the front opening to fully enclose the inner volume, wherein the front lid includes lid toolless coupling features configured to interact with the front toolless coupling features of the enclosure to facilitate the ready removal and reassembly of the front lid from and to the enclosure without the use of tools, wherein the front lid includes one or more hinged doors, each hinged door including toolless coupling features configured to facilitate coupling the hinged door to the front lid, pivoting the hinged door to a range of different open positions relative to the front lid, and holding the hinged door at the range of different open positions, and a first side cover removably coupled to a first side of the enclosure, the first side cover including an outer face and an inner face, wherein the first side cover includes a first set of side cover toolless coupling features configured to interact with the side toolless coupling features of the enclosure to facilitate the ready removal and reassembly of the first side cover from and to the enclosure without the use of tools.

22. The computing device of claim 21, wherein the computing housing assembly further includes:

a second side cover removably coupled to a second side of the enclosure, the second side cover including an outer face and an inner face, wherein the second side cover includes a second set of side cover toolless coupling features configured to interact with the side toolless coupling features of the enclosure to facilitate the ready removal and reassembly of the second side cover from and to the enclosure without the use of tools.

23. The computing device of claim 21, wherein the lid toolless coupling features are integrally formed with the front lid.

24. The computing device of claim 21, wherein the first side cover further includes a plurality of lateral stoppers spaced apart along its inner face, the plurality of lateral stoppers configured to abut and directly contact the first side of the enclosure when the first side cover is installed to the enclosure.

25. The computing device of claim 21, wherein the front lid includes a front panel having an illuminated portion coupled to a front surface of the front lid.

26. The computing device of claim 21, wherein the computing housing assembly further includes:

a mounting arrangement located along an outer surface of the enclosure, the mounting arrangement including one or more mounting components configured to move between different positions, wherein pushing the mounting arrangement against a separate external rail results in actuating the mounting arrangement to lock onto and mount the entire computing device onto the separate external rail without the use of tools.

27. A toolless computing housing assembly, comprising:

a box-shaped enclosure including a top panel, bottom panel, back panel, first side panel, and second side panel, the enclosure defining a front opening and an internal volume configured to hold multiple internal components of a main computing device therein, wherein the enclosure includes front toolless coupling features along its front opening and side toolless coupling features along its panels, the front toolless coupling features include multiple protrusion tabs extending forward from the enclosure past its front opening, each protrusion tab having a front nub and a geometry that facilitates bending or bowing of the protrusion tab during removal and reassembly of the front lid;

a front lid removably coupled to the enclosure and covering the front opening to fully enclose the inner volume, wherein the front lid includes lid toolless coupling features configured to interact with the front toolless coupling features of the enclosure to facilitate the ready removal and reassembly of the front lid from and to the enclosure without the use of tools, the lid toolless coupling features include multiple tab openings configured to receive the front nubs of the multiple protrusion tabs to facilitate the ready removal and reassembly of the front lid from and to the enclosure; and a first side cover removably coupled to a first side of the enclosure, the first side cover including an outer face and an inner face, wherein the first side cover includes a first set of side cover toolless coupling features configured to interact with the side toolless coupling features of the enclosure to facilitate the ready removal and reassembly of the first side cover from and to the enclosure without the use of tools, the side toolless coupling features include multiple divots located along multiple outer surfaces of the enclosure on the top panel, bottom panel, and back panel, and wherein the first side cover further includes a sidewall extending from its inner face around its outer circumference such that an outer portion of the sidewall extends over the multiple outer surfaces of the enclosure, the sidewall having multiple snap protrusions arranged to snap into and out of the multiple divots to facilitate the ready removal and reassembly of the first side cover from and to the enclosure.

28. The toolless computing housing assembly of claim 27, further comprising:

a second side cover removably coupled to a second side of the enclosure, the second side cover including an outer face and an inner face, wherein the second side cover includes a second set of side cover toolless coupling features configured to interact with the side toolless coupling features of the enclosure to facilitate the ready removal and reassembly of the second side cover from and to the enclosure without the use of tools; and a mounting arrangement located along the back panel of the enclosure, the mounting arrangement including one or more mounting components configured to move between different positions, wherein pushing the mounting arrangement against a separate external rail results in actuating the mounting arrangement to lock onto and mount the entire computing housing assembly onto the separate external rail without the use of tools.

29. The toolless computing housing assembly of claim 27, wherein the first side cover further includes a plurality of lateral stoppers spaced apart along its inner face, the plurality of lateral stoppers configured to abut and directly contact the first side panel of the enclosure when the first side cover is installed to the enclosure.

30. The toolless computing housing assembly of claim 27, wherein the front lid includes a front panel having an illuminated portion coupled to a front surface of the front lid.

* * * * *